United States Patent [19]
Hii et al.

[11] Patent Number: 5,883,843
[45] Date of Patent: Mar. 16, 1999

[54] BUILT-IN SELF-TEST ARRANGEMENT FOR INTEGRATED CIRCUIT MEMORY DEVICES

[75] Inventors: Kuong Hua Hii, Singapore, Singapore; Danny R. Cline; Theo J. Powell, both of Dallas, Tex.

[73] Assignee: Texas Instruments Incorporated, Dallas, Tex.

[21] Appl. No.: 846,922

[22] Filed: Apr. 30, 1997

[51] Int. Cl.$^6$ .................................................. G01R 31/28
[52] U.S. Cl. ...................... 365/201; 371/22.3; 371/22.1; 395/183.06
[58] Field of Search ................................ 371/10.1, 22.3, 371/22.1; 365/201, 200; 395/183.06

[56] References Cited

U.S. PATENT DOCUMENTS

| | | | |
|---|---|---|---|
| 5,327,363 | 7/1994 | Akiyama | 364/580 |
| 5,568,437 | 10/1996 | Jamal | 365/201 |
| 5,588,006 | 12/1996 | Nozuyama | 371/3 |
| 5,617,531 | 4/1997 | Crouch et al. | 395/183.06 |
| 5,640,354 | 6/1997 | Jang et al. | 365/201 |
| 5,640,404 | 6/1997 | Satish | 371/22.3 |
| 5,640,509 | 6/1997 | Balmer et al. | 395/183.18 X |
| 5,661,729 | 8/1997 | Miyazaki et al. | 371/21.2 |
| 5,661,732 | 8/1997 | Lo et al. | 371/22.2 |
| 5,689,466 | 11/1997 | Qureshi | 365/201 |
| 5,734,919 | 3/1998 | Walsh et al. | 395/800 |

OTHER PUBLICATIONS

Koike, et al., BIST Circuit Macro Using Microprogram ROM for LSI Memories, Jul. 1995, pp. 839–844, Special Issue on LSI Memory Device, Circuit and Architecture Technologies for Multimedia Age, IEICE Transactions of Electronics.

Koike, et al., A BIST Scheme Using Microprogram ROM for Large Capacity Memories, Sep. 10, 1990, pp. 815–822, Proceedings International Test Conference 1990.

Franklin, et al., Built–In Self–Testing of Random–Access Memories, Oct. 1990, pp. 45–56, Computer.

*Primary Examiner*—Viet Q. Nguyen
*Attorney, Agent, or Firm*—Robby T. Holland; Carlton H. Hoel; Richard L. Donaldson

[57] ABSTRACT

An integrated circuit has a built-in self-test (BIST) arrangement (60). The built-in self-test arrangement includes a read only memory (ROM), (140) that stores test algorithm instructions. A ROM logic circuit (410) receives an instruction read from the read only memory and produces a group of output signals dependent upon the instruction. A BIST register 420 receives and stores the group of output signals from the logic circuit for controlling self-test of the integrated circuit.

6 Claims, 94 Drawing Sheets

TO FIG. 10B

| ADDRESS | BA1 | BA0 | A11 | A10 | A9 | A8 | A7 | A6 | A5 | A4 | A3 | A2 | A1 | A0 |
|---|---|---|---|---|---|---|---|---|---|---|---|---|---|---|
| LOADED INFORMATION | Int/Ext CLK | Sub Array | Output Enable | R1C | W1R | BI | Pdist | Ldist | Sdist | OV | Ymar | Xmar | Pause | Gross |
| | ←—TEST OPTIONS—→ | | | ←————————TEST ALGORITHMS————————→ | | | | | | | | | | |

FIG. 28A

256 M SDRAM BIST ALGORITHM STORAGE CONFIGURATION

| Algorithm | Hex add | ROM | | | | | | | | | | | | MICRO CODE |
|---|---|---|---|---|---|---|---|---|---|---|---|---|---|---|
| | | Read | Write | Xen | Yen | Test1 | Test0 | D5 Tset0 | D4 Tset1 | D3 Data | D2 ED | D1 Ckbd | D0 Alt | Program Control / Array Access |
| gross | 0 | 0 | 0 | 0 | 0 | 0 | 0 | 0 | 0 | 0 | 0 | 0 | 0 | zron: inte paus |
| gross | 1 | 0 | 1 | 0 | 1 | 0 | 0 | 0 | 0 | 0 | 1 | 0 | 1 | z1: write all w0 tsetA d01 |
| gross | 2 | 1 | 0 | 1 | 1 | 0 | 1 | 0 | 1 | 0 | 0 | 0 | 1 | read all r0 tsetA dec d01 |
| gross | 3 | 0 | 0 | 0 | 0 | 0 | 1 | 0 | 0 | 0 | 0 | 0 | 1 | dinvi z1 |
| pause | 4 | 0 | 0 | 0 | 0 | 0 | 0 | 0 | 0 | 0 | 0 | 0 | 0 | paus: inte xmarch |
| pause | 5 | 0 | 1 | 0 | 1 | 0 | 0 | 0 | 0 | 0 | 0 | 1 | 0 | ps1: write all w0 ckbd tsetA |
| pause | 6 | 0 | 0 | 1 | 0 | 0 | 0 | 0 | 0 | 0 | 0 | 0 | 0 | ps2: pause |
| pause | 7 | 0 | 0 | 0 | 0 | 0 | 1 | 0 | 0 | 0 | 0 | 1 | 0 | jtnc ps2 |
| pause | 8 | 1 | 0 | 1 | 0 | 1 | 1 | 0 | 0 | 0 | 1 | 1 | 0 | read all ckbd tsetA |
| pause | 9 | 0 | 0 | 0 | 0 | 1 | 0 | 0 | 0 | 0 | 0 | 0 | 1 | dinvi ps1 |
| xmarch | a | 0 | 0 | 0 | 0 | 0 | 0 | 0 | 0 | 0 | 0 | 0 | 1 | xmarch: inte ymarch |
| xmarch | b | 0 | 1 | 1 | 1 | 0 | 0 | 0 | 1 | 0 | 0 | 0 | 0 | write all w0 tsetB |
| xmarch | c | 1 | 0 | 0 | 1 | 0 | 1 | 0 | 0 | 1 | 0 | 0 | 0 | x1: read row r0 write w1 tsetB |
| xmarch | d | 0 | 0 | 1 | 0 | 0 | 0 | 0 | 0 | 1 | 1 | 0 | 0 | inc col janc x1 |
| xmarch | e | 1 | 0 | 1 | 1 | 0 | 1 | 0 | 0 | 0 | 1 | 0 | 0 | x2: read row r1 write w0 tsetB |
| xmarch | f | 0 | 0 | 0 | 0 | 0 | 0 | 0 | 0 | 1 | 1 | 0 | 0 | inc col janc x2 |
| xmarch | 10 | 1 | 0 | 0 | 0 | 0 | 0 | 0 | 0 | 0 | 0 | 0 | 0 | read all r0 tsetA |
| ymarch | 11 | 0 | 0 | 0 | 0 | 0 | 0 | 0 | 0 | 0 | 0 | 0 | 0 | ymarch: inte sdist |
| ymarch | 12 | 0 | 1 | 1 | 1 | 0 | 0 | 0 | 0 | 0 | 0 | 0 | 0 | write all w0 |
| ymarch | 13 | 1 | 0 | 1 | 0 | 0 | 1 | 1 | 0 | 0 | 1 | 0 | 0 | y1: read col r0 write w1 |
| ymarch | 14 | 0 | 0 | 0 | 1 | 0 | 0 | 0 | 1 | 1 | 0 | 1 | 0 | inc row janc y1 |
| ymarch | 15 | 1 | 1 | 1 | 0 | 0 | 0 | 1 | 0 | 0 | 1 | 0 | 0 | y2: read col r1 write w0 |
| ymarch | 16 | 0 | 0 | 0 | 1 | 0 | 0 | 0 | 1 | 1 | 0 | 1 | 0 | inc row janc y2 |
| ymarch | 17 | 1 | 0 | 0 | 0 | 0 | 0 | 0 | 0 | 0 | 0 | 0 | 1 | read all r0 tsetA |
| sdist | 18 | 0 | 0 | 0 | 0 | 0 | 0 | 0 | 0 | 0 | 0 | 0 | 0 | sdist: inte ldist |
| sdist | 19 | 0 | 1 | 1 | 1 | 0 | 0 | 0 | 0 | 0 | 0 | 0 | 0 | sd1: write all w0 tsetA |
| sdist | 1a | 1 | 0 | 0 | 0 | 0 | 0 | 0 | 0 | 0 | 0 | 0 | 0 | sd2: read col r0 tsetA |
| sdist | 1b | 0 | 1 | 0 | 1 | 0 | 0 | 0 | 0 | 0 | 0 | 1 | 0 | sd3: write col w1 tsetA |
| sdist | 1c | 0 | 0 | 0 | 1 | 0 | 0 | 0 | 0 | 0 | 1 | 1 | 0 | jtnc sd3 |
| sdist | 1d | 0 | 1 | 1 | 0 | 0 | 0 | 0 | 0 | 0 | 0 | 0 | 0 | write col w0 tsetA |

FROM FIG. 28A

| State | Addr | | | | | | | | | Description |
|---|---|---|---|---|---|---|---|---|---|---|
| sdist | 1e | 1 | 0 | 0 | 0 | 0 | 0 | 0 | 0 | refresh |
| sdist | 1f | 0 | 1 | 1 | 0 | 0 | 0 | 1 | 0 | inc row janc sd2 |
| sdist | 20 | 1 | 0 | 0 | 0 | 0 | 0 | 0 | 0 | read all r0 tsetA |
| sdist | 21 | 0 | 0 | 0 | 0 | 0 | 1 | 0 | 1 | dinvj sd1 |
| ldist | 22 | 0 | 0 | 1 | 0 | 0 | 0 | 0 | 0 | ldist: inte pdist |
| ldist | 23 | 0 | 1 | 1 | 1 | 1 | 0 | 0 | 0 | ld1: write all w0 tsetB |
| ldist | 24 | 1 | 0 | 0 | 0 | 0 | 0 | 0 | 0 | ld2: read col r0 tsetB |
| ldist | 25 | 0 | 0 | 0 | 1 | 1 | 0 | 0 | 1 | ld3: write col w1 tsetB |
| ldist | 26 | 0 | 0 | 0 | 0 | 0 | 0 | 1 | 0 | jtnc ld3 |
| ldist | 27 | 0 | 1 | 1 | 1 | 1 | 0 | 0 | 0 | write col w0 tsetC |
| ldist | 28 | 1 | 0 | 0 | 0 | 0 | 0 | 1 | 0 | refresh |
| ldist | 29 | 0 | 1 | 1 | 0 | 0 | 0 | 0 | 0 | inc row janc ld2 |
| ldist | 2a | 1 | 0 | 0 | 0 | 0 | 0 | 0 | 0 | read all r0 tsetB |
| ldist | 2b | 0 | 0 | 0 | 0 | 0 | 1 | 0 | 1 | dinvj ld1 |
| pdist | 2c | 0 | 0 | 1 | 0 | 0 | 0 | 1 | 1 | pdist: inte burnin |
| pdist | 2d | 0 | 1 | 1 | 1 | 1 | 1 | 0 | 0 | pd1: write all w0 tsetA |
| pdist | 2e | 1 | 0 | 0 | 0 | 0 | 1 | 0 | 0 | pd2: read col r0 tsetC |
| pdist | 2f | 0 | 0 | 0 | 1 | 1 | 1 | 0 | 0 | pd3: write col w1 tsetC |
| pdist | 30 | 0 | 0 | 0 | 0 | 0 | 1 | 1 | 0 | jtnc pd3 |
| pdist | 31 | 0 | 1 | 1 | 1 | 1 | 1 | 0 | 0 | write col w0 tsetC |
| pdist | 32 | 1 | 0 | 0 | 0 | 0 | 1 | 1 | 0 | refresh |
| pdist | 33 | 0 | 1 | 1 | 0 | 0 | 1 | 0 | 0 | inc row janc pd2 |
| pdist | 34 | 1 | 0 | 0 | 0 | 0 | 1 | 0 | 0 | pd4: read col r0 tsetC |
| pdist | 35 | 0 | 1 | 1 | 0 | 0 | 1 | 0 | 0 | inc row janc pd4 |
| pdist | 36 | 0 | 0 | 0 | 0 | 0 | 1 | 0 | 1 | dinvj pd1 |
| burnin | 37 | 0 | 0 | 1 | 1 | 1 | 0 | 0 | 0 | burnin: inte wrlrw |
| burnin | 38 | 0 | 1 | 1 | 1 | 1 | 1 | 0 | 0 | brn1: write all w0 tsetB ckbd |
| burnin | 39 | 0 | 1 | 1 | 1 | 1 | 1 | 0 | 0 | write all w1 tsetB ckbd |
| burnin | 3a | 0 | 0 | 0 | 0 | 0 | 1 | 1 | 0 | ju brn1 |
| wrlrw | 3b | 0 | 0 | 1 | 0 | 1 | 0 | 0 | 1 | wrlrw: inte rd0cl |
| wrlrw | 3c | 0 | 0 | 0 | 1 | 0 | 0 | 0 | 0 | write row w1 tsetA |
| rd0cl | 3d | 0 | 0 | 1 | 0 | 1 | 1 | 1 | 0 | rd0cl: inte finish |
| rd0cl | 3e | 1 | 0 | 0 | 0 | 0 | 0 | 1 | 0 | read col r0 tsetA |
| finish | 3f | 0 | 0 | 0 | 0 | 1 | 0 | 0 | 0 | finish: idle |
| | | Mask Rev Number | | | | | | | | |

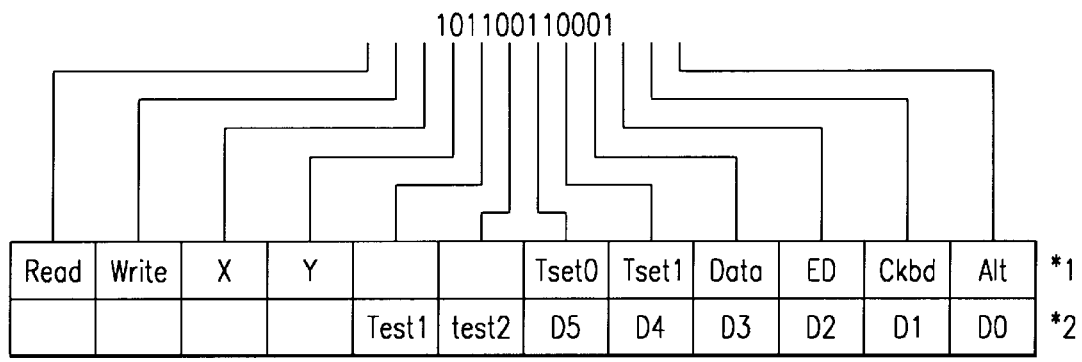

| Test1 | Test2 | Comments |
|---|---|---|
| 0 | 0 | Test if the test is enabled in enabled tests register 330. |
| 0 | 1 | Test for inverted pattern |
| 1 | 0 | Increment address by 1, and check for overflow (array address) |
| 1 | 1 | Increment counter and check if required value is reached (timing counter) |

| Test0 | Test1 | Comments |
|---|---|---|
| 0 | 0 | Timing set A |
| 0 | 1 | Timing set C |
| 1 | 0 | Timing set B |
| 1 | 1 | Timing set A, decrement |

*1 Memory Access Instruction
*2 Program Control Instruction

FIG. 29

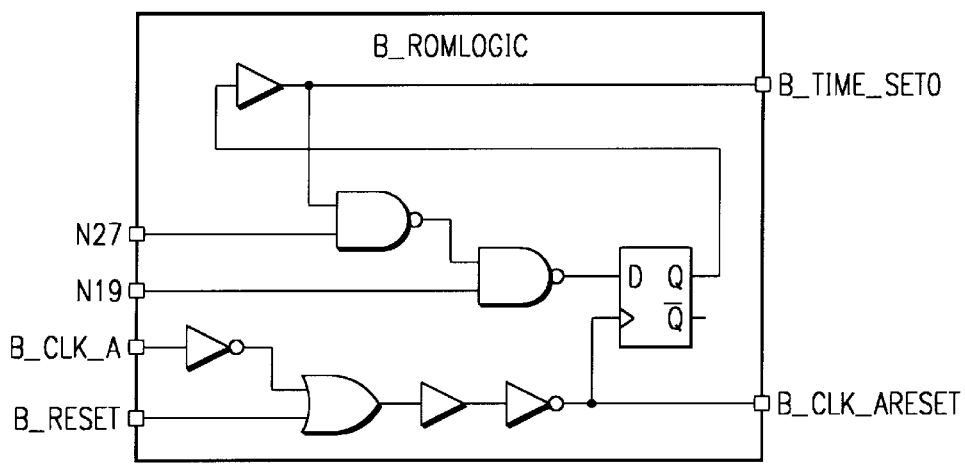

FIG. 30

```
architecture behav of b_passfail is
signal B_EXPECT_DATA : std_logic_vector (3 downto 0);
signal B_EXPECT_DATAB : std_logic_vector (3 downto 0);
signal B_WRITE_DATA : std_logic_vector (3 downto 0);
signal CKBDI, TRUEWRITE, B_REVNVAL, B_RODDVAL, B_WEVNVAL, B_WODDVAL : std_logic;
begin
  CKBDI <= B_CKBD and (B_LSB_XADD xor B_LSB_YADD);
  pass_fail_check : process(B_CLK, B_OEB, B_RESET)
            begin
              if (B_RESET = '1') then
                B_PF_RESULT <= '0';
              elsif (B_CLK'EVENT and B_CLK = '1') then
                if (B_OEB = '0' and (B_DQ(31 downto 28) /= B_EXPECT_DATA
                    or B_DQ(27 downto 24) /= B_EXPECT_DATAB)) then
                  B_PF_RESULT <= '1';
                end if;
              end if;
            end process pass_fail_check;
  B_REVNVAL <= B_RDATA xor CKBDI;
  B_RODDVAL <= B_ALTERNATE xor B_RDATA xor CKBDI;
  B_WEVNVAL <= B_WDATA xor CKBDI;
  B_WODDVAL <= B_ALTERNATE xor B_WDATA xor CKBDI;
  B_EXPECT_DATA(0) <= B_REVNVAL;
  B_EXPECT_DATA(1) <= B_RODDVAL;
  B_EXPECT_DATA(2) <= B_REVNVAL;
  B_EXPECT_DATA(3) <= B_RODDVAL;
  B_EXPECT_DATAB <= not B_EXPECT_DATA;

B_WRITE_DATA(0) <= B_WEVNVAL;
  B_WRITE_DATA(1) <= B_WODDVAL;
  B_WRITE_DATA(2) <= B_WEVNVAL;
  B_WRITE_DATA(3) <= B_WODDVAL;
  monitor_data_values : process(B_WRITE, B_REVNVAL, B_RODDVAL, B_WEVNVAL, B_WODDVAL)
        begin
          if (B_WRITE = '1') then
            B_DEVEN <= B_WEVNVAL;
            B_DODD <= B_WODDVAL;
          else
            B_DEVEN <= B_REVNVAL;
            B_DODD <= B_RODDVAL;
          end if;
        end process monitor_data_values;
  TRUEWRITE <= B_WRITE and (not B_WDATA_TIMB) and (not TLBMON) and
               (not TLBROMR);
  guarded_block : block (TRUEWRITE ='1')
  begin
        B_DQ(31 downto 28) <= guarded B_WRITE_DATA;
        B_DQ(27 downto 24) <= guarded B_WRITE_DATA;
  end block guarded_block;
end behav;
```

FIG. 32

PASS FAIL BLOCK

| DATA BIT | | $l$ = 28,29,30,31 | $m$ = 24,25,26,27 |

1 BIT PAIR OF 4 BIT PAIRS:
- FAIL
- DATA=0 PASS  *
- DATA=1 PASS  *
- NO TEST $l$: 0,0,1,1 → TRUE DATA
$m$: 0,1,0,1 → COMPLEMENT DATA

| n | $l$ | m |
|---|----|----|
| 0 | 28 | 24 |
| 1 | 29 | 25 |
| 2 | 30 | 26 |
| 3 | 31 | 27 |

| EXPECTED | EXPECTED DATA (n) | B_DQ=28,29,30,31 $l$ | 24,25,26,27 m | B_PF_RESULT |
|---|---|---|---|---|
| FAIL | 0 | 0 | 0 | 1 |
| PASS | *0 | 0 | 1 | 0 |
| FAIL | 0 | 1 | 0 | 1 |
| FAIL | 0 | 1 | 1 | 1 |
| FAIL | 1 | 0 | 0 | 1 |
| FAIL | 1 | 0 | 1 | 1 |
| PASS | *1 | 1 | 0 | 0 |
| FAIL | 1 | 1 | 1 | 1 |

⇑ ED(0:3)   ⇑ B_DQ(28:31)   ⇑ B_DQ(24:27)

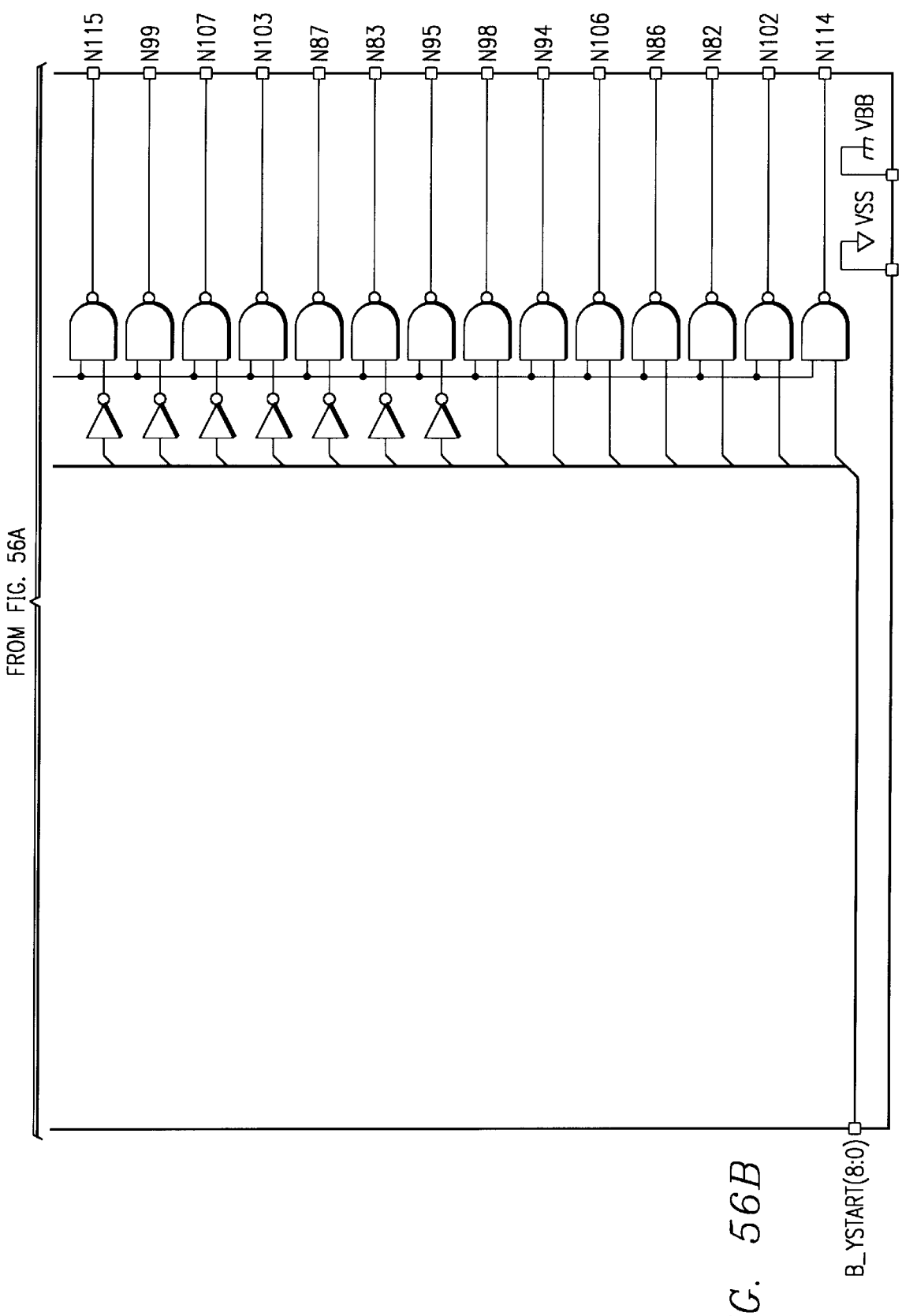

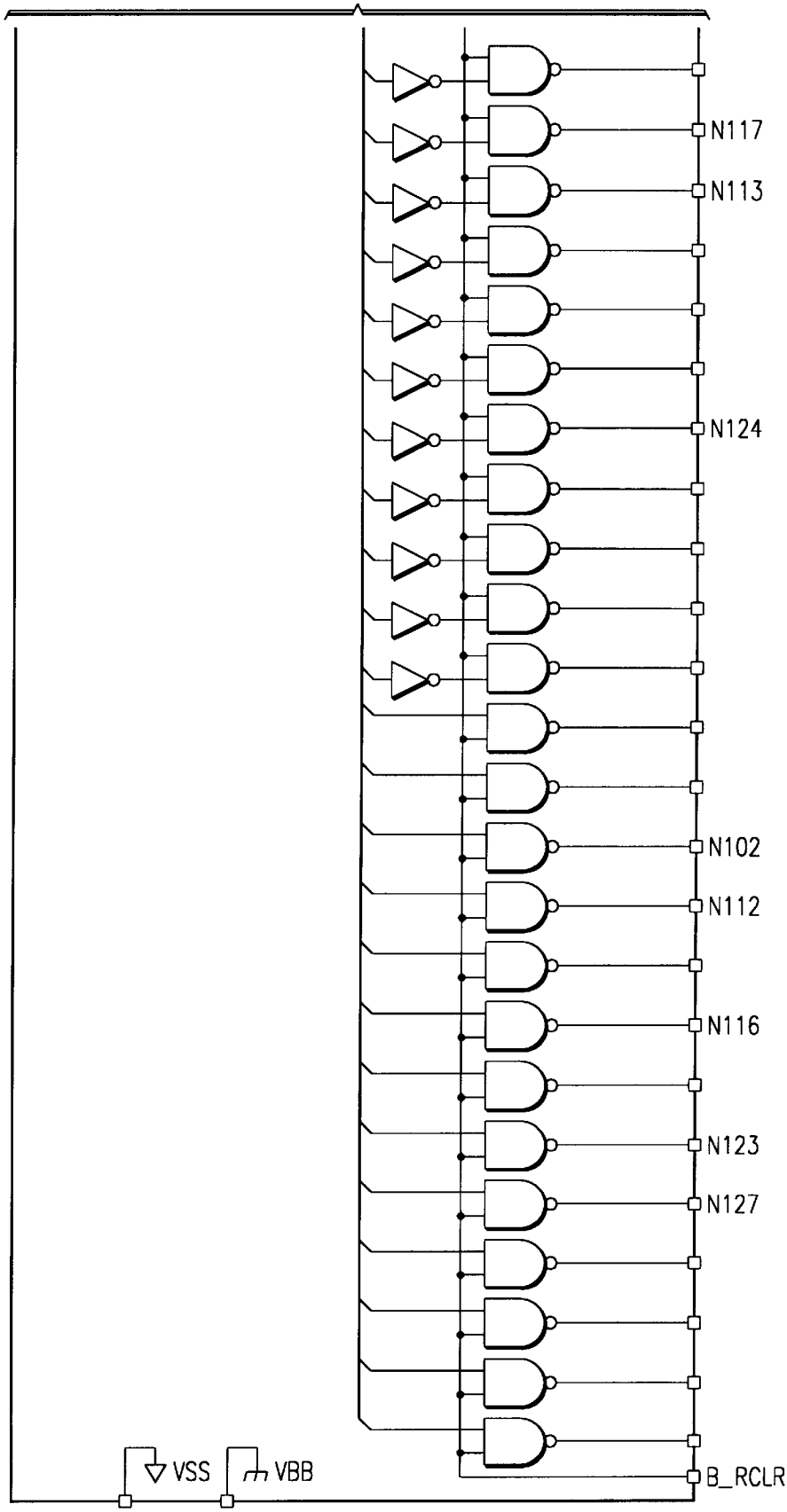

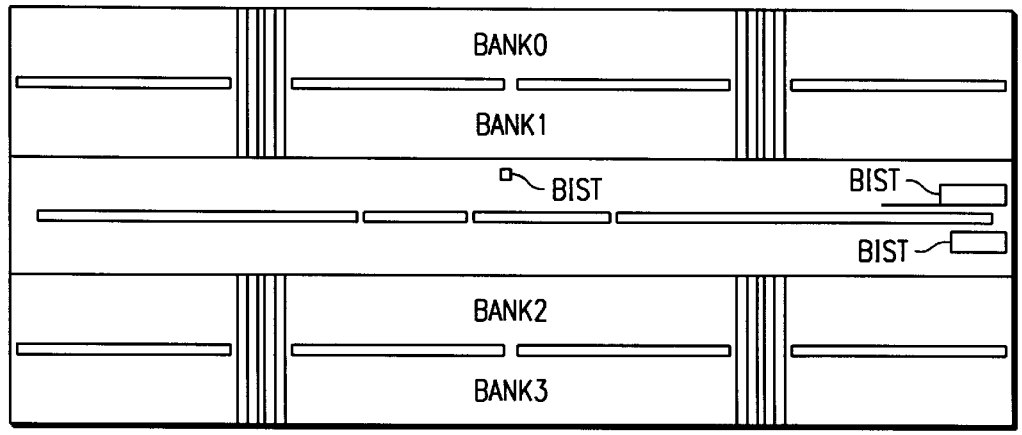

FIG. 61

| ALGORITHMS TIMING SET | | ADDR ACCESS | ARRAY ACCESS | DATA PATTERN | MISC OPTION |
|---|---|---|---|---|---|
| GROSS | SHORT | X, INC, DEC | R, W | 0, 1 | CKBD, ALT |
| PAUSE | SHORT | X, INC | R, W | 0, 1 | CKBD, PAUSE |
| XMARCH | LONG | X, INC | RW | 0, 1 | |
| YMARCH | SHORT | Y, INC | RW | 0, 1 | |
| SDIST | SHORT | X, Y, INC | R, W | 0, 1 | REFRESH |
| LDIST | LONG | X, Y, INC | R, W | 0, 1 | REFRESH |
| PDIST | PAGE | Y, INC | R, W | 0, 1 | REFRESH |
| BURN IN | LONG | X, Y, INC | W | 0, 1 | CKBD |
| ENG1 | SHORT | Y, INC, 1 ROW | W | 1 | |
| ENG2 | SHORT | X, INC, 1 COL | R | 0 | |

SHORT-300ns PERIOD  R-READ  INC-INCREMENT
LONG-10,000ns PERIOD  W-WRITE  DEC-DECREMENT

FIG. 62

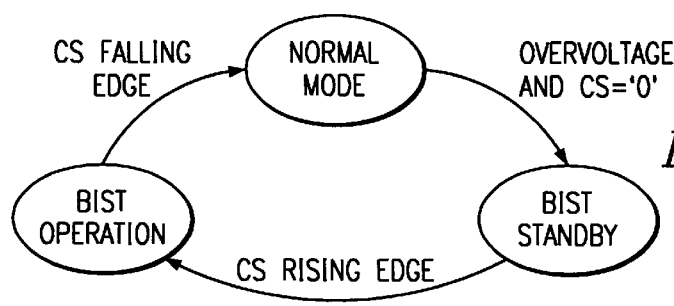

FIG. 63

| | NORMAL MODE | BIST: INT CLK (B_CLKMUX=0) | BIST: Ex CLK (B_CLKMUX=1) |
|---|---|---|---|
| B_CLK | LOW | 20ns CLOCK | SAME AS EXT CLK |
| B_IRCLK | 0.5Us CLOCK | LOW | LOW |

256M SDRAM

| Left Signal | Pin | | Pin | Right Signal |
|---|---|---|---|---|
| 3.3V — VDD | 1 | | 88 | VSS — 0.0V |
| NO CONNECT — DQ0 | 2 | | 87 | DQ15 — NO CONNECT |
| 3.3V — VDDQ | 3 | | 86 | VSSQ — 0.0V |
| NO CONNECT — DQ1 | 4 | | 85 | DQ14 — NO CONNECT |
| NO CONNECT — DQ2 | 5 | | 84 | DQ13 — NO CONNECT |
| 0.0V — VSSQ | 6 | | 83 | VDDQ — 3.3V |
| NO CONNECT — DQ3 | 7 | | 82 | DQ12 — NO CONNECT |
| NO CONNECT — DQ4 | 8 | | 81 | DQ11 — NO CONNECT |
| 3.3V — VDDQ | 9 | | 80 | VSSQ — 0.0V |
| NO CONNECT — DQ5 | 10 | | 79 | DQ10 — NO CONNECT |
| NO CONNECT — DQ6 | 11 | | 78 | DQ9 — NO CONNECT |
| 0.0V — VSSQ | 12 | | 77 | VDDQ — 3.3V |
| NO CONNECT — DQ7 | 13 | | 76 | DQ8 — NO CONNECT |
| 0.0V — DQM0 | 14 | | 75 | DQM1 — 0.0V |
| 3.3V — VDD | 15 | | 74 | VSS — 0.0V |
| NO CONNECT — NC | 16 | | 73 | NC — NO CONNECT |
| 3.3V — W | 17 | | 72 | NC — NO CONNECT |
| 3.3V — CE | 18 | | 71 | Vref — 1.65V |
| 3.3V — RE | 19 | | 70 | NC — NO CONNECT |
| 0.0V/3.3V — S | 20 | | 69 | CLK — 0.0V |
| 0.0V/3.3V — BA1 | 21 | | 68 | CKE — 3.3V |
| 0.0V/3.3V — A11 | 22 | | 67 | BA0 — 0.0V/3.3V |
| 3.3V — VDD | 23 | | 66 | VSS — 0.0V |
| 0.0V/3.3V — A0 | 24 | | 65 | NC — NO CONNECT |
| 0.0V/3.3V — A1 | 25 | | 64 | A10 — 0.0V/3.3V |
| 0.0V/3.3V — A2 | 26 | | 63 | A9 — 0.0V/3.3V |
| 0.0V/3.3V — A3 | 27 | | 62 | A8 — 0.0V/3.3V |
| 0.0V/5.4V — A4 | 28 | | 61 | A7 — 0.0V/3.3V |
| 0.0V/3.3V — A5 | 29 | | 60 | A6 — 0.0V/3.3V |
| 3.3V — VDD | 30 | | 59 | VSS — 0.0V |
| 0.0V — DQM2 | 31 | | 58 | DQM3 — 0.0V |
| DONE — DQ16 | 32 | | 57 | DQ31 — NO CONNECT |
| 0.0V — VSSQ | 33 | | 56 | VDDQ — 3.3V |
| PASSFAIL — DQ17 | 34 | | 55 | DQ30 — NO CONNECT |
| NO CONNECT — DQ18 | 35 | | 54 | DQ29 — NO CONNECT |
| 3.3V — VDDQ | 36 | | 53 | VSSQ — 0.0V |
| NO CONNECT — DQ19 | 37 | | 52 | DQ28 — NO CONNECT |
| NO CONNECT — DQ20 | 38 | | 51 | DQ27 — NO CONNECT |
| 0.0V — VSSQ | 39 | | 50 | VDDQ — 3.3V |
| NO CONNECT — DQ21 | 40 | | 49 | DQ26 — NO CONNECT |
| NO CONNECT — DQ22 | 41 | | 48 | DQ25 — NO CONNECT |
| 3.3V — VDDQ | 42 | | 47 | VSSQ — 0.0V |
| NO CONNECT — DQ23 | 43 | | 46 | DQ24 — NO CONNECT |
| 3.3V — VDD | 44 | | 45 | VSS — 0.0V |

*FIG. 65*

1. INSTRUCTIONS APPEARS AT CLK_A R/E
2. RESULTS OF OPERATIONS APPEARS AT CLK_A F/E
3. AT CLK_B R/E, DECIDE ON NEW PC ADDRESS
4. AT RISING EDGE OF CLK_C, RESETS ALL SIGNALS
5. NEW INSTRUCTIONS APPEARS AT CLK_A R/E

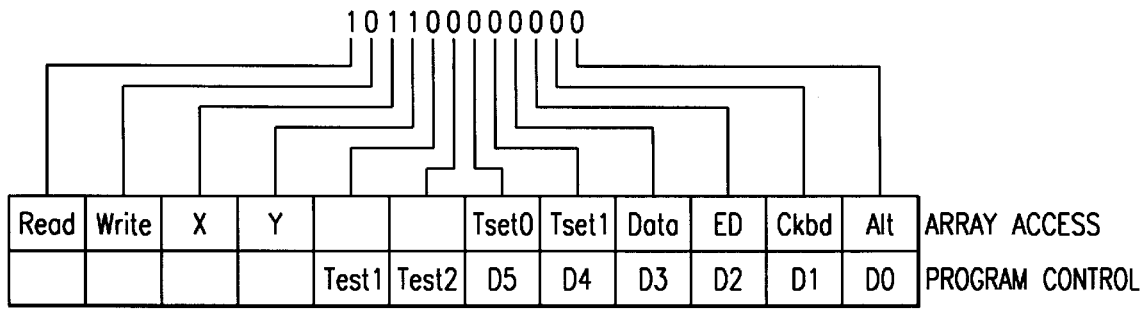

| TEST1 | TEST2 | COMMENTS |
|---|---|---|
| 0 | 0 | TEST IF THE TEST IS ENABLED |
| 0 | 1 | TEST FOR INVERTED PATTERN |
| 1 | 0 | INCREMENT ADDRESS BY 1, AND CHECK FOR OVERFLOW |
| 1 | 1 | INCREMENT COUNTER AND CHECK IF REQUIRED VALUE IS REACHED |

| TSET0 | TSET1 | COMMENTS |
|---|---|---|
| 0 | 0 | TIMING SET A |
| 0 | 1 | TIMING SET C |
| 1 | 0 | TIMING SET B |
| 1 | 1 | TIMING SET A, DECREMENT |

*FIG. 72*

| TIMING SETS | ACCESS MODE | ADDRESSING | ARRAY SIZE | '0' OR '1' | DATA PATTERN |
|---|---|---|---|---|---|
| TSETA<br>TSETB<br>TSETC | READ<br>WRITE<br>RMW | INC<br>DEC | FULLA<br>ROW<br>COL | PATTERN0<br>PATTERN1 | CKBD<br>ALTERNATE |

*FIG. 73*

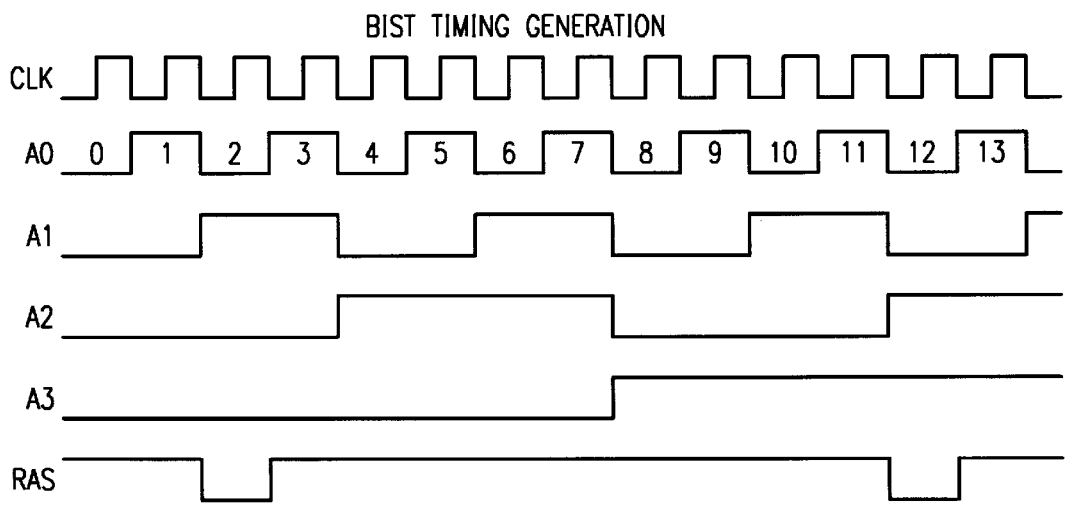

*FIG. 74*

BIST TIMING SETS

FIG. 75A

B_CLK

FIG. 75B

TIMING SET A:

B_RASB
B_CASB
B_WB
B_ADDR: R0, C0, R0, R1, C1, R1, ..., Rxx, C1, Rxx

FIG. 75C

TIMING SET B:

B_RASB
B_CASB
B_WB
B_ADDR: R0, C0, R0

FIG. 75D

TIMING SET C:

B_RASB
B_CASB
B_WB
B_ADDR: R0, C0, R0, R0, C1, R0, ..., R0, Cxx, R0

| TIMING SET | CYCLE TIME | DESCRIPTION |
|---|---|---|
| A | 300ns | SHORT TIMING, USED IN GROSS, PAUSE, YMARCH, SDIST, ENG1, ENG2 |
| B | 10,000ns | LONG TIMING, USED IN XMARCH, LDIST, BURN IN |
| C | 300ns | MULTIPLE COLUMNS, USED IN PDIST |

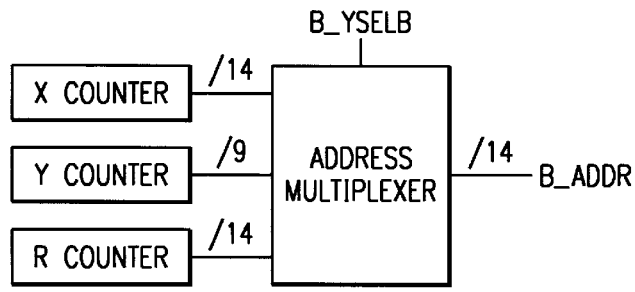

FIG. 76

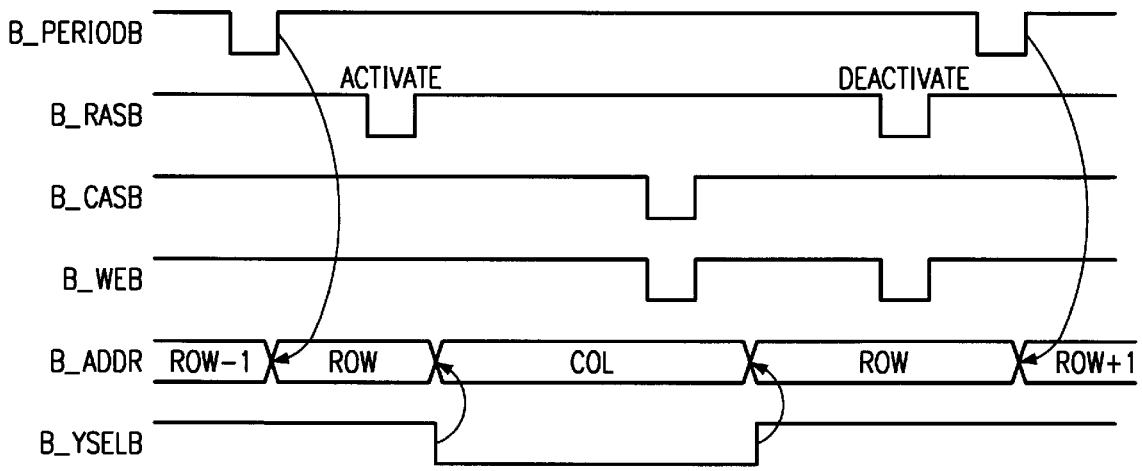

FIG. 77

| BA1 | BA0 | A11 | A10 | A9 | A8 | A7 | A6 | A5 | A4 | A3 | A2 | A1 | A0 |
|---|---|---|---|---|---|---|---|---|---|---|---|---|---|
| Int/Ext CLK | Sub Array | Output Enable | R1C | W1R | BI | Pdist | Ldist | Sdist | OV | Ymar | Xmar | Pause | Gross |

FOR A0 TO A3, '1' = TEST OF CONCERNED ENABLED '0' = TEST OF CONCERNED NOT ENABLED
FOR A4 = OVERVOLTAGE, 2 TO 2 1/2 TIMES VCC
FOR A5 TO A10, '1' = TEST OF CONCERNED ENABLED '0' = TEST OF CONCERNED NOT ENABLED
FOR BA0, '1' INDICATE SUB ARRAY SELECTED. '0' INDICATE FULL ARRAY TEST.
FOR BA1, '1' INDICATE EXTERNAL CLOCK. '0' INDICATE INTERNAL CLOCK.
FOR A11, '1' INDICATE OUTPUT ENABLE, 0 INDICATE OUTPUT NOT ENABLED.
      ONLY MEANINGFUL AFTER BIST IS DONE.

FIG. 78

|  | NORMAL | TLROMR | MON1 | MON2 | MON3 |
|---|---|---|---|---|---|
| B_DQ(31) | HIGH Z | ROMBIT 11 | BA1 | BA1 | BA1 |
| B_DQ(30) | HIGH Z | ROMBIT 10 | BA0 | BA0 | BA0 |
| B_DQ(29) | HIGH Z | ROMBIT 9 | ADDR11 | ADDR11 | ADDR11 |
| B_DQ(28) | HIGH Z | ROMBIT 8 | ADDR10 | ADDR10 | ADDR10 |
| B_DQ(27) | HIGH Z | ROMBIT 7 | ADDR9 | ADDR9 | ADDR9 |
| B_DQ(26) | HIGH Z | ROMBIT 6 | BIST_CMP | ADDR8 | BIST_CMP  ADDR8 |
| B_DQ(25) | HIGH Z | ROMBIT 5 | B_DODD | ADDR7 | B_DODD  ADDR7 |
| B_DQ(24) | HIGH Z | ROMBIT 4 | B_DEVEN | ADDR6 | B_DEVEN  ADDR6 |
| B_DQ(23) | HIGH Z | ROMBIT 3 | B_RASB | ADDR5 | B_RASB  ADDR5 |
| B_DQ(22) | HIGH Z | ROMBIT 2 | B_CASB | ADDR4 | B_CASB  ADDR4 |
| B_DQ(21) | HIGH Z | ROMBIT 1 | B_WB | ADDR3 | B_WB  ADDR3 |
| B_DQ(20) | HIGH Z | ROMBIT 0 | B_CLK | ADDR2 | B_CLK  ADDR2 |
| B_DQ(19) | HIGH Z | LOW | ADDR1 | ADDR1 | ADDR1 |
| B_DQ(18) | HIGH Z | LOW | ADDR0 | ADDR0 | ADDR0 |
| B_DQ(17) | PASSFAIL | HIGH Z | HIGH Z | HIGH Z | HIGH Z |
| B_DQ(16) | B_DONE | HIGH Z | HIGH Z | HIGH Z | HIGH Z |

FIG. 79

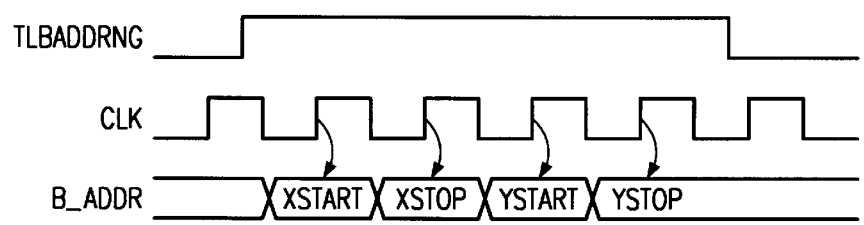

FIG. 80

BUILT-IN SELF-TEST ARRANGEMENT FOR INTEGRATED CIRCUIT MEMORY DEVICES

This is a Non Provisional application filed under 35 U.S.C. 119(e) and claims priority of prior provisional Ser. No. 60/016,516 of inventor Hii et al. filed Apr. 30, 1996.

CROSS REFERENCE TO RELATED APPLICATIONS

This application is related to Ser. No. 08/840,362 of inventor Hii et al. filed on Apr. 29, 1997 which claims priority under 35 USC 119(e) of prior provisional 60/016,875 of inventor Hii et al. filed on Apr. 29, 1996.

FIELD OF THE INVENTION

This invention, relates to the field of testing an integrated circuit device and more particularly to a built-in self-test (BIST) arrangement for an integrated circuit device.

BACKGROUND OF THE INVENTION

In conventional testing of memory devices, a tester is used to supply the control signals such as RAS, CAS and WE, address signals, such as Ao–An, and data to the device under test. Outputs from the device under test are sampled by the tester to determine whether the device passes or fails. Testing of memories requires longer tester times, as device density increases. This results in escalating test cost. As the capacity of integrated circuit memory devices increases to 256 Mbits and above, testing time per device becomes a major component of cost of integrated circuit memory devices.

One way to test integrated circuit memory devices in less time per device is to apply a single test data bit to several cells concurrently by multiplexing the single bit to the several cells in parallel. Some failures, however, cannot be screened unless a single cell is accessed at a time. With limited parallelism, i.e., a number of units being tested simultaneously, high test time also translates into a long manufacturing cycle time. Testing of one batch of memory devices requires most of the other devices to be waiting in queue to be tested while some of the memory devices are actually undergoing functional test. One solution would be to get more testers, but this is not practical as it involves even higher cost. The time to deliver a batch of tested memory devices to a customer increases as a result. Another solution is to apply the test from the testers in parallel to the devices under test. The problem with this solution is that the parallel leads occasionally cause good devices to fail because of cross talk among the parallel leads.

Thus there is a problem in finding some way to efficiently test large capacity memory devices without requiring an enormous amount of time on a tester per memory device.

SUMMARY OF THE INVENTION

This problem and others are resolved by an integrated circuit which has a built-in self-test (BIST) arrangement. The built-in self-test arrangement includes a read only memory that stores test algorithm instructions. A logic circuit, receives an instruction read from the read only memory and produces a group of output signals dependent upon the instruction. A BIST register receives and stores the group of output signals from the logic circuit for controlling self-test of the integrated circuit. A pass/fail comparator circuit compares expected data bits with data bits written into and read from a memory array to determine whether the integrate circuit passes or fails the test.

BRIEF DESCRIPTION OF THE DRAWINGS

FIG. 28 is a table of data stored in the BIST ROM for determining the operating sequences for several DRAM tests that can be run;

FIG. 29 is a table showing functions of bit stored in separate columns of the BIST ROM;

FIGS. 30 and 31 are logic schematics for an exemplary ROM logic circuit;

FIG. 31 is a logic schematic for a ROM logic circuit;

FIG. 32 is table of VHDL language description of a Pass/Fail comparator;

FIG. 61 shows a diagram of the BIST layout location;

FIG. 62 shows a diagram Algorithms and Timing sets;

FIG. 63 shows a diagram the entry/exit state transitions;

FIG. 65 shows a diagram of the pin out and key signals for BIST;

FIG. 72 shows a diagram of the control words;

FIG. 73 shows a table of the timing sets;

FIG. 74 shows a diagram of the Timing Generator;

FIG. 75 shows a diagram of the Timing Sets;

FIG. 76 shows a diagram of the Multiplexer;

FIG. 77 shows a diagram of the DUT (Device Under Test) Timing;

FIG. 78 shows a diagram of the Address Control Bits for entry and test control;

FIG. 79 shows a diagram of the DQ (Data/Output) multiplexing;

FIG. 80 shows a diagram of the address range selection;

DETAILED DESCRIPTION

Figure 1:
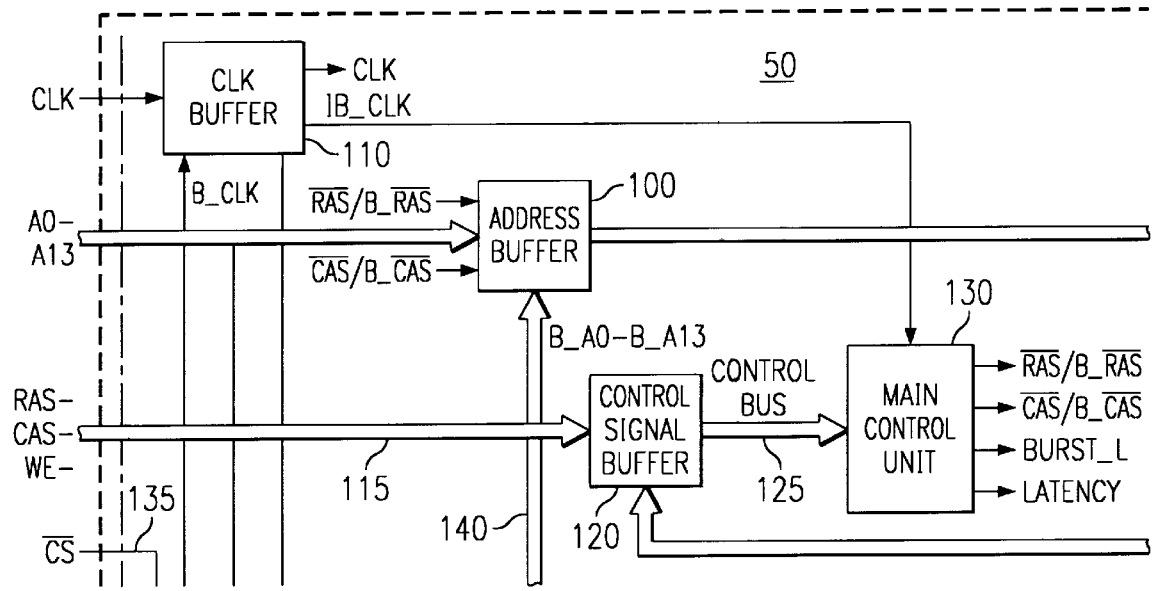
FIGS. 1–4 when positioned as shown in FIG. 5 present a block diagram of an integrated circuit memory device arranged with built-in self-test circuitry.
Figure 2:
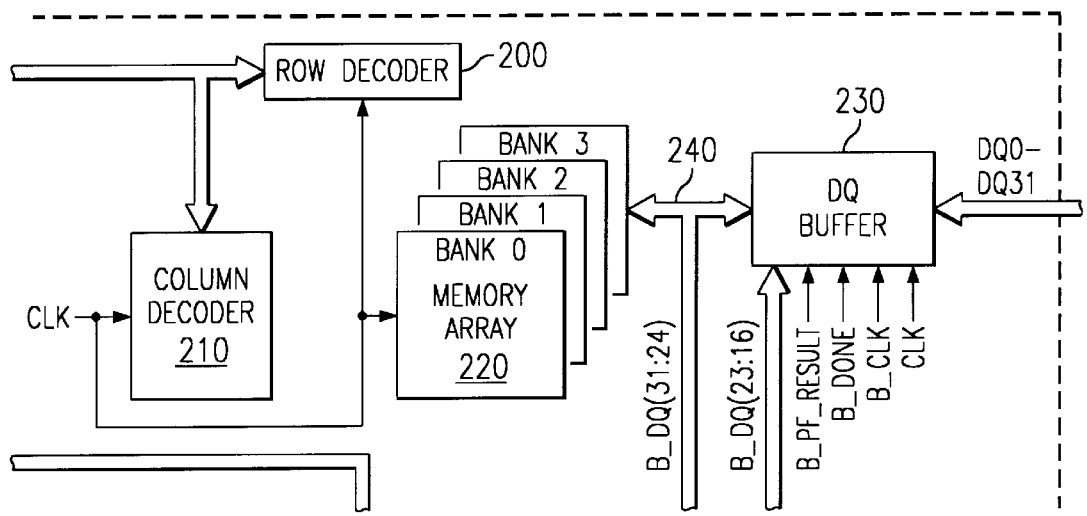
Figure 5:
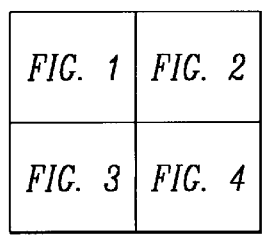

Referring now to FIGS. 1–4, there is shown the block diagram of an integrated circuit dynamic random access memory device 50 including a built-in self-test (BIST) arrangement 60. The device 50 is designed to operate as a synchronous random access memory during normal operation. Alternatively the built-in self-test arrangement operates in a distinctive self-test mode at times while the device 50 is not operating in the normal mode. The built-in self-test arrangement is designed such that all the test signals are generated internally to a device, and the arrangement only takes a simple setup to get the device into a self-test mode to perform a self test. With the simple setup up, the built-in self-test arrangement performs a memory self-test in a cost effective procedure. The arrangement also allows many devices to be tested in parallel without being limited by tester resources.

While the device 50 operates in the normal mode, it operates like a well-known synchronous dynamic random access memory device. Row and column addresses produced by a digital processor, such as a microprocessor, are time multiplexed by way of the address bus A0–A13 into an address buffer 100 until control signals RAS__ and CAS__, respectively, which load them. Thereafter they are decoded either by the row decoder 200 or the column decoder 210. The control signals RAS__ and CAS__ also are produced by the digital processor, which is not shown.

Depending upon the state of the write enable signal WE__ from the digital processor, data is either written into or read out from storage cells located in the banks of the memory array 220. Data, to be written into the banks of the memory array 220, is applied to the device 50 by way of a data bus DQ0–DQ31. This in-coming data is buffered in a data buffer circuit 230 and forwarded by way of an internal data bus 240 to the memory array 220 where it is stored until it is written over or until it is no longer refreshed at specified intervals. While data is stored in the memory array 220, that data can be addressed and read out of the array 220 through the internal data bus 240 and the data buffer 230 to the data bus DQ0–DQ31. This data bus DQ0–DQ31 typically is connected to the data receiving and sending terminals of a digital processor, such as a microprocessor that is not shown.

Because the memory device 50 is a synchronous dynamic random access memory, a system clock signal CLK is applied to the device from an external source for synchronizing its operation with the digital processor, peripheral devices, and control circuitry that are connected in a system. The system clock is the clock which controls operation of the digital processor. The clock signal CLK is applied to a clock buffer 110, which outputs an internal clock signal CLK for operating the memory array 220 during normal operation. This internal clock signal CLK controls operation of address decoding, writing data to the memory array, and reading data out of the memory array during such normal synchronous memory operations.

The control signals RAS__, CAS__, and WE__, which are applied to the memory device 50 from the digital processor, are applied to a control signal buffer 120. During normal mode operation, these control signals pass through the control buffer 120 and a control bus 125 to the main control unit 130 of the memory array 220. At the memory array 220 during normal operation, these control signals RAS__, CAS__, and WE__ together with the internal system clock signal CLK control operations of the array 220, as previously described.

Normal mode operation and self-test mode operation are two separate and distinct operations of the memory device 50. Those two modes occur alternatively. Thus while the device 50 operates in its normal mode it is not able to inadvertently go into its self-test mode. Also while it is in its active self-test mode, it cannot inadvertently go into its normal mode. These are conditions that are imposed upon the operation of the device 50 by the built-in self-test arrangement 60 to be described.

As just mentioned, the self-test mode of operation is different from the normal mode of operation. Self-test mode is entered only upon power up of the memory device 50. Special signal conditions are applied at that time to put the device 50 into the self-test mode.

In this proposed BIST scheme, only DC signals are needed external to the device to enter the self-test mode and to actually proceed through the self-test. The following types of external DC signals are supplied:

a) An overvoltage on one of the multiplexed address pins (e.g., pin A4.)

b) A switch on CS__ which allows both a '0' and a '1' to be connected to it.

c) A logic level of '0' or a '1' on the rest of the address pins for tests and options selections.

d) Pass, fail detection on one of the output pins.

e) An output detector pin to identify completion of the self-test operations.

With the above set up, only DC signals are involved. No complex timing is needed. Thus there is no need to be concerned with signal quality. The signal quality to the device is always good since the signals are DC. Multiple devices can be put on a BIST board and self tested simultaneously. Test cycle time can be reduced per device since BIST can be applied to all devices on the BIST board in parallel.

Figure 6:
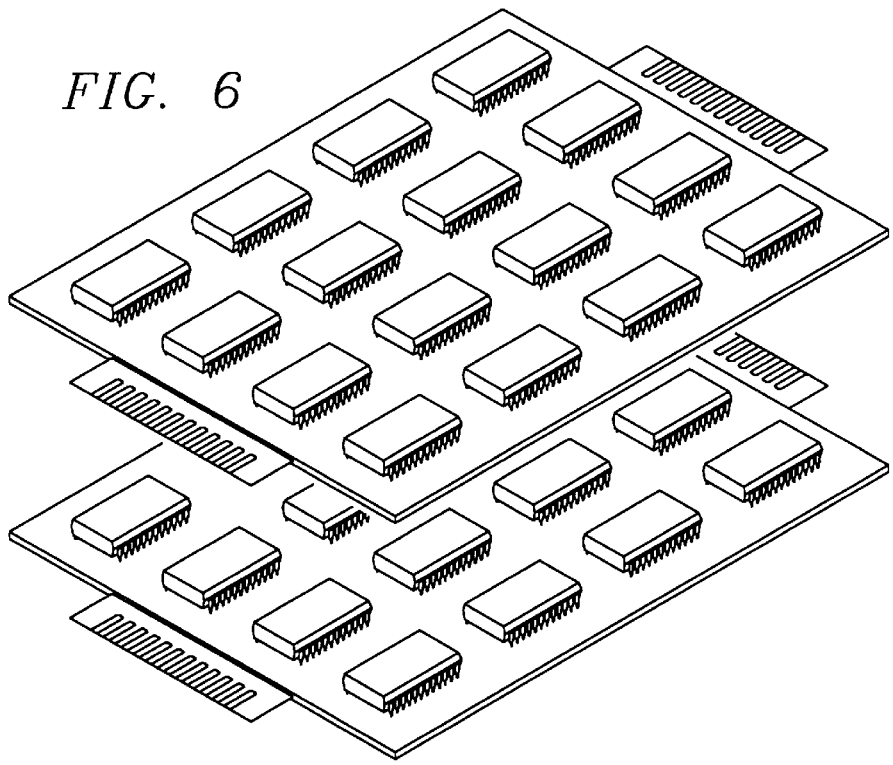
FIG. 6 shows a plurality of devices mounted for concurrent testing.

FIG. 6 shows an arrangement for mounting several integrated circuit devices which are interconnected in parallel so that they all can be set up at once for self-test. Once set up the self-test can be run concurrently on some of or all of the devices.

While in self test operations, BIST circuits take over control of all the signals such as CLK, RAS__, CAS__, WE__, the address bits, and the data bits. For example, a BIST address bit B__Ax is generated by the BIST circuits. During a self-test operation, the BIST address bits replace the externally generated address bits Ax. The BIST address bits B__Ax interface with the main circuit right out of the address buffer.

Figure 7A:
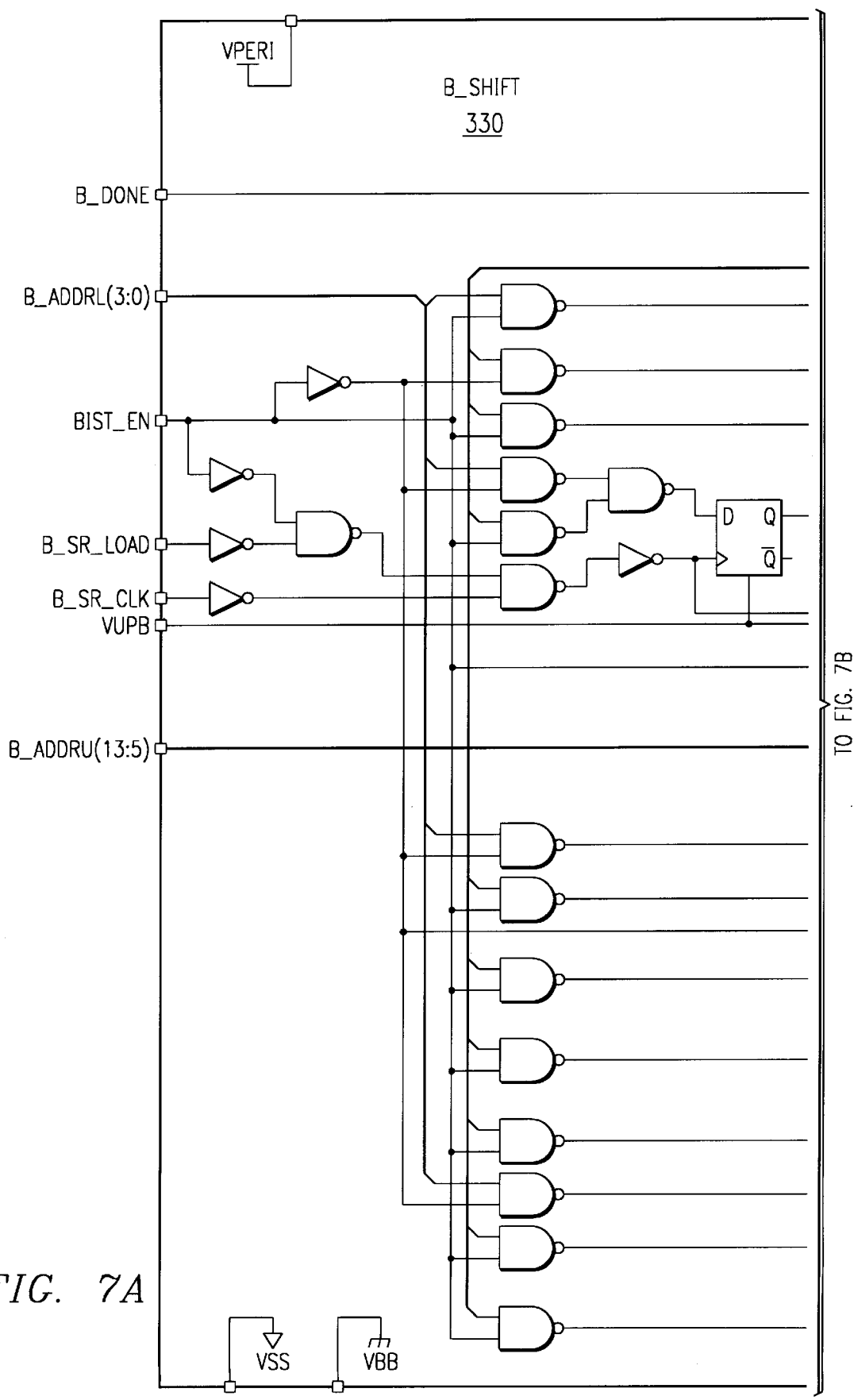
FIG. 7 is a logic schematic of a test enabled shift register for BIST operation.
Figure 7B:
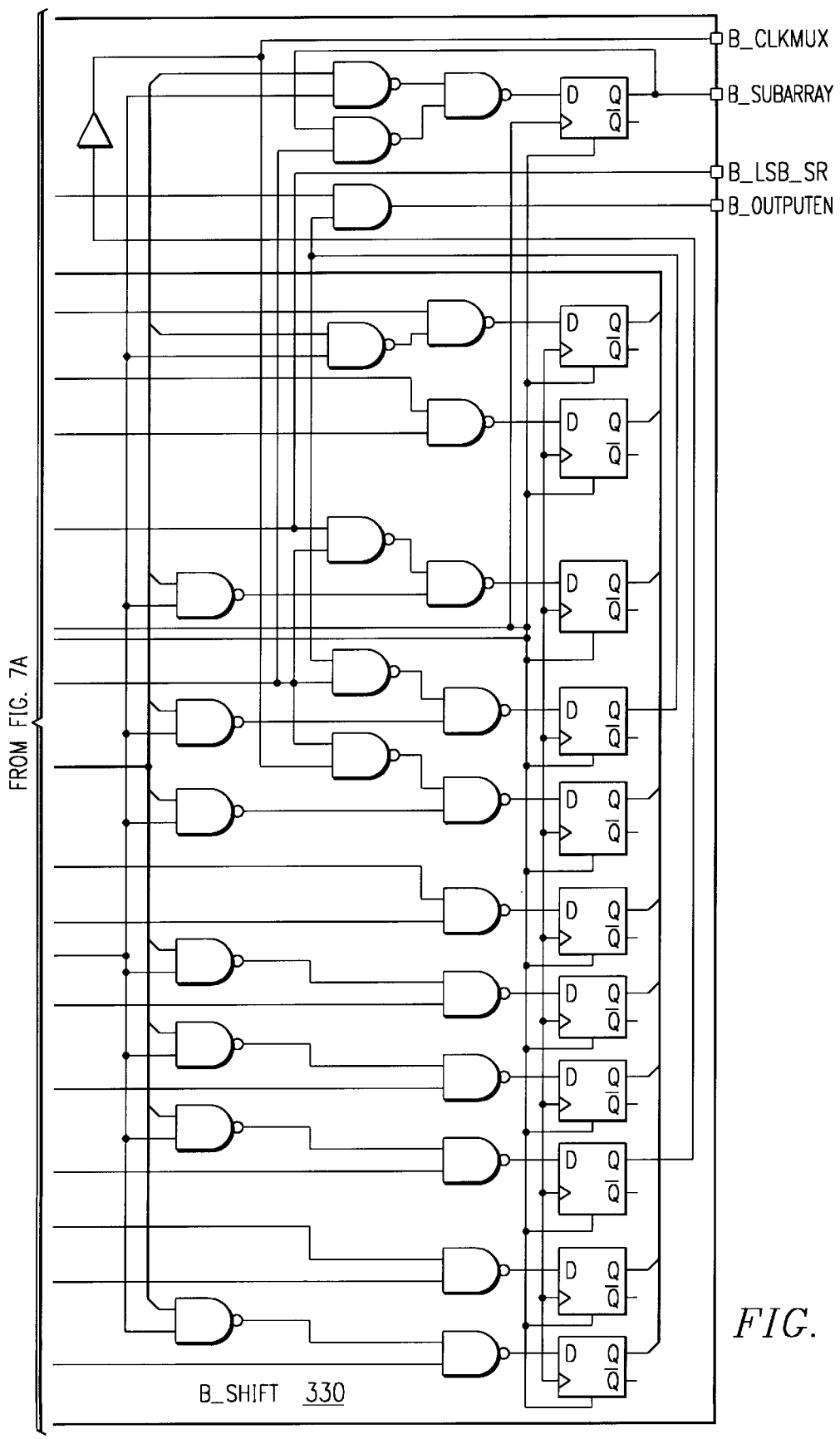

During normal mode operation, the BIST address bits B__Ax are not generated and are ignored. During power up, if a BIST request is detected, the address lines are used to bring in information into the BIST arrangement. Referring now to FIG. 7, a test enabled shift register 330 receives and stores data that determines whether or not specific tests are enabled. The data are stored in the shift register at the righthand side of FIG. 3. During active self-test mode, BIST generated address signals are used for operating the device and externally applied address signals Ax are ignored.

Figure 8:
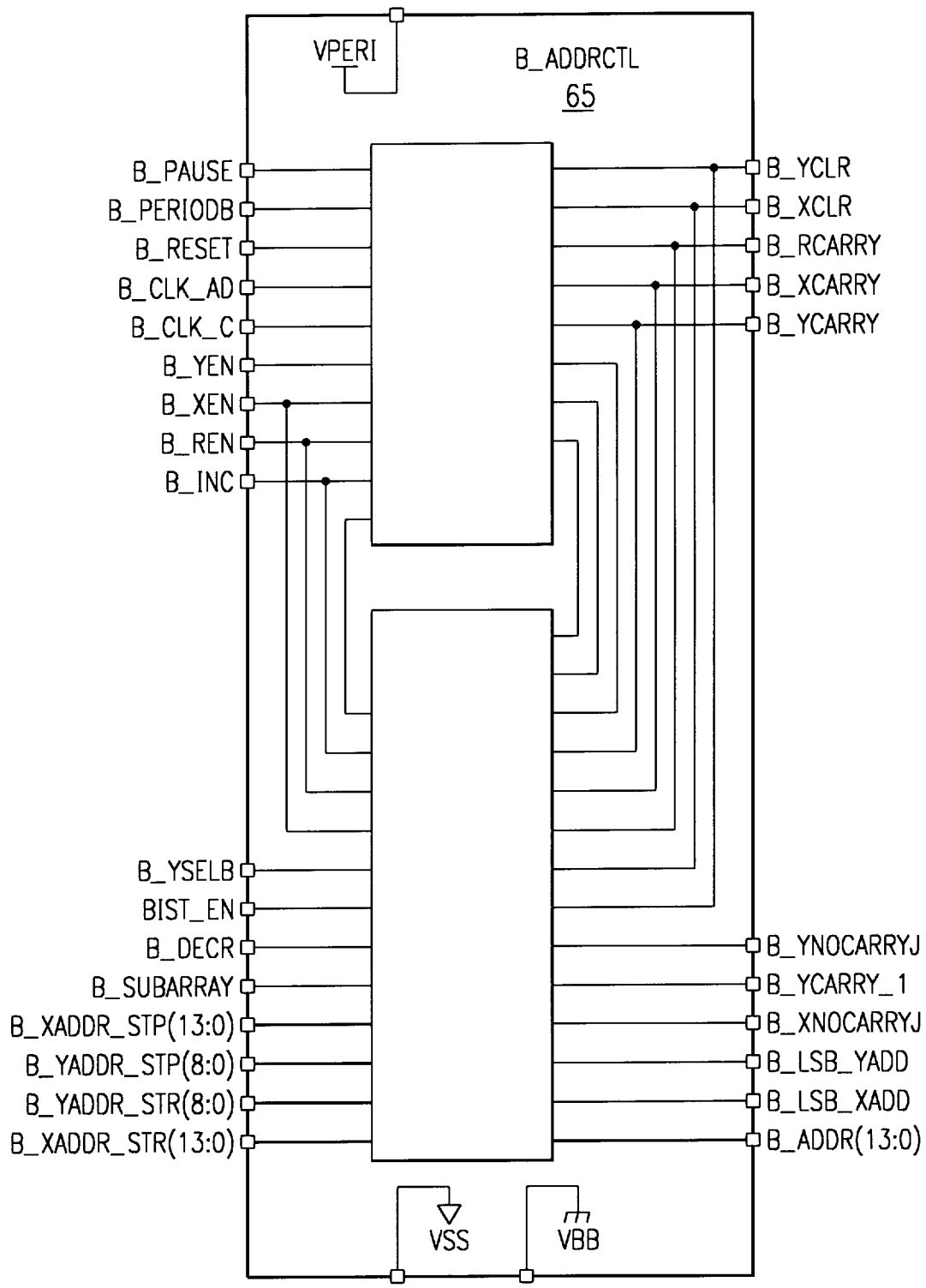
FIG. 8 is a block diagram of an address control circuit for the BIST arrangement.
Figure 9A:
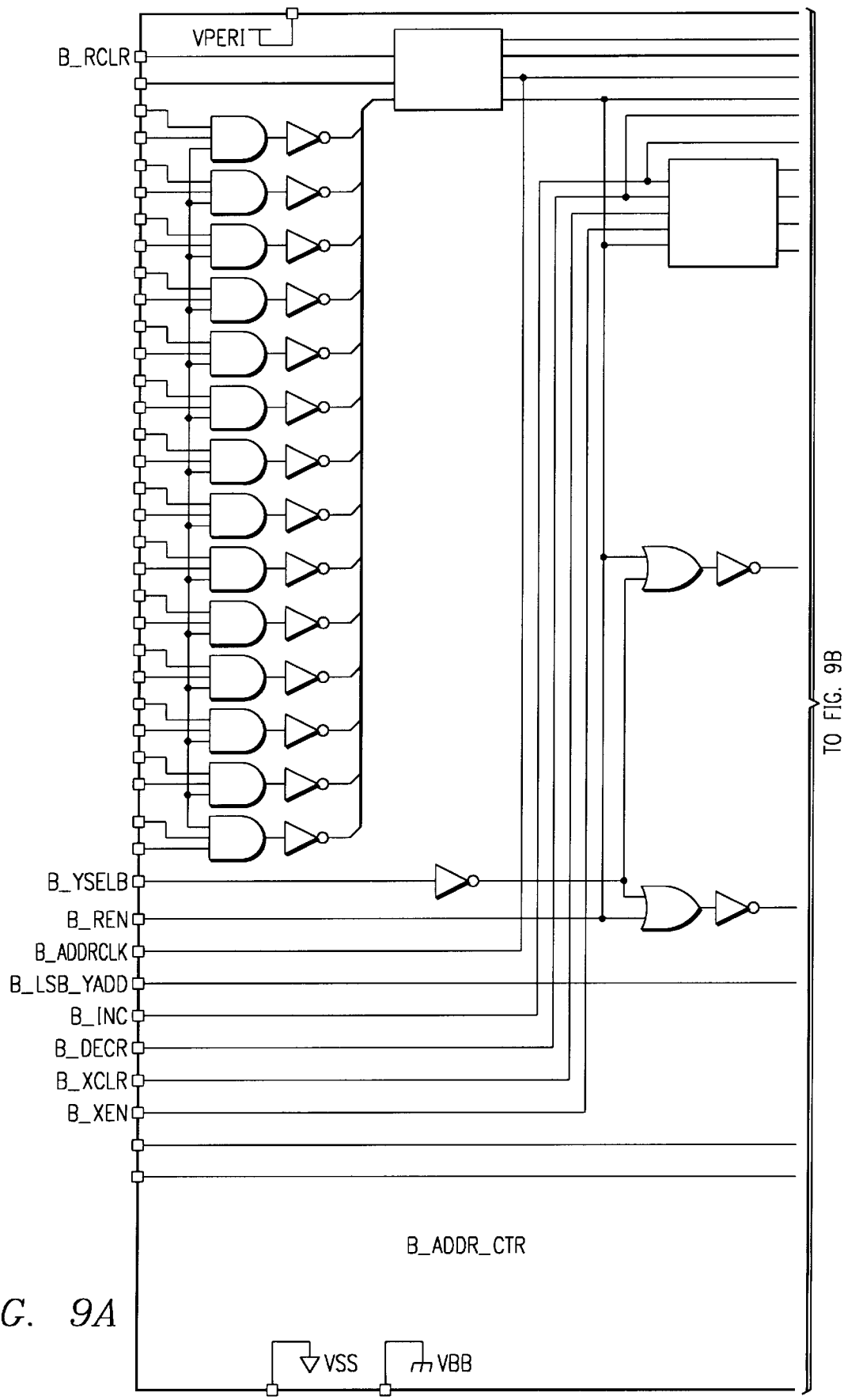
FIGS. 9–12 are logic schematics used in the address control circuit of FIG. 8.
Figure 9B:
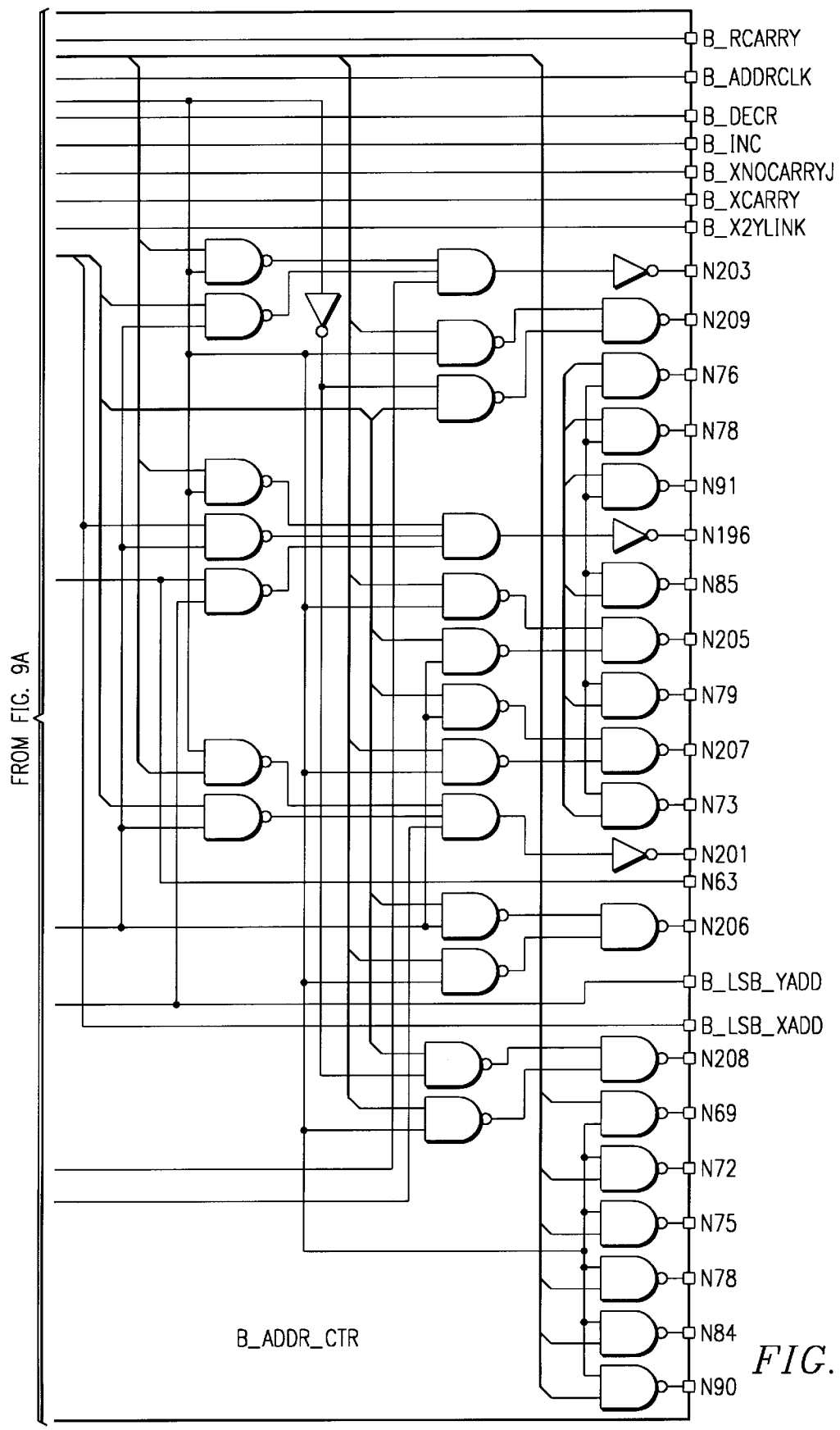
Figure 10A:
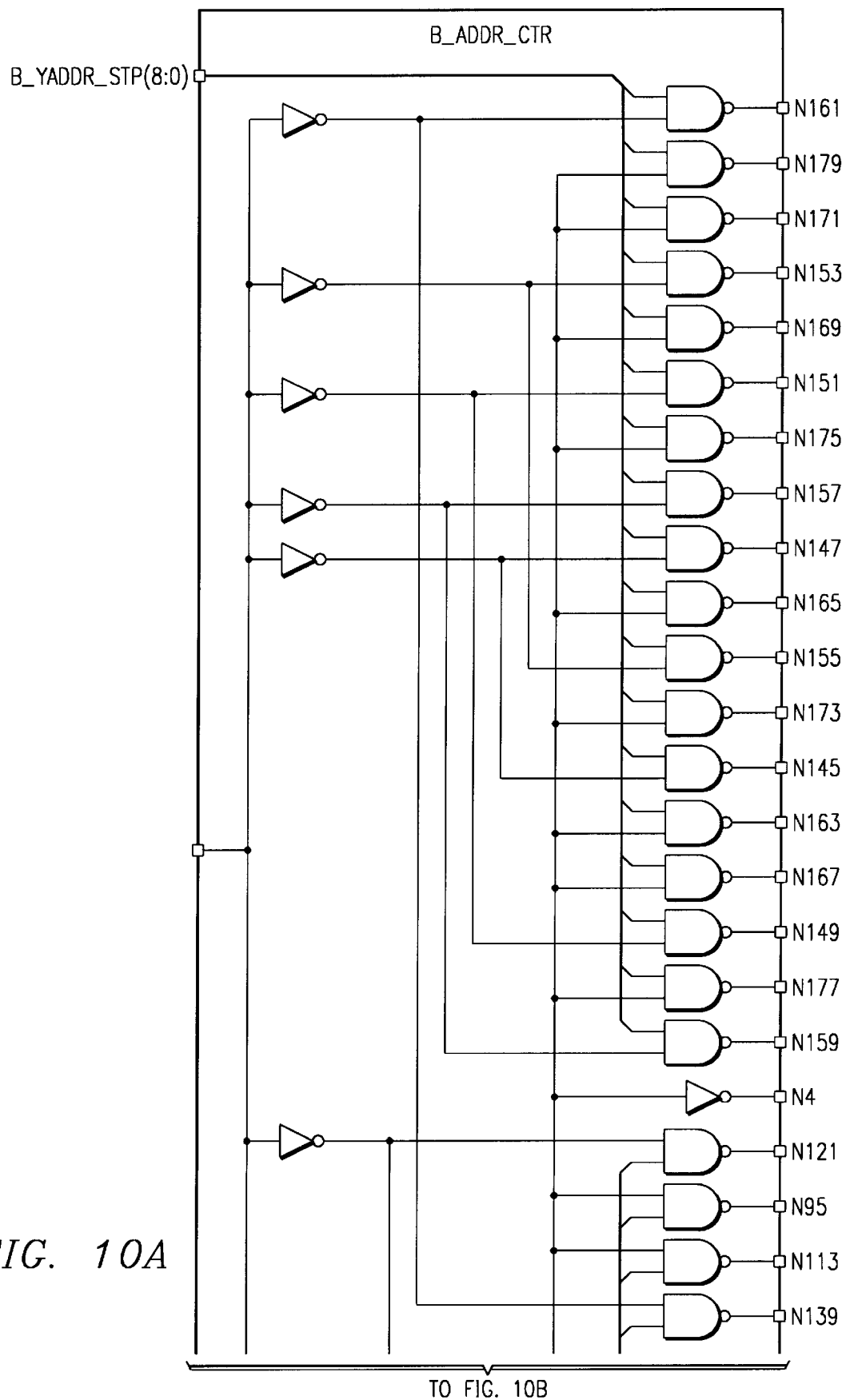
Figure 10B:
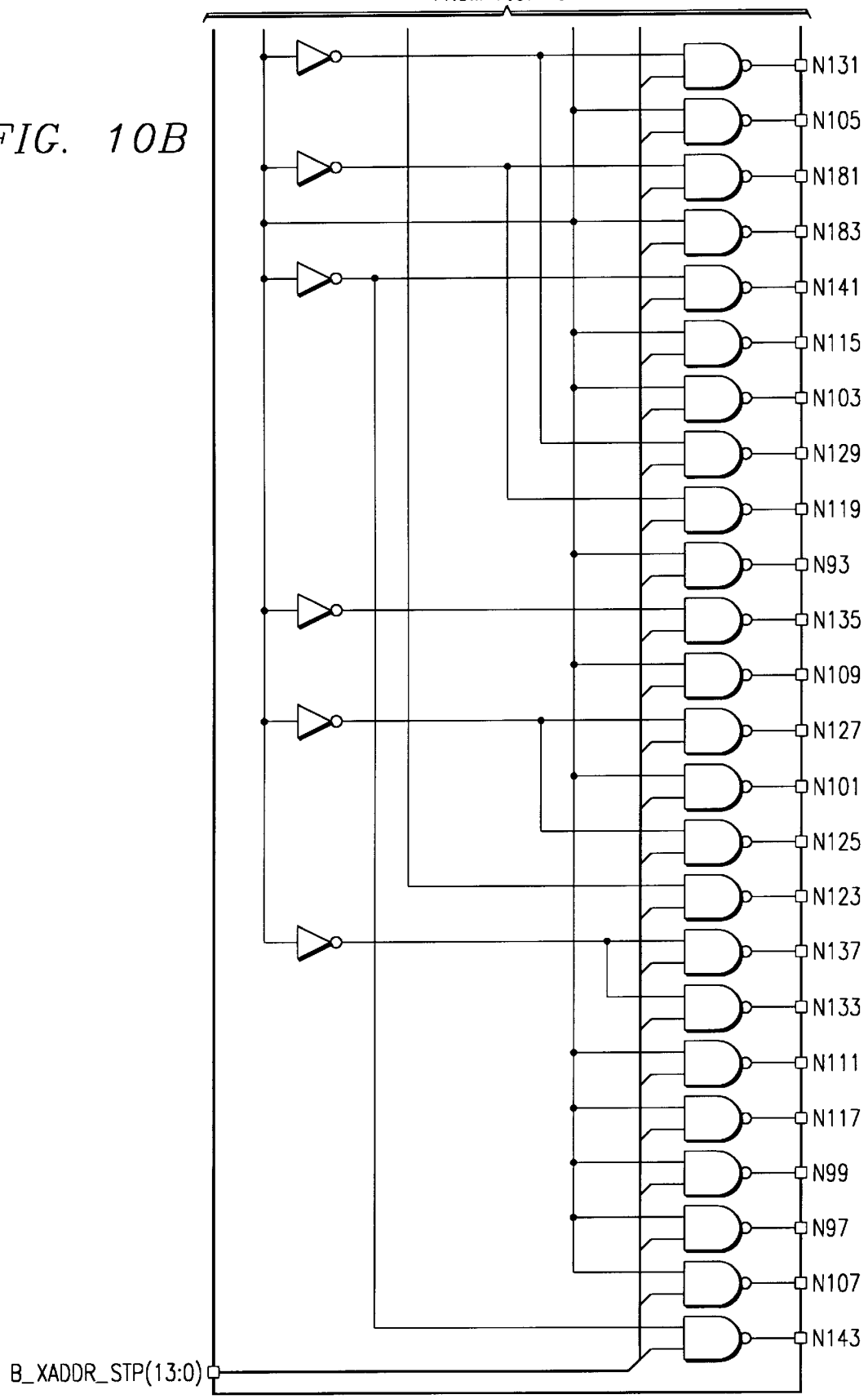
Figure 11A:
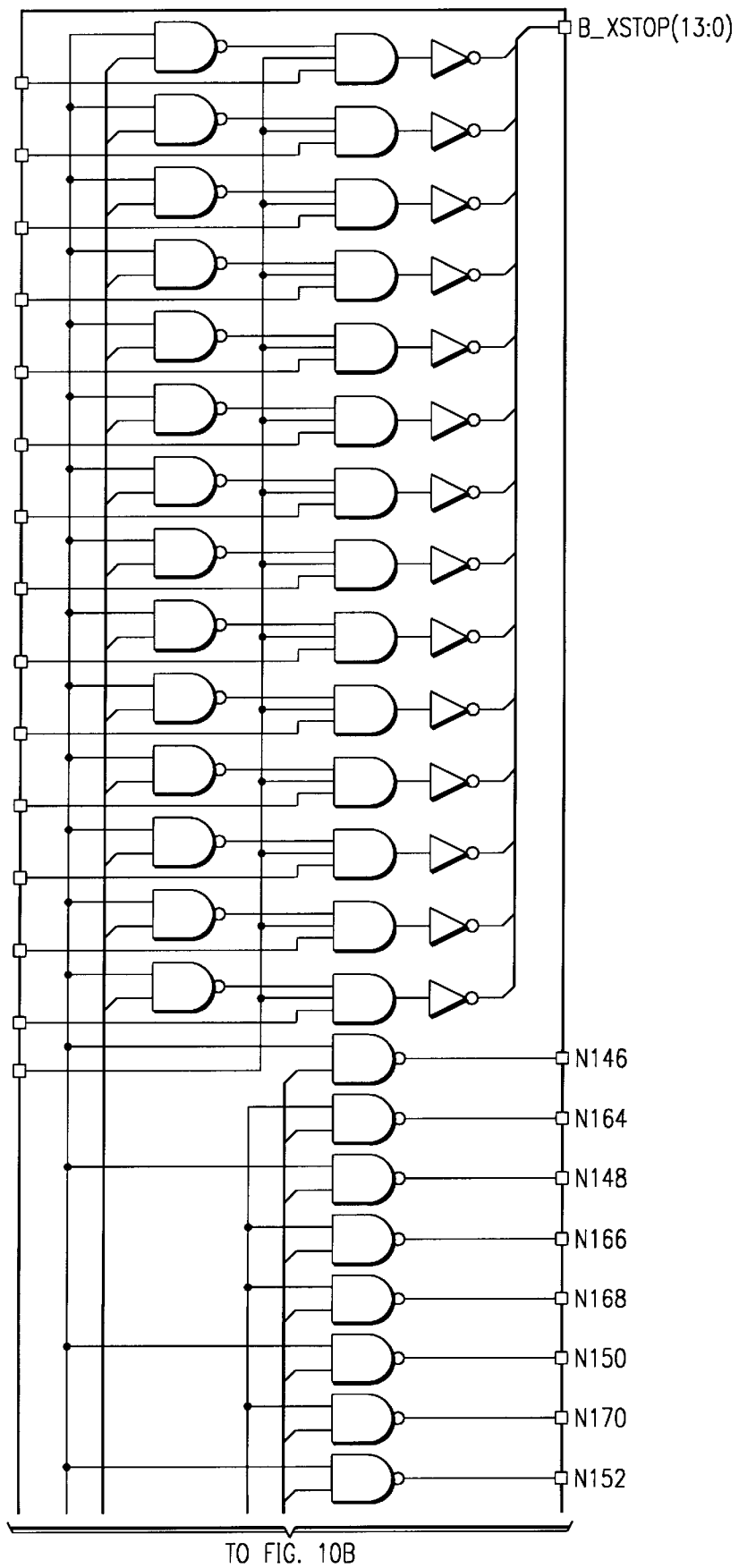
Figure 11B:
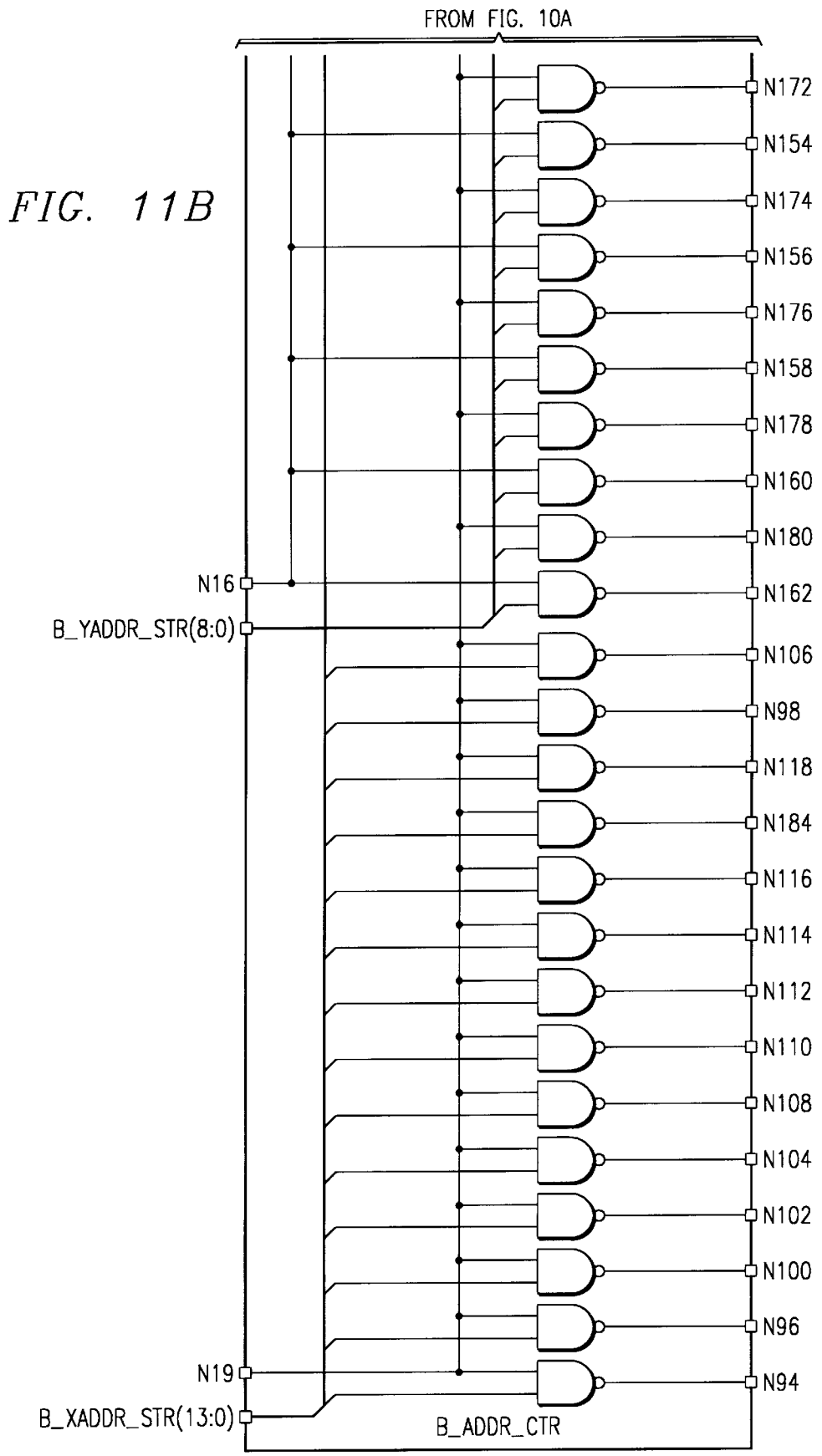
Figure 12A:
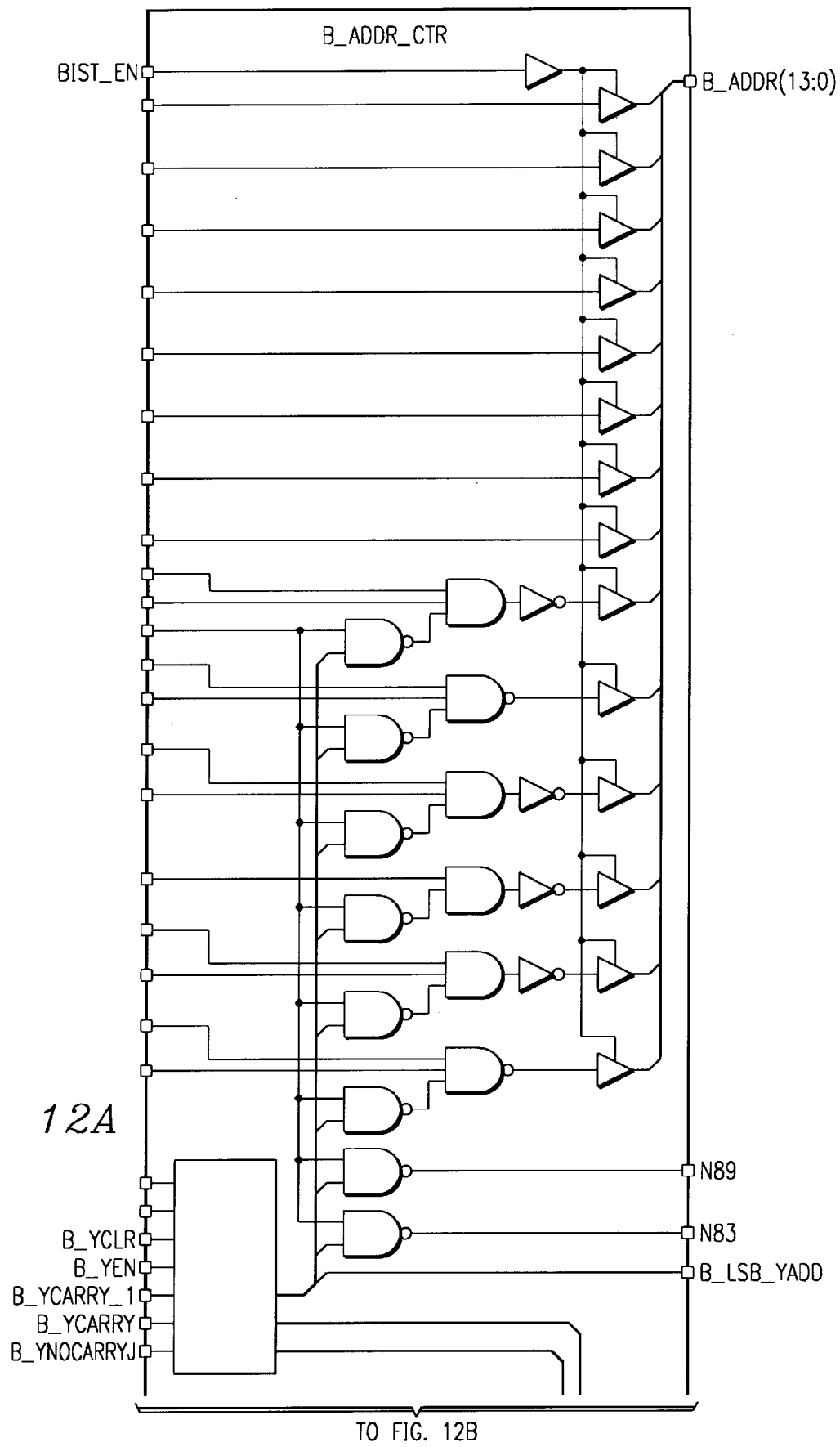
Figure 12B:
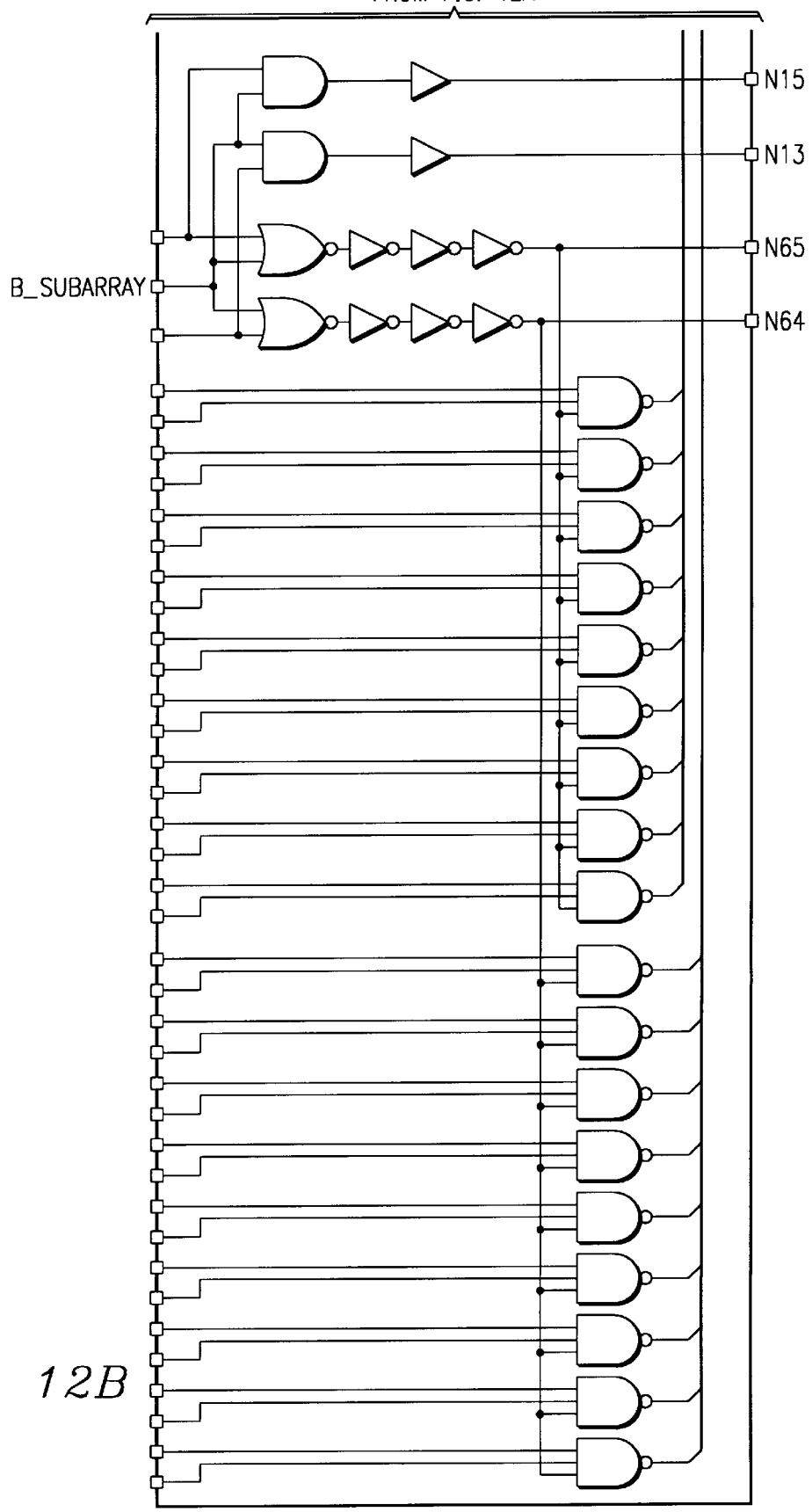

Referring now to FIG. 8 there is a block diagram of a BIST address control circuit 65 that controls generation of array addresses during an active self-test operation. FIGS. 9, 10, 11 and 12 are logic schematics of circuits included within the address control circuit 65 of FIG. 8.

The BIST signals interface with the main circuit as close to the buffer as possible to ensure that they closely simulate conventional test conditions. This will allow the BIST circuits to test as much of the memory device circuitry as possible.

Figures 13A, 13B, 13C:
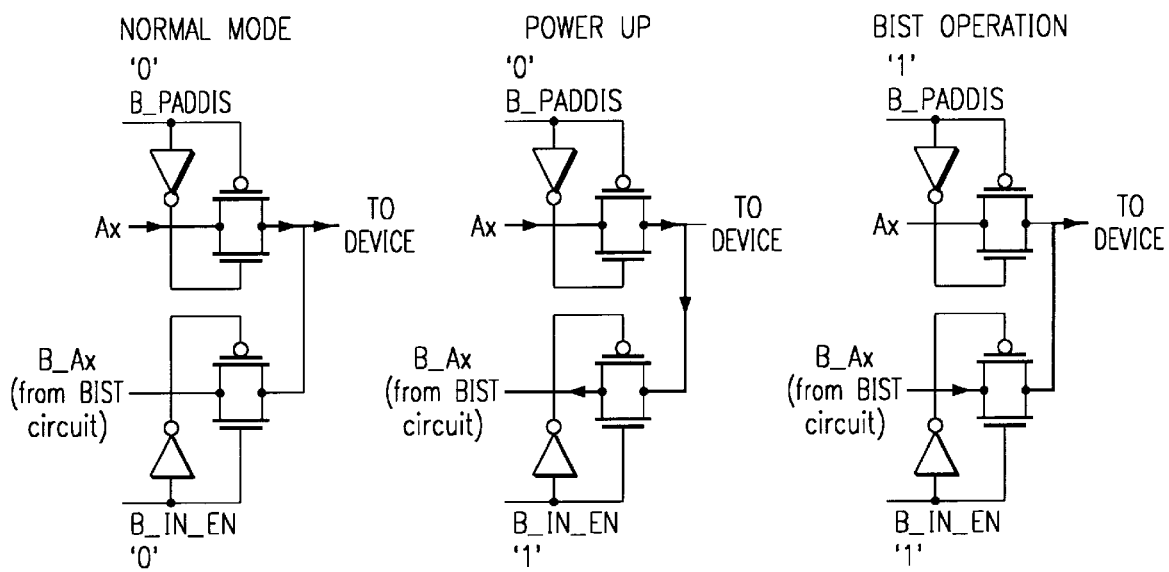
FIGS. 13A–13C are schematic diagrams showing the operation of the address buffer of the memory device.

FIGS. 13A__13C show the interface between BIST generated signals and the main devices. The main function of the BIST generated signals is to replace the external signals that the memory device receives. Thus at the BIST interface there is a multiplex circuit which chooses between the BIST generated signals B-Ax and the external signals Ax from outside. The address lines are being used for multiple purposes, besides the above two cases, they are also used in power up to bring information into the BIST circuit, as illustrated in FIG. 13B. Control signals B__PADDIS and B__IN__EN, generated by the self-test arrangement control how the multiplexer operates at anytime.

The address bus A0–A13 of FIG. 1 is used for applying the special signal conditions for the self-test mode during and after power up. An overvoltage signal is applied by way of one lead of the address bus A0–A13 to a BIST detector circuit 300, which responds to the overvoltage condition by putting itself in a standby self-test condition. In this description the address lead A4 is used as an exemplary over voltage lead. While the BIST detector circuit 300 remains in its standby condition, it allows the built-in self-test arrangement to prepare for testing by accumulating information about a specific test to be run. Typically the specific test will be selected from a large group of tests which might be run. The built-in self-test arrangement will remain in the self-test standby condition until another input signal is applied. Meanwhile data can be written into or read out of the memory array 220, as if it were in the normal mode because the built-in self-test arrangement 60 is in standby rather than in active self-test mode.

The self-test arrangement 60 is put into the active self-test mode from standby by applying a high level signal CS__ by way of a lead 135 to the BIST detector circuit 300. The built-in self-test arrangement 60 and the memory device 50 will operate in the active self-test mode as long as the signal CS__ remains at the high level and then return to normal operation when the signal CS__ goes to its low level.

Figure 14:
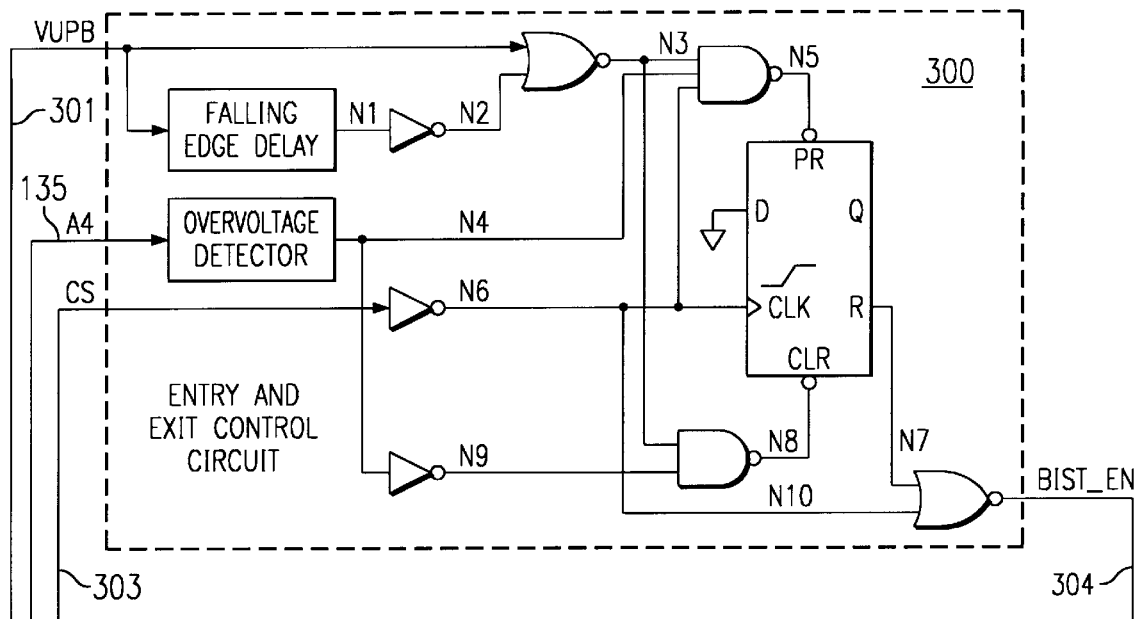
FIG. 14 is a logic diagram of a BIST detector circuit.

Referring now to FIG. 14, the BIST detector circuit 300 includes input terminals 301, 135, and 303 for receiving, respectively, a signal VUPB, an over voltage signal A4 from the lead of the address bus A0–A13, and the control signal CS__. An output lead 304 carries a built-in self-test enable signal BIST_EN that indicates when the device 50 is operating in its self-test mode. The BIST detector circuit 300 detects a BIST request during power up only. To detect a BIST request requires an overvoltage to be detected at power up and the signal CS__ having a value of '0' at that time. When the circuit 300 detects these two conditions at power up, the chip goes into a BIST standby mode. While the circuit 300 is in BIST standby mode and the signal CS__ goes high, the circuit 300 enters the self-test active mode.

Figure 15:
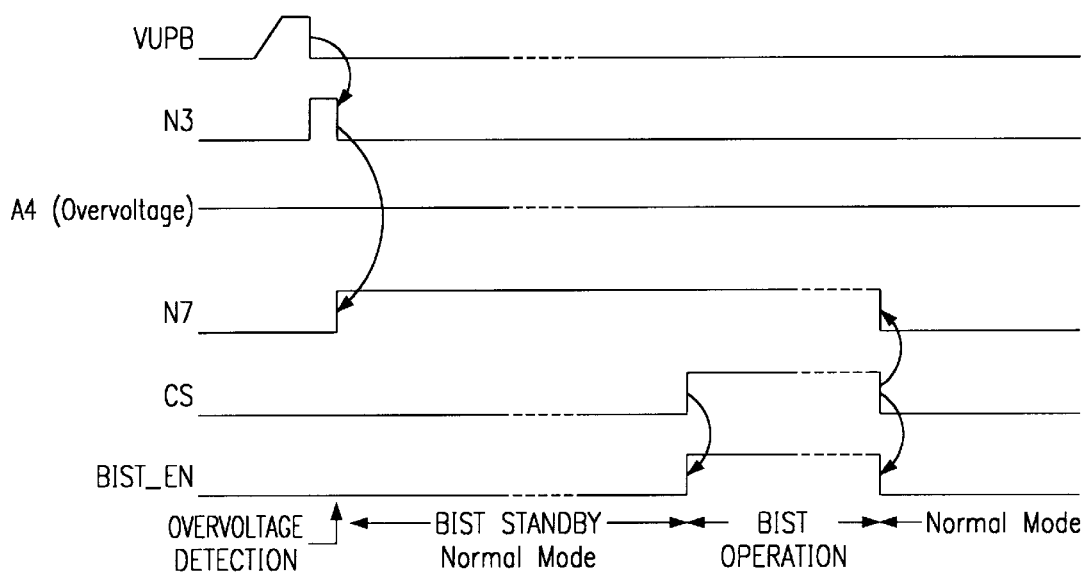
FIG. 15 is a timing diagram showing operating conditions of the detector circuit of FIG. 14.
Figure 16:
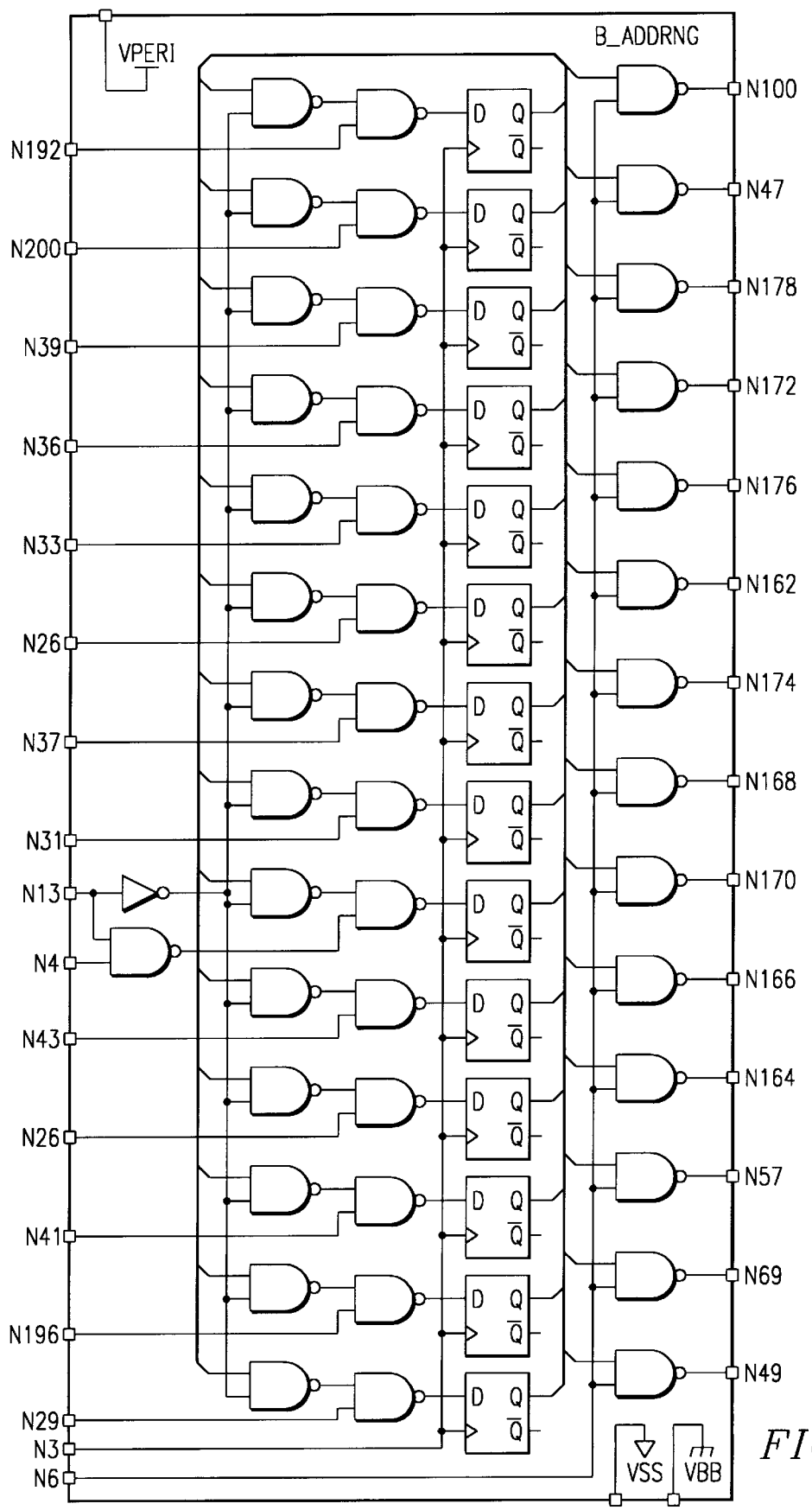
FIGS. 16–21 are logic schematics of BIST address register circuits.
Figure 17:
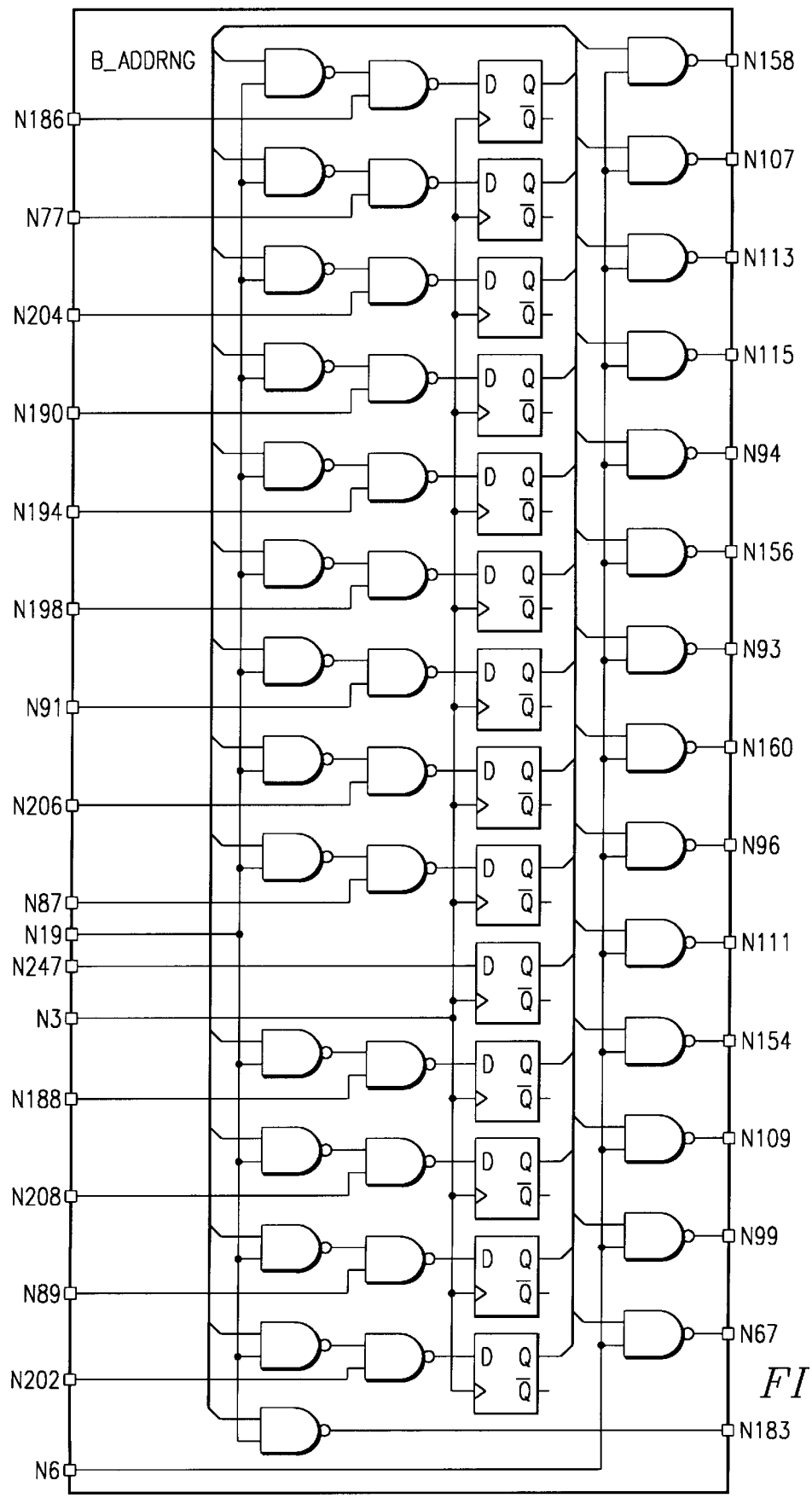
Figure 18:
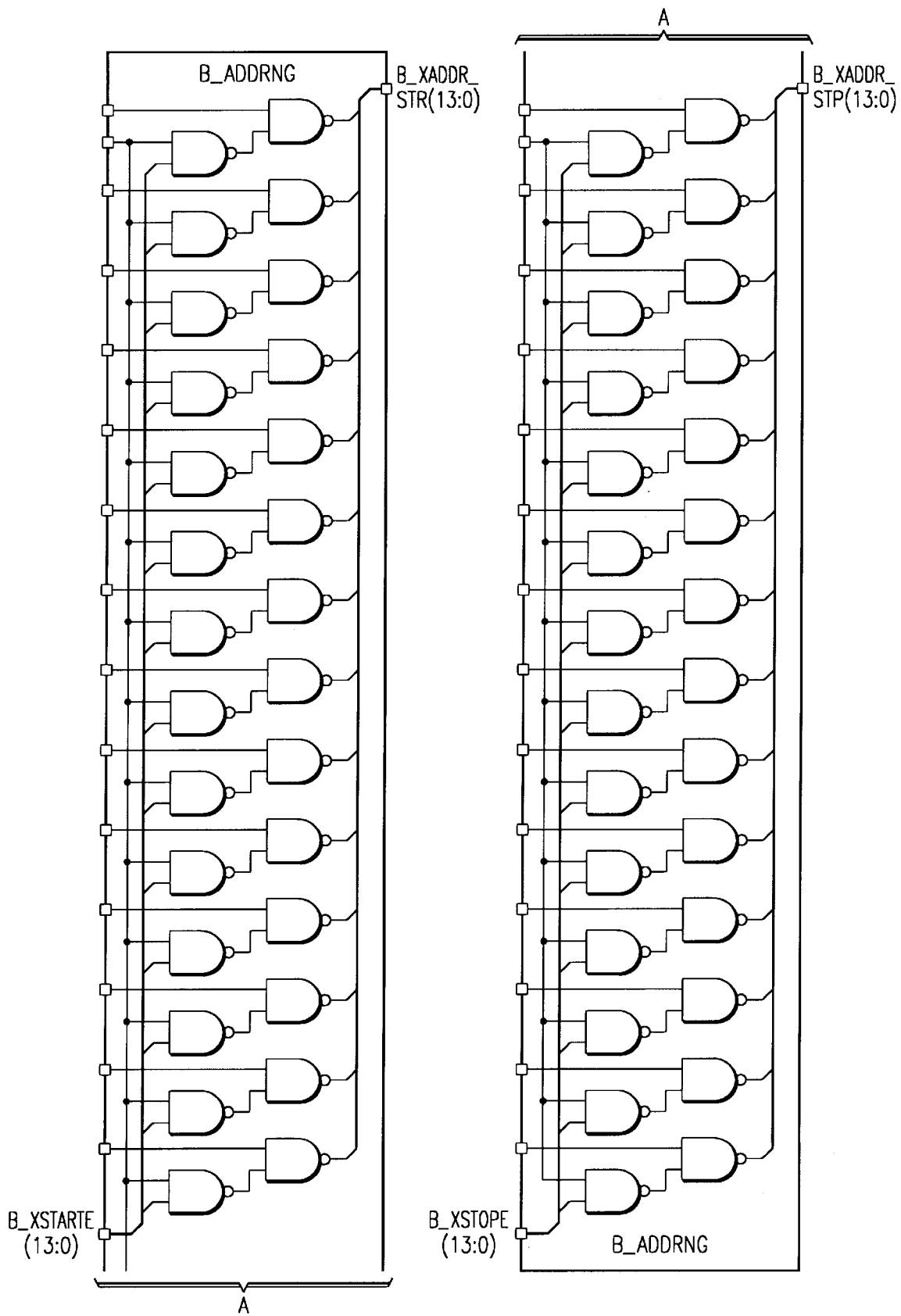
Figure 19A:
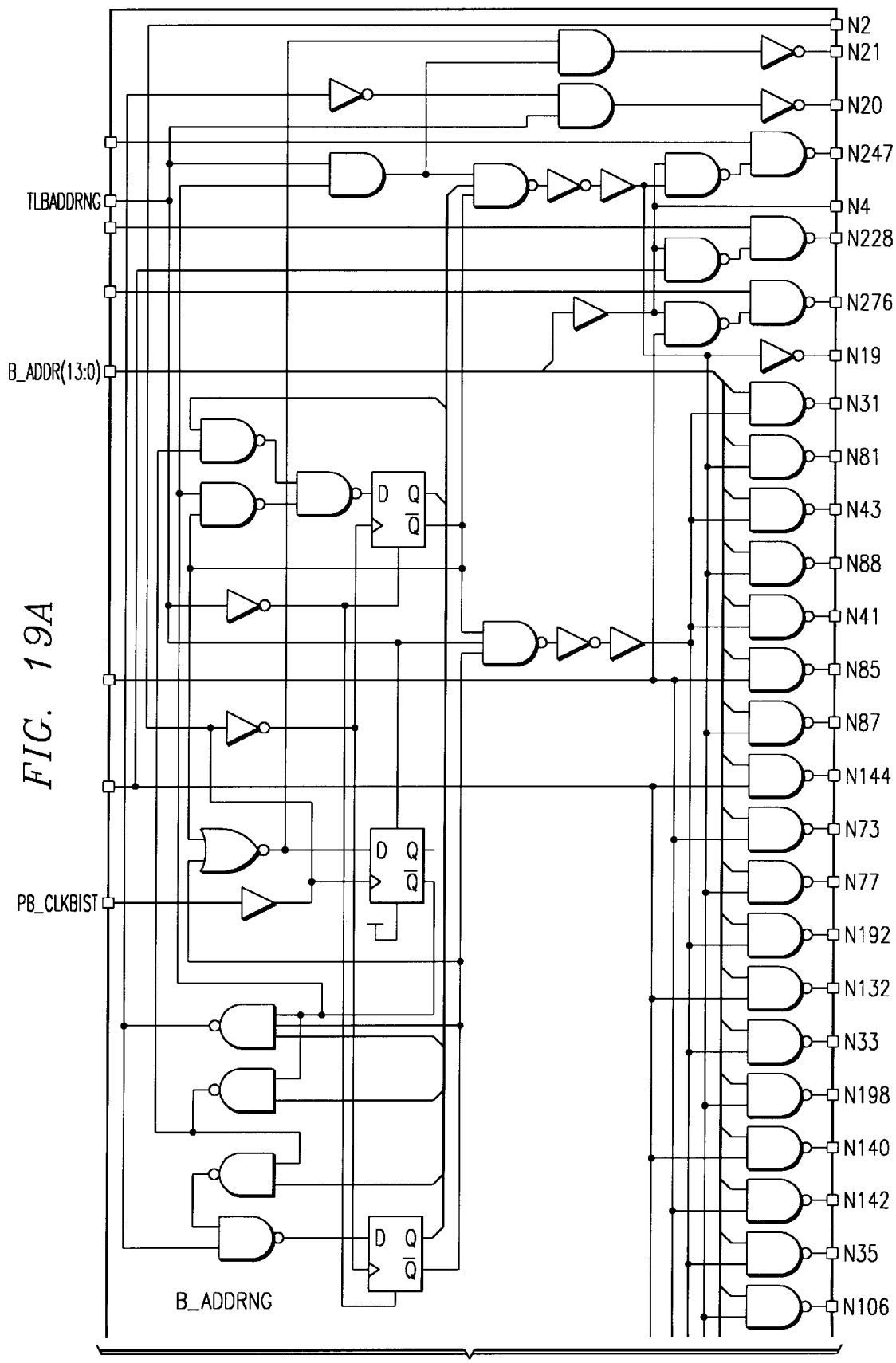
Figure 19B:
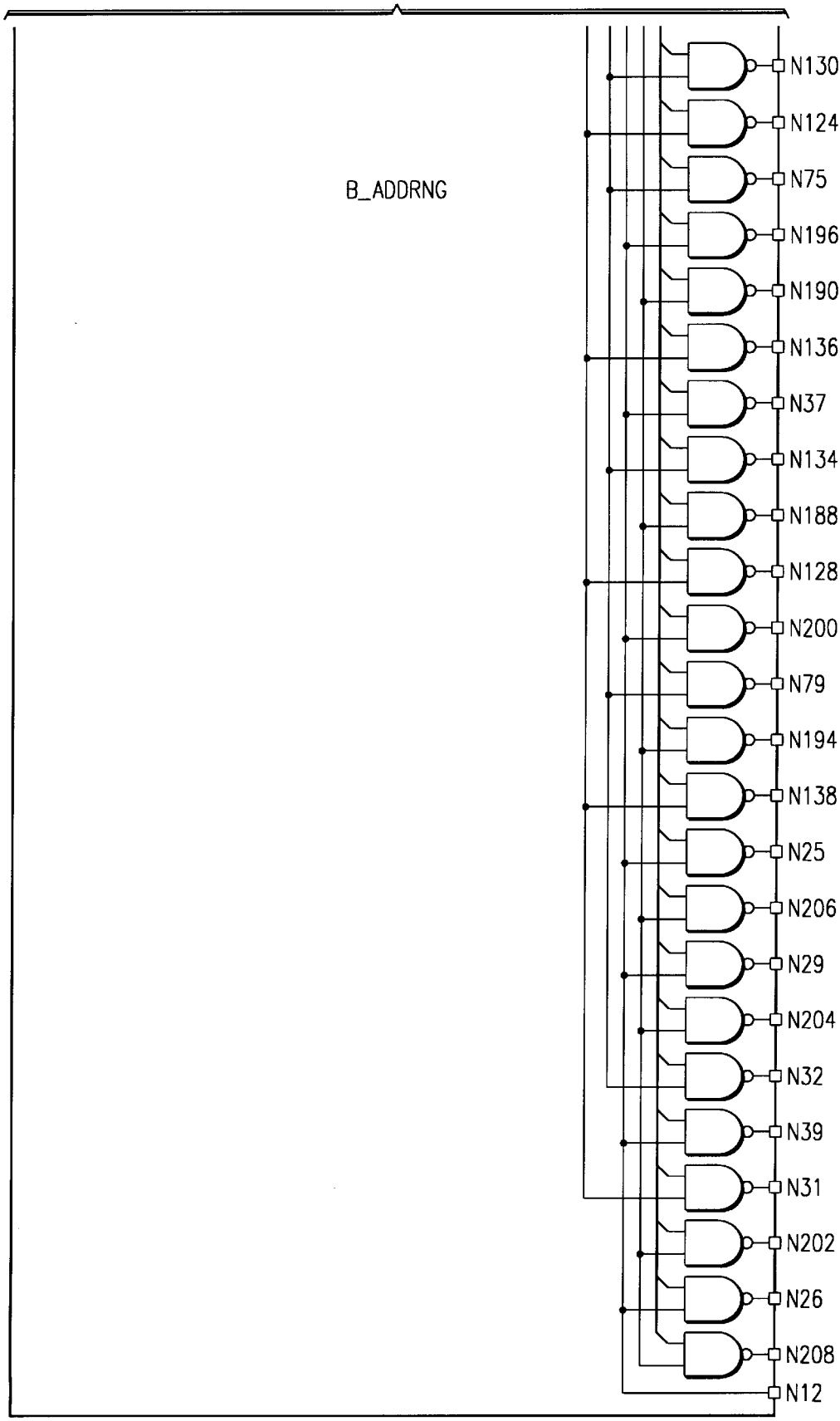
Figure 20:
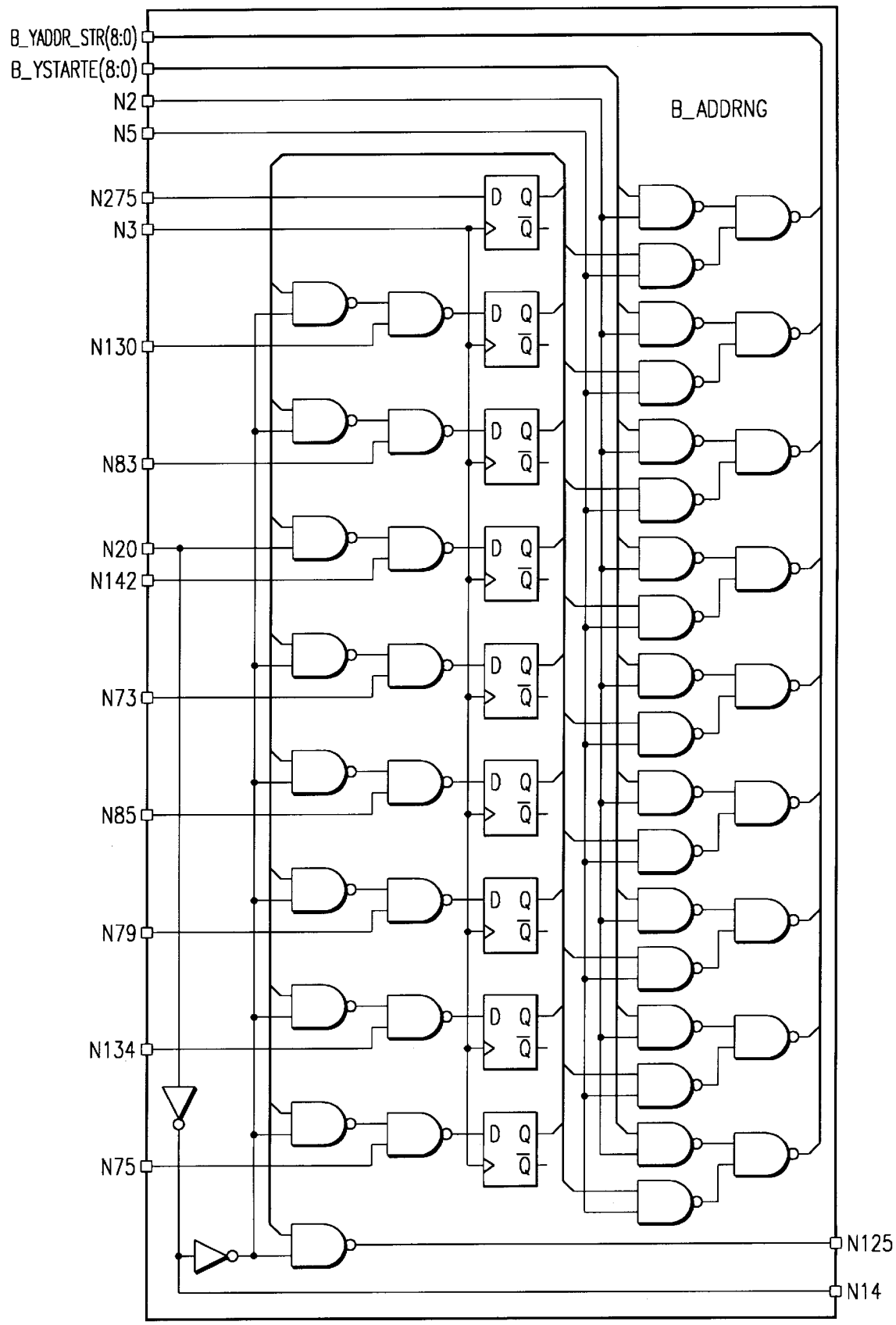
Figure 21:
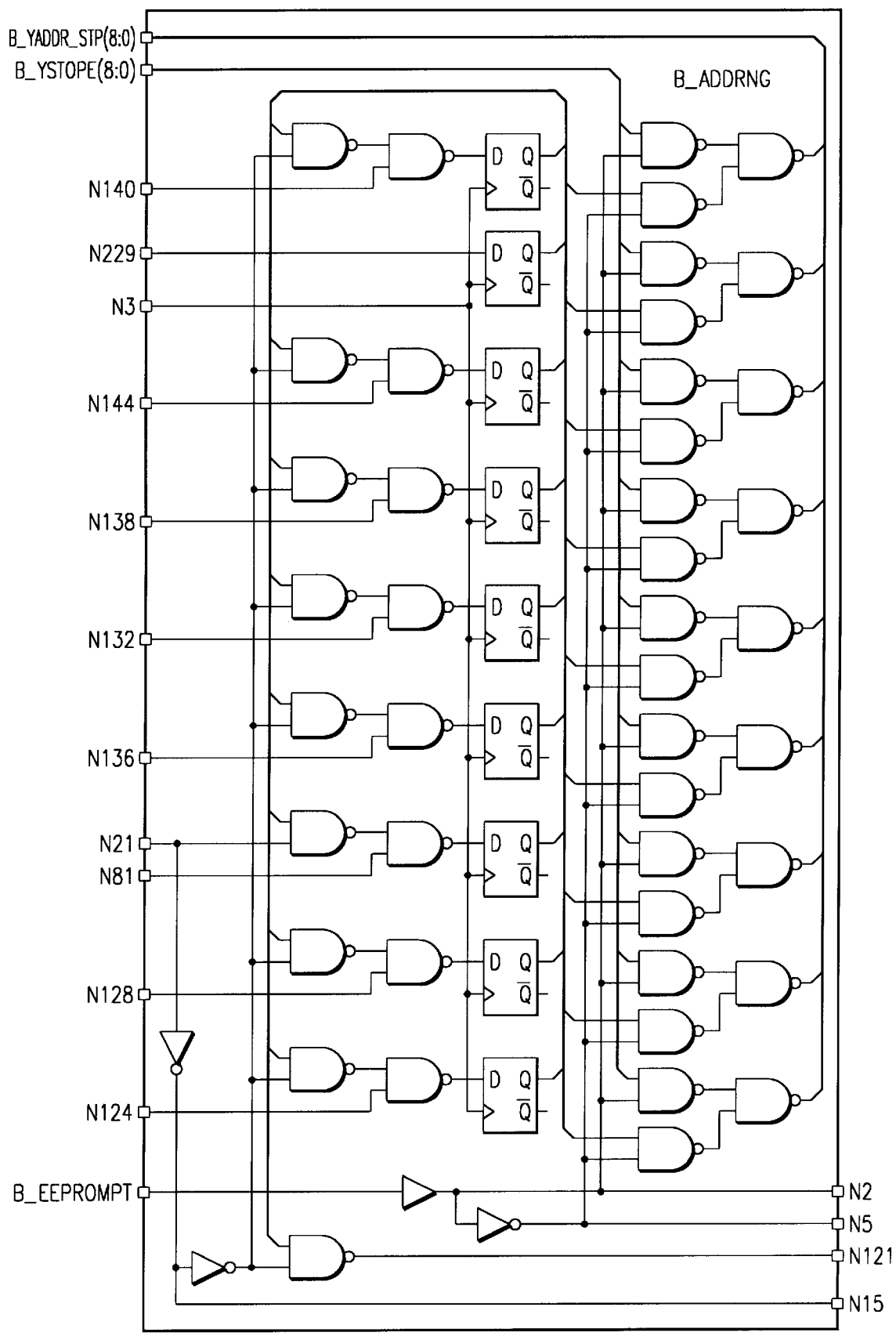

FIG. 15 presents the timing diagram for the operation of the BIST detector circuit 300 of FIG. 14. Several key signals are presented in FIG. 15 together with their interdependency. It is noted that all of the signals applied to the BIST detector circuit 300 are fundamentally voltage levels. As will be demonstrated subsequently herein, no external fluctuating control signals need to be applied to the memory device 50 during the active self-test mode. All signals for performing the repertoire of tests are produced by the built-in self-test arrangement 60 on the device 50.

A more detailed description of the arrangement and operation of the BIST detector circuit 300 is presented in a co-pending patent application, Ser. No. 08/840,428 (TI-22640) which was filed concurrently herewith. In that patent application, the BIST detector circuit 300 is referred to as an entry and exit control circuit. The subject matter of that patent application is incorporated herein by reference thereto.

Two signals, A4 and control signal CS__ are multiplexed for built-in self-test entry. The signal A4, or any other address bit, is multiplexed as an overvoltage. Control signal CS__ is used for timing BIST entry and EXIT. A BIST request is detected if an overvoltage is detected and the control signal CS__ is low when the device is being powered up. If an overvoltage is detected at the falling edge of VUPB, the device will go into BIST standby mode. The device will only go into BIST active mode if the control signal CS_ is subsequently pulled high. This will allow full control of the time to enter the BIST active mode. During BIST operation, if CS_ is pulled low, the device will exit BIST immediately. Normal operation occurs when CS_ is low. This prevents the BIST active mode from occurring during normal mode operation.

In BIST standby mode, the device can operate as if it were in normal mode. Note that the control signal CS_ behaves normally while the device is operating in normal mode. It is only in the BIST mode that the control signal CS_ function differently. Design for test (DFT) modes can be executed when device is in BIST standby mode. One of the ways to use DFT mode while in BIST standby is to have the address range mode load start and stop addresses before the BIST active mode operation.

Referring now to FIGS. 16–21, there are address range registers for storing address information used during self-test operations. When a BIST request is detected, an internal signal B_SR_LOAD is generated to load in the information located on the address lines except the address for the overvoltage signal on lead A4. The information loaded in contains two sets of information. Test selection data on the address leads A0–A3, A5–A10 determine whether or not each specific test is to be run in BIST active mode. Secondly, BIST operation options such as internal external clock option, full/sub array option, enable disable output option.

Figure 3:
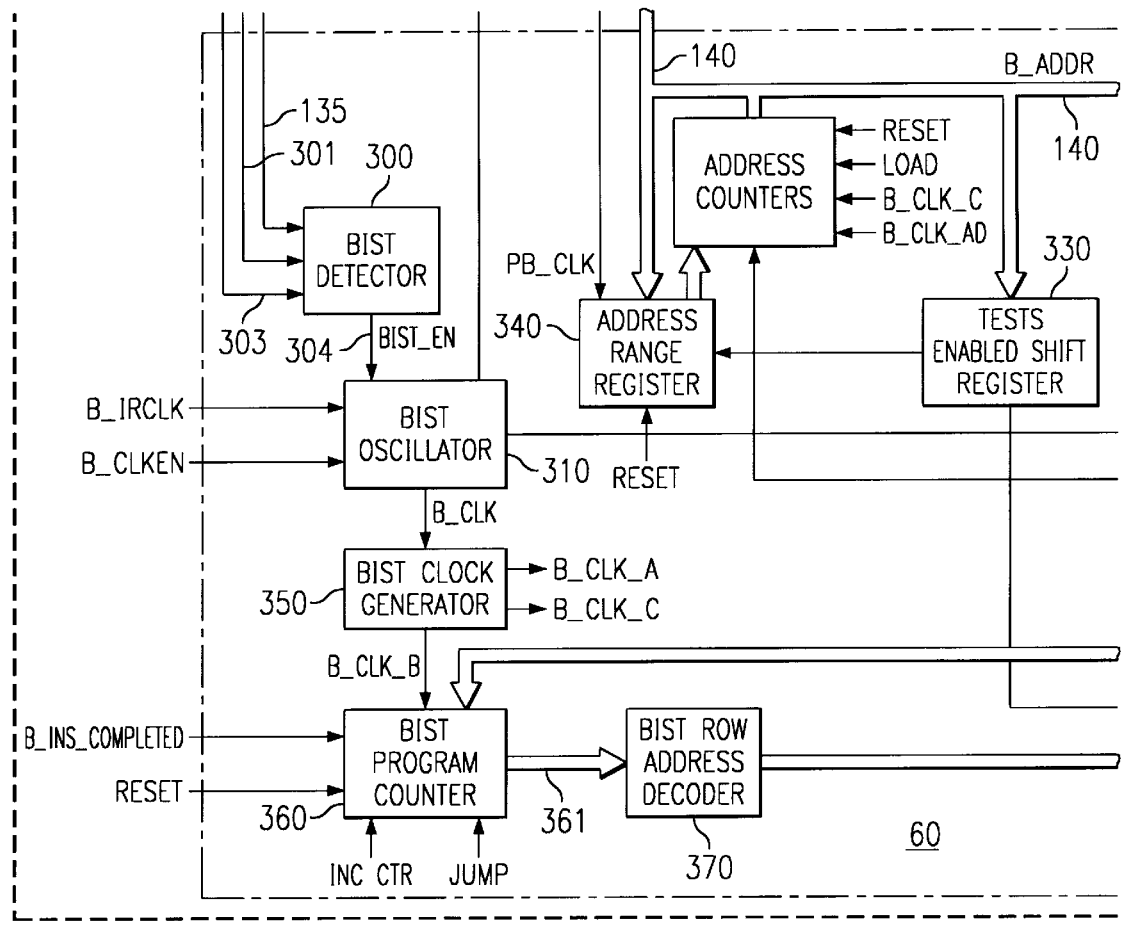

In FIG. 3, there is shown a BIST oscillator circuit 310 that includes an arrangement for generating a continuously repetitive clock signal B_CLK which is used to produce a group of specific clock signals for controlling different parts of the built-in self-test operation.

Figures 22, 23:
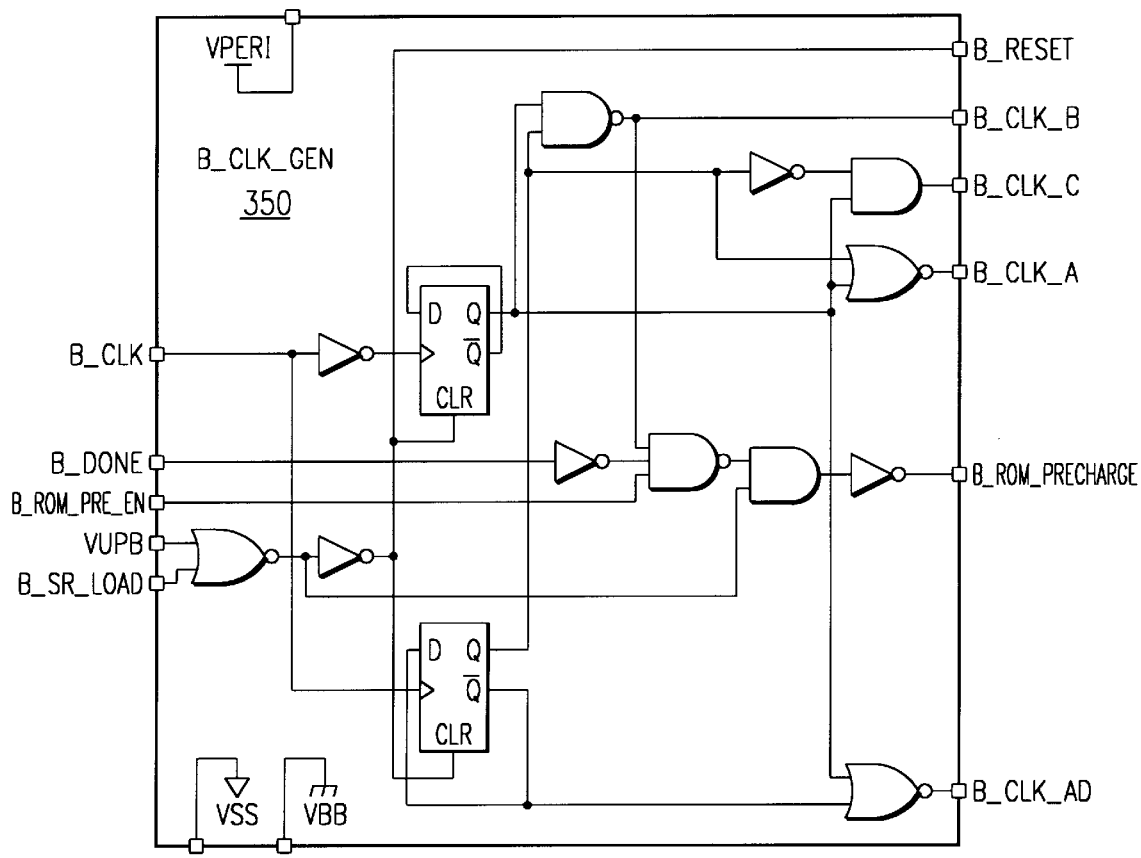
FIG. 22 is a logic schematic of a BIST clock generator circuit.
FIG. 23 is a table showing the register positions for storing data representing what test operations should be enabled to run or not enabled to run for a specific self-test.

FIG. 22 is a logic schematic of a BIST clock generator circuit 350 of FIG. 3. It derives BIST clock signals B_CLK_A, B_CLK_B, and B_CLK_C.

Upon entering the active self-test mode, the clock signal B_CLK is applied to the clock buffer circuit 110 of FIG. 1 for taking over control of the clock buffer circuit 110, which thereafter during the active self-test mode produces the clock signal B_CLK to control access to and the operations of the memory array 220, as well as parts of the built-in self-test arrangement 60. Initially data from the address buffer 100 is transferred by way of an internal address bus 140 to an enabled tests circuit 330 in FIG. 3. Exemplary circuit 330 is a shift register arrangement that stores data identifying a specific test, or a group of tests to be run during the relevant active self-test mode. This data may be, for example, a high level for each test to be run and a low level for each test that is not to be run. Once the selected test data is stored in the enabled tests circuit 330, a group of addresses may be stored in the address range registers 340.

Referring now to FIG. 23, there is shown a diagram of the information that is stored in the enabled test circuit 330. In FIG. 23, the address bits positions A0–A3, respectively, represent the gross test, the pause test, X march and Y march. Address bit positions A5–A10, respectively, represent short disturb, long disturb, page disturb, burn in, write one row, and read one column. Address bit position A11 and bank addresses BA0 and BA1, respectively, represent output enable, sub array option, and internal clock/external clock selection.

A clock is needed for the BIST operation. BIST circuit has an internal oscillator which provides this clock with a fixed frequency. There is an external clock option built in for engineering and debug purposes which allows the clock frequency to be varied if needed. The decision to use an external or internal clock is loaded in when a BIST request is detected during power up.

The previously mentioned address range registers 340 include a group of four registers which receive and store, respectively, row and column addresses which determine start and stop addresses in the memory array 220 where the test or tests should commence and end. Such addresses are used at the discretion of the person responsible for testing the device 50. A default condition runs the tests throughout the entire memory starting at row address 0 and column address 0. Thus the address range registers 340 are reset to zero when the device 50 is initially put into the active self-test mode. Thereafter the range addresses may be stored if desired during a DFT mode load operation.

During prototype debug on any early production chip, it is unlikely that a complete array will work correctly. Under such circumstances, the BIST test will always fail since there will always be some cells which do not work and will cause failure of the BIST tests. This means that the BIST logic cannot be completely checked out since there will never be an application of BIST which permits the BIST logic to return a "PASS" signal until a completely good part is manufactured. A second problem occurs during debug of the chip. If the BIST is limited to the complete array test, it cannot be used to target a subset of the array as an aid for debug.

Sub array testing permits the starting address to be any location and the ending address to be any location and they cna be loaded into the BIST address range registers via a DFT mode. The BIST testing is applied between the starting and ending locations including one address location of the starting address is the same as the ending location. The address ranges can be changed each time prior to BIST application thereby permitting the BIST to be applied to islands to fault free areas through repeated testing.

Figure 24:
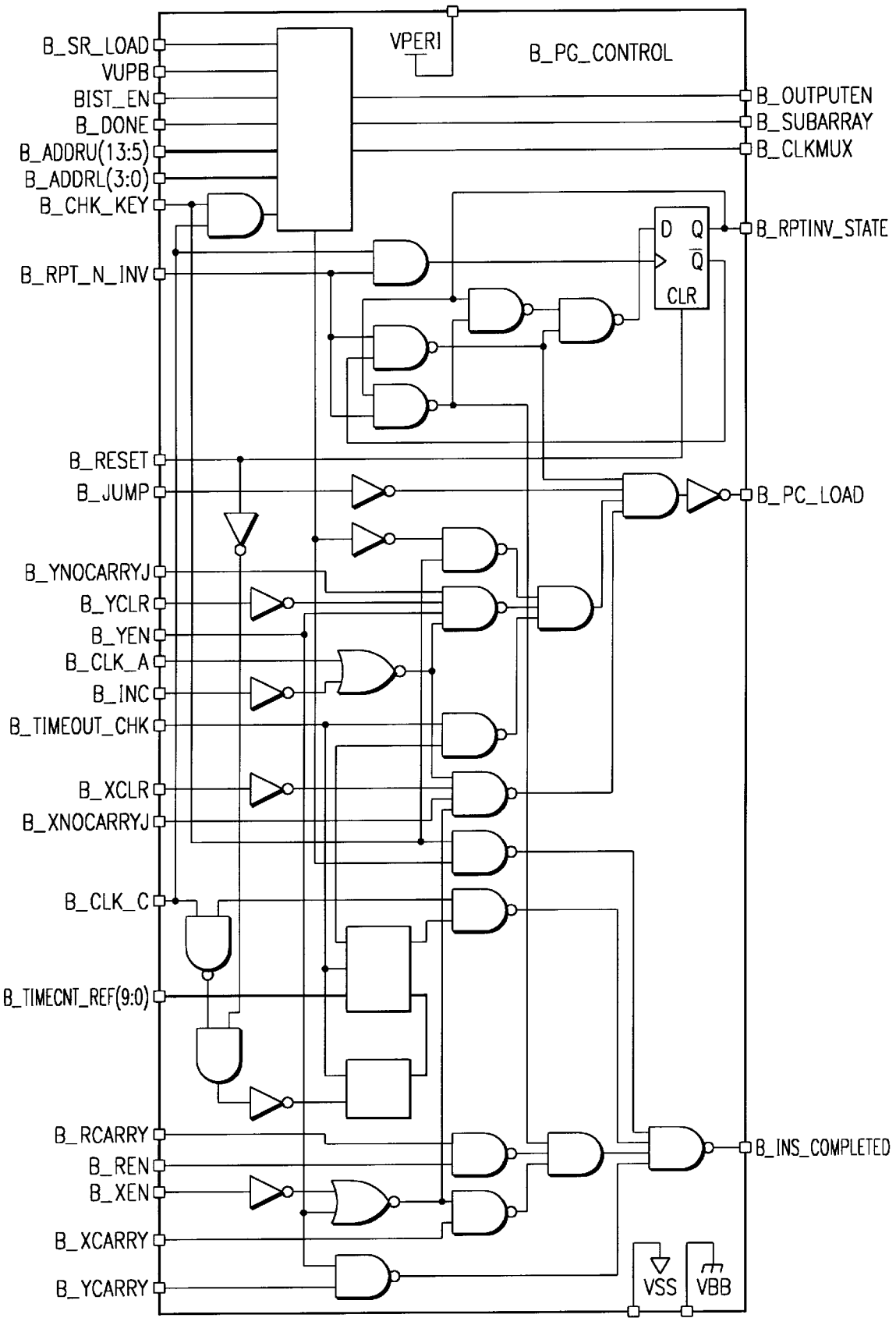
FIGS. 24 and 25 show a logic schematic of a BIST program control circuit that includes a program counter.
Figure 25:
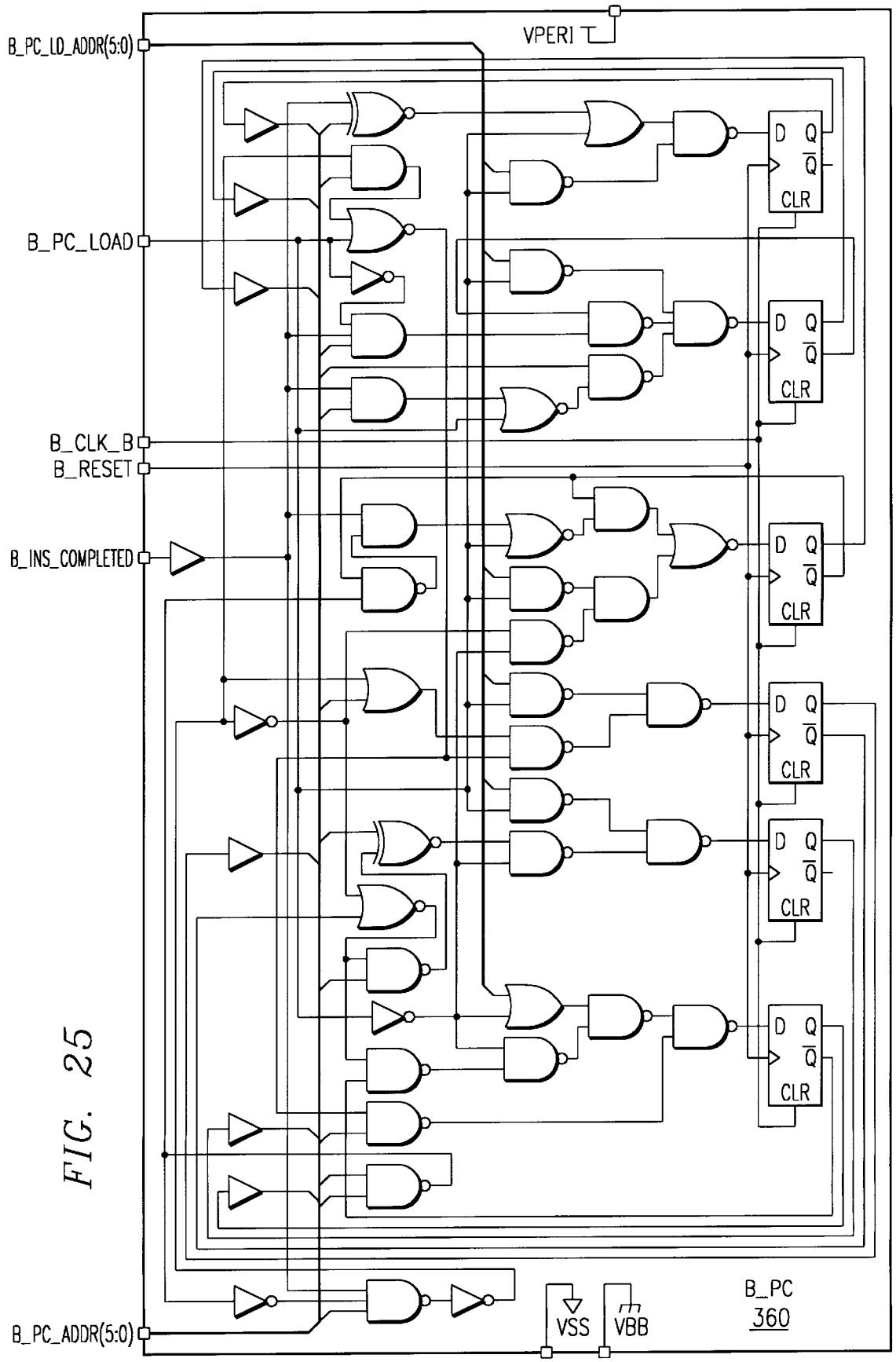

Referring now to FIGS. 24 and 25, there is shown a program control circuit that includes a program counter 360. The BIST program counter 360 is included in the built-in self-test arrangement 60 for controlling test sequences. Upon initiation of the active self-test mode, the BIST program counter 360 is reset by a signal B_RESET to its zero state. This is a sequential logic arrangement in which its current state, in combination with the state of data furnished by a BIST ROM register determines the next state of the BIST program counter 360. The state changes in response to a clock signal B_CLK_B applied from the clock generator 350.

Figure 26A:
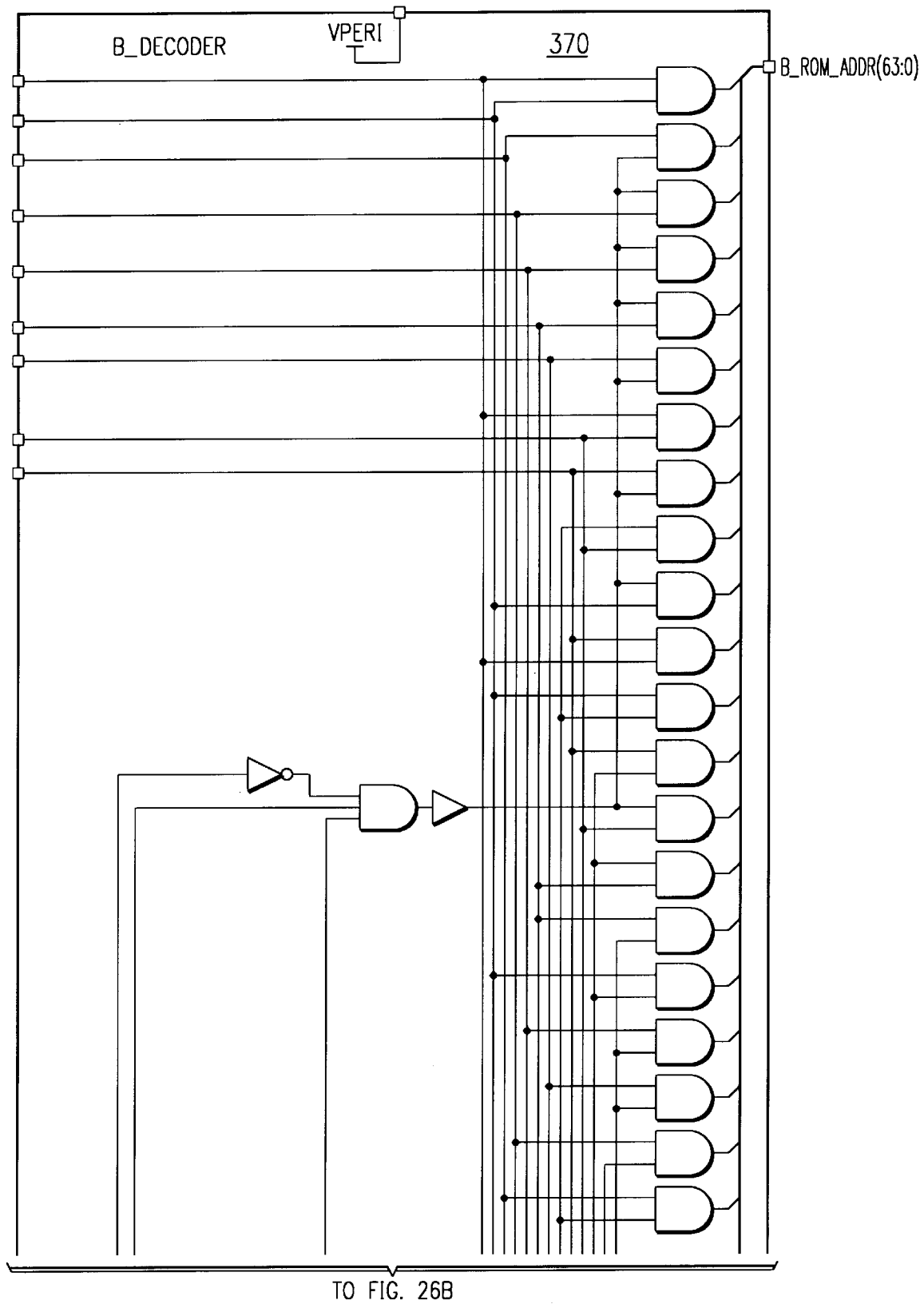
FIG. 26 is a logic schematic of the BIST ROM decoder.
Figure 26B:
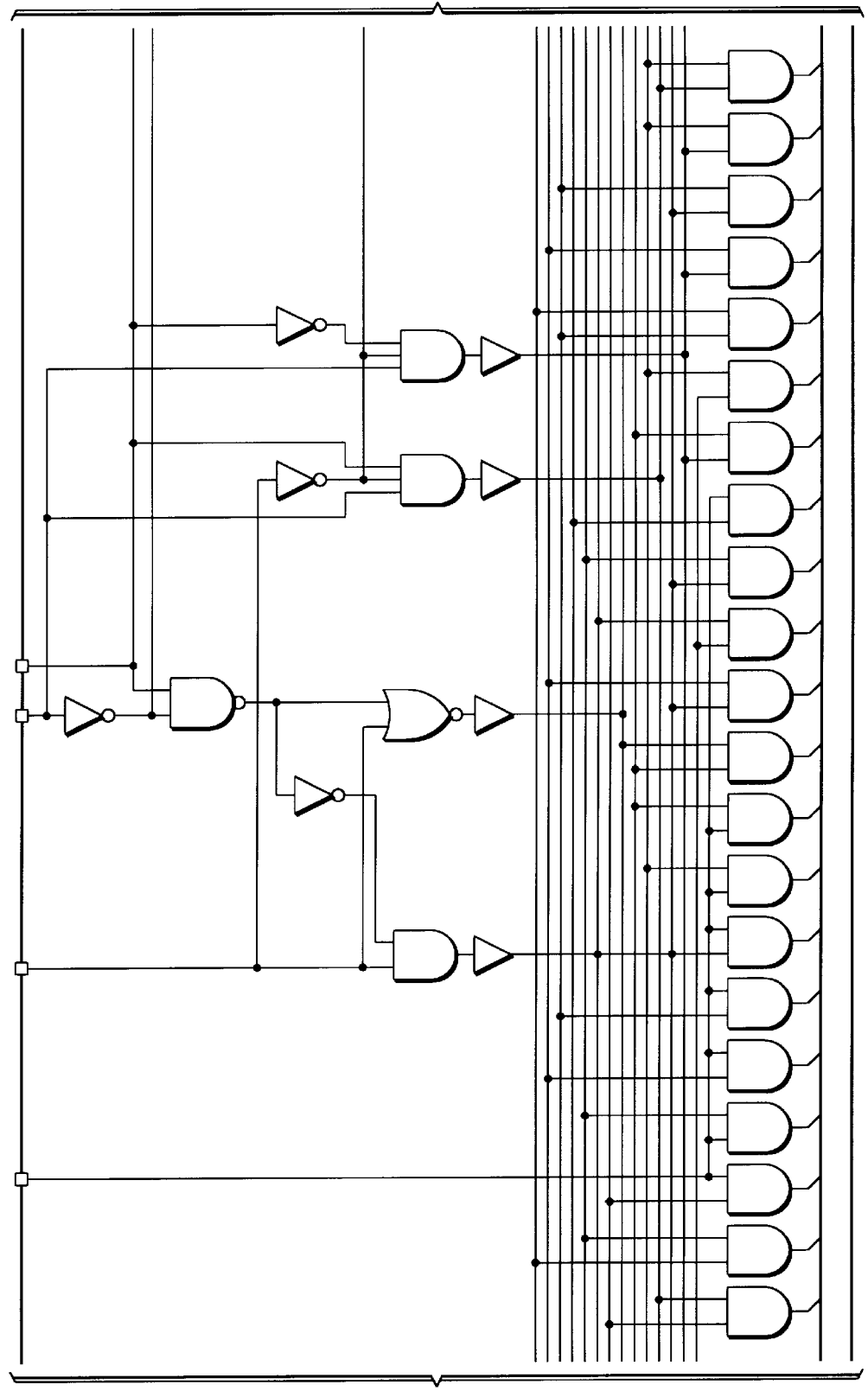
Figure 26C:
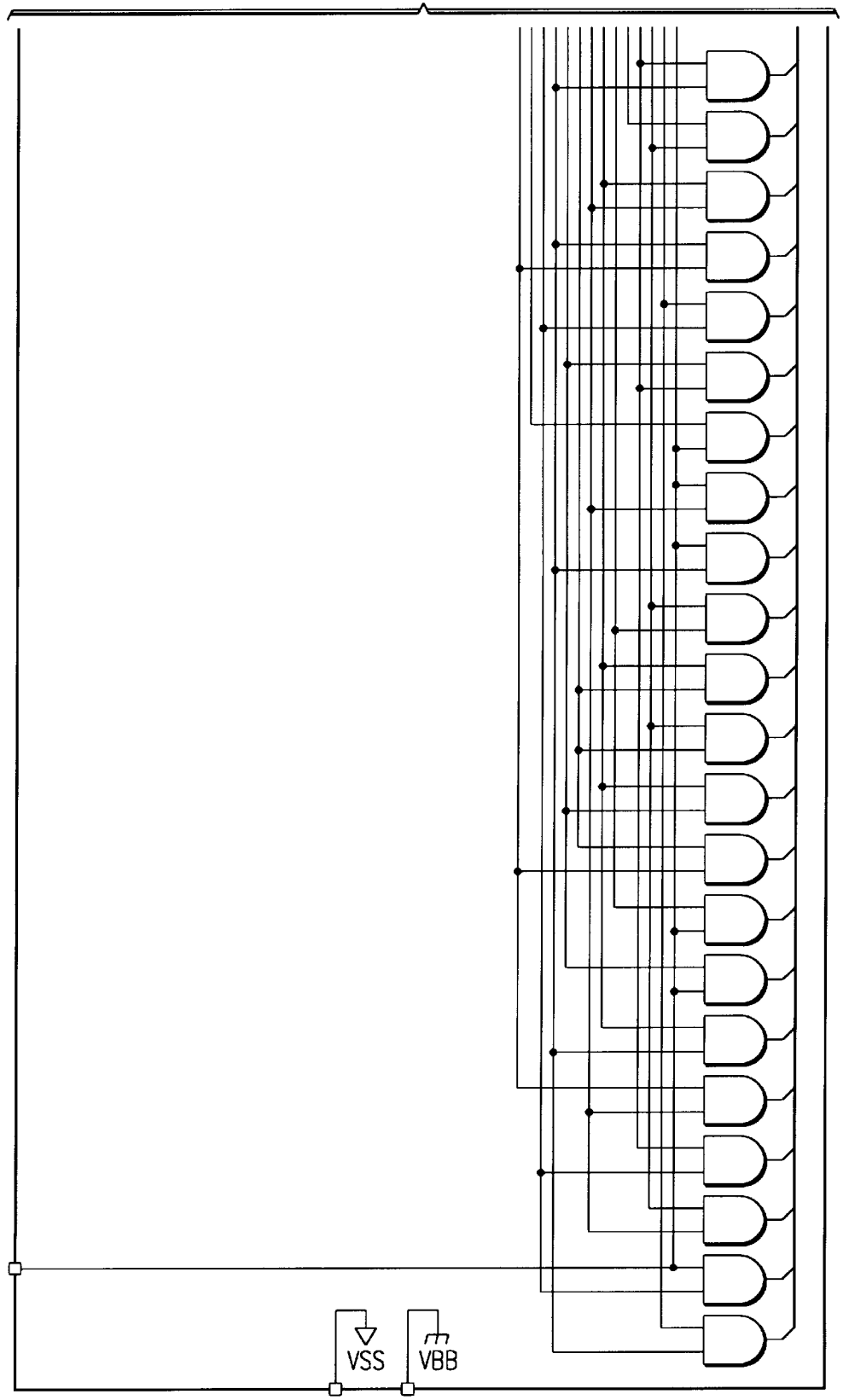

FIG. 26 is a logic schematic for a BIST ROM address decoder 370, shown in FIG. 3. The state of the BIST program counter 360 is represented by a group of binary signals that are applied by way of a bus 361 to the input of the BIST ROM address decoder 370. The group of input binary signals are decoded into a 1 out of 64 code for selecting a row of data from the BIST ROM 400.

Figure 4:
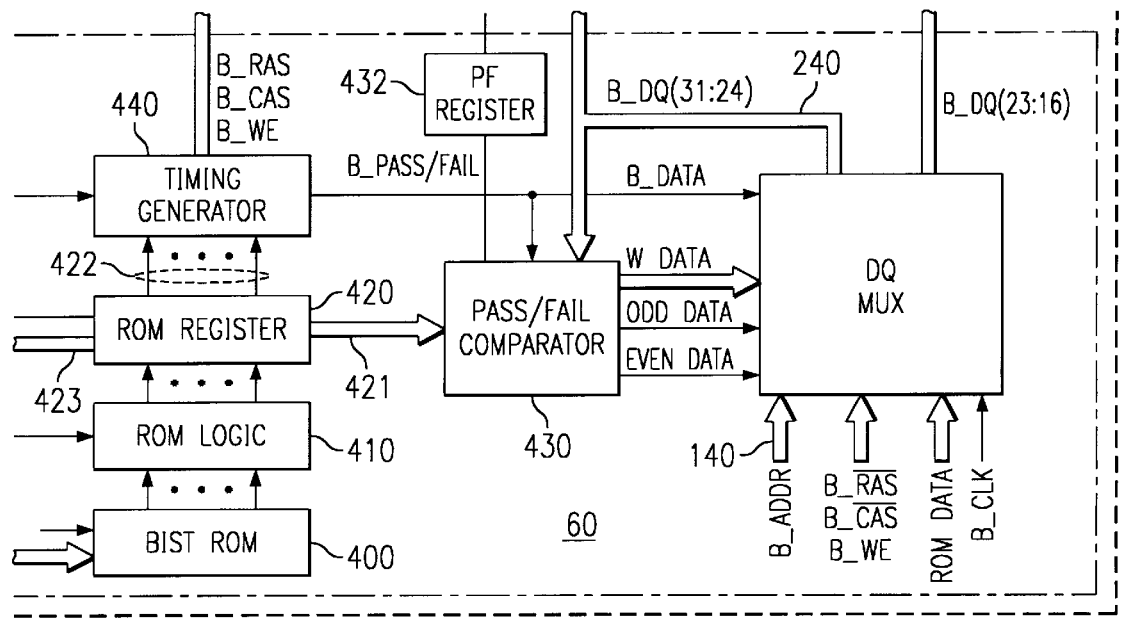
Figure 27:
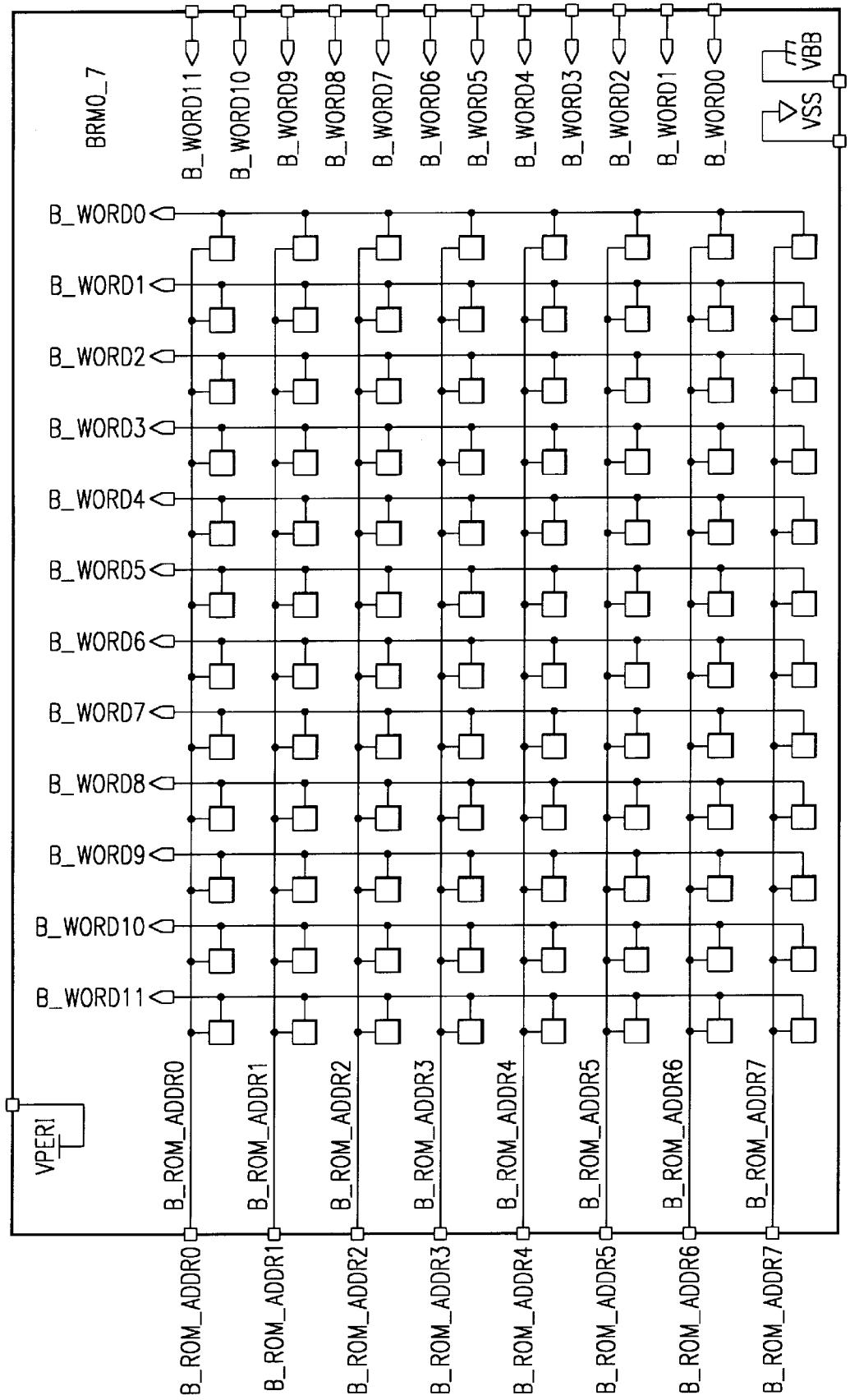
FIG. 27 is a schematic diagram of a BIST ROM for storing test algorithm instructions.
Figure 31A:
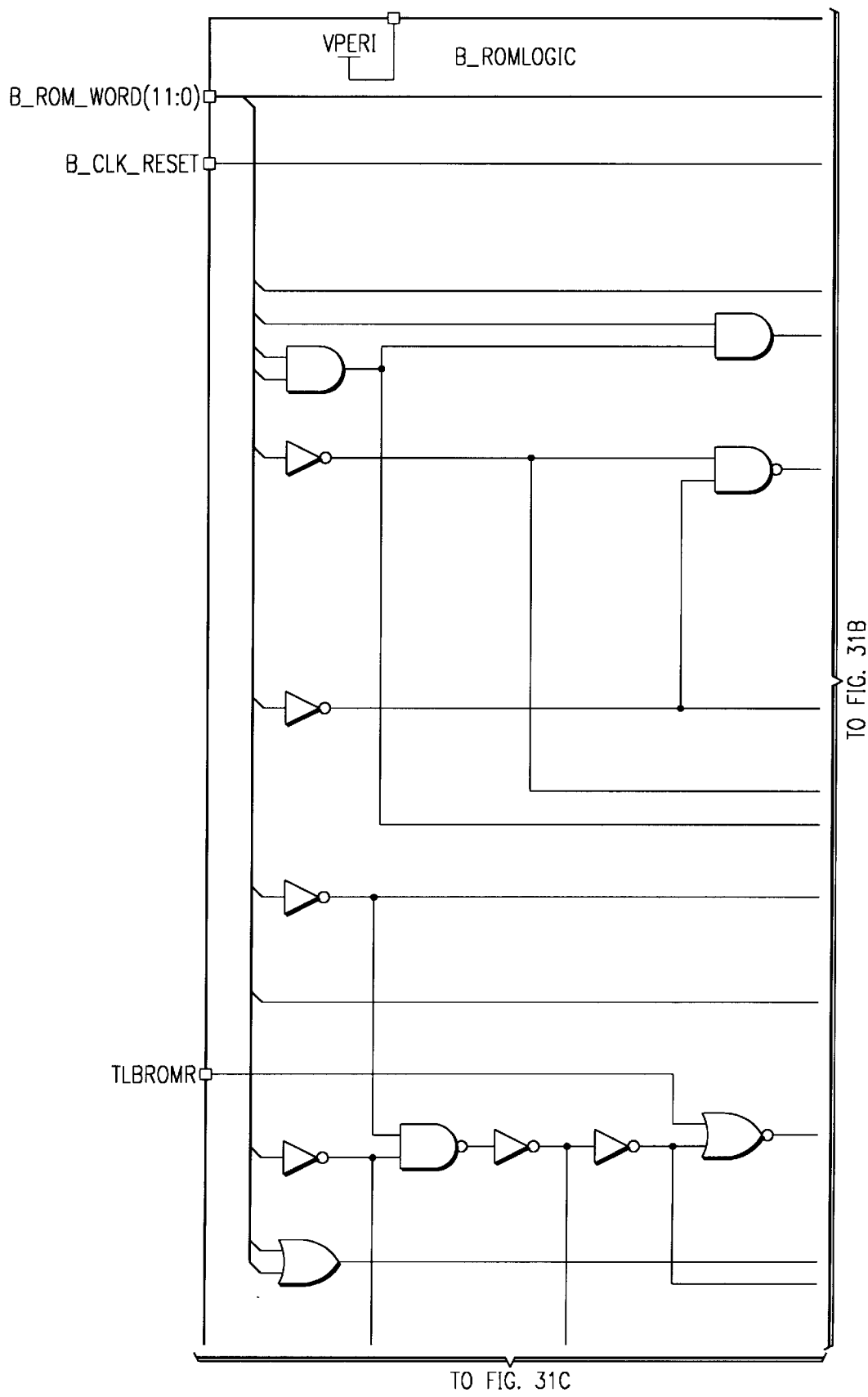
Figure 31B:
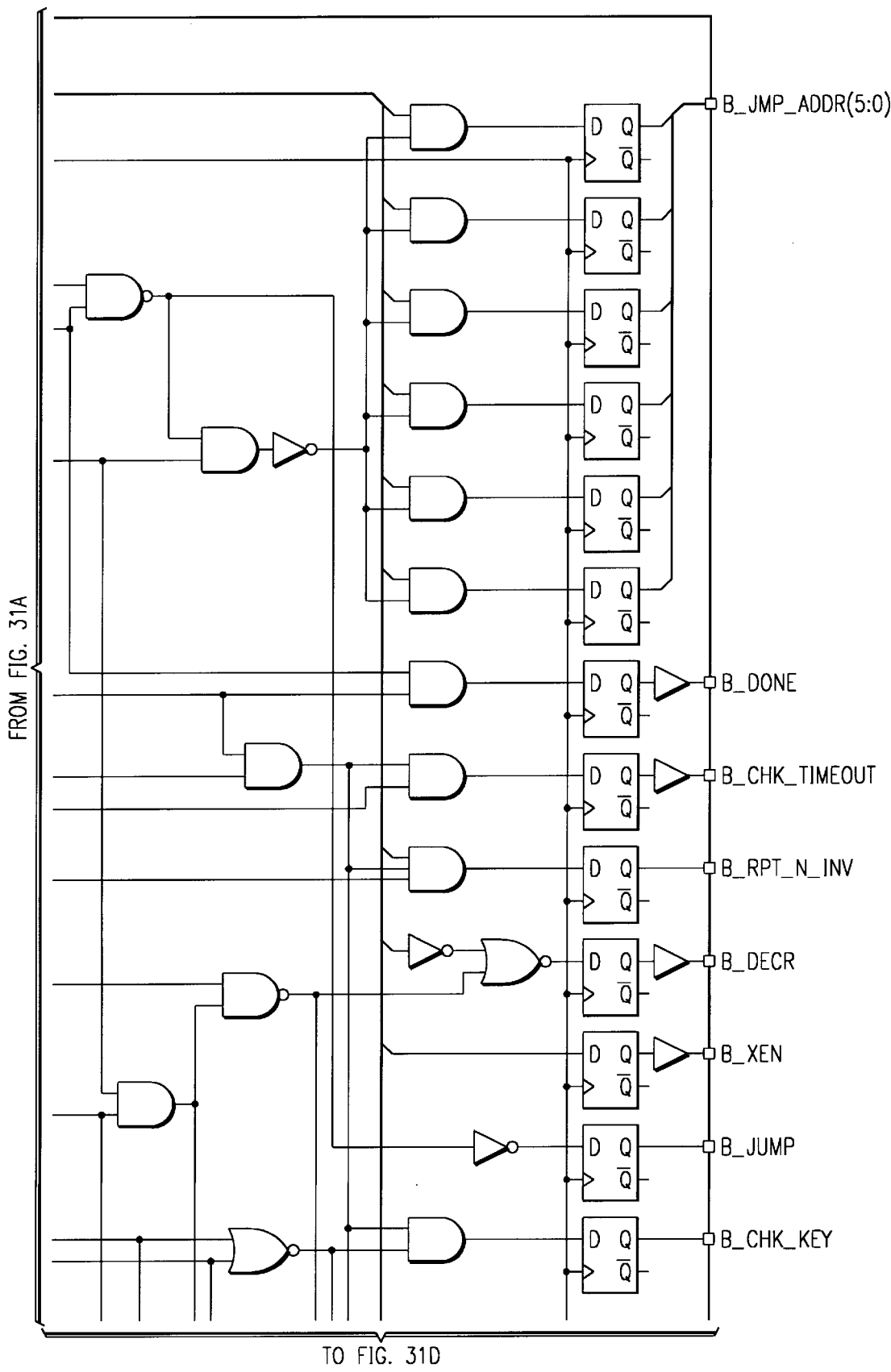
Figure 31C:
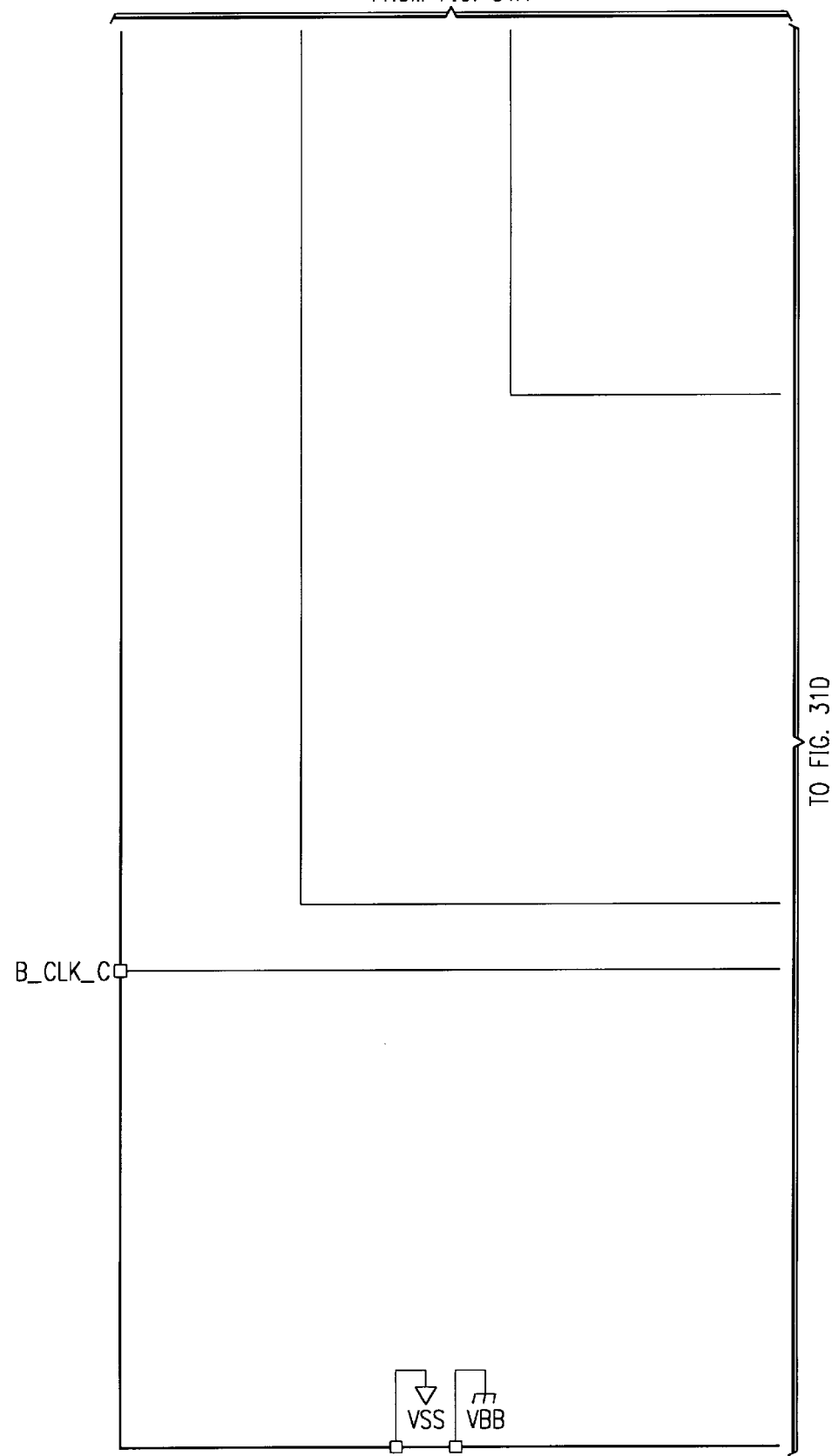
Figure 31D:
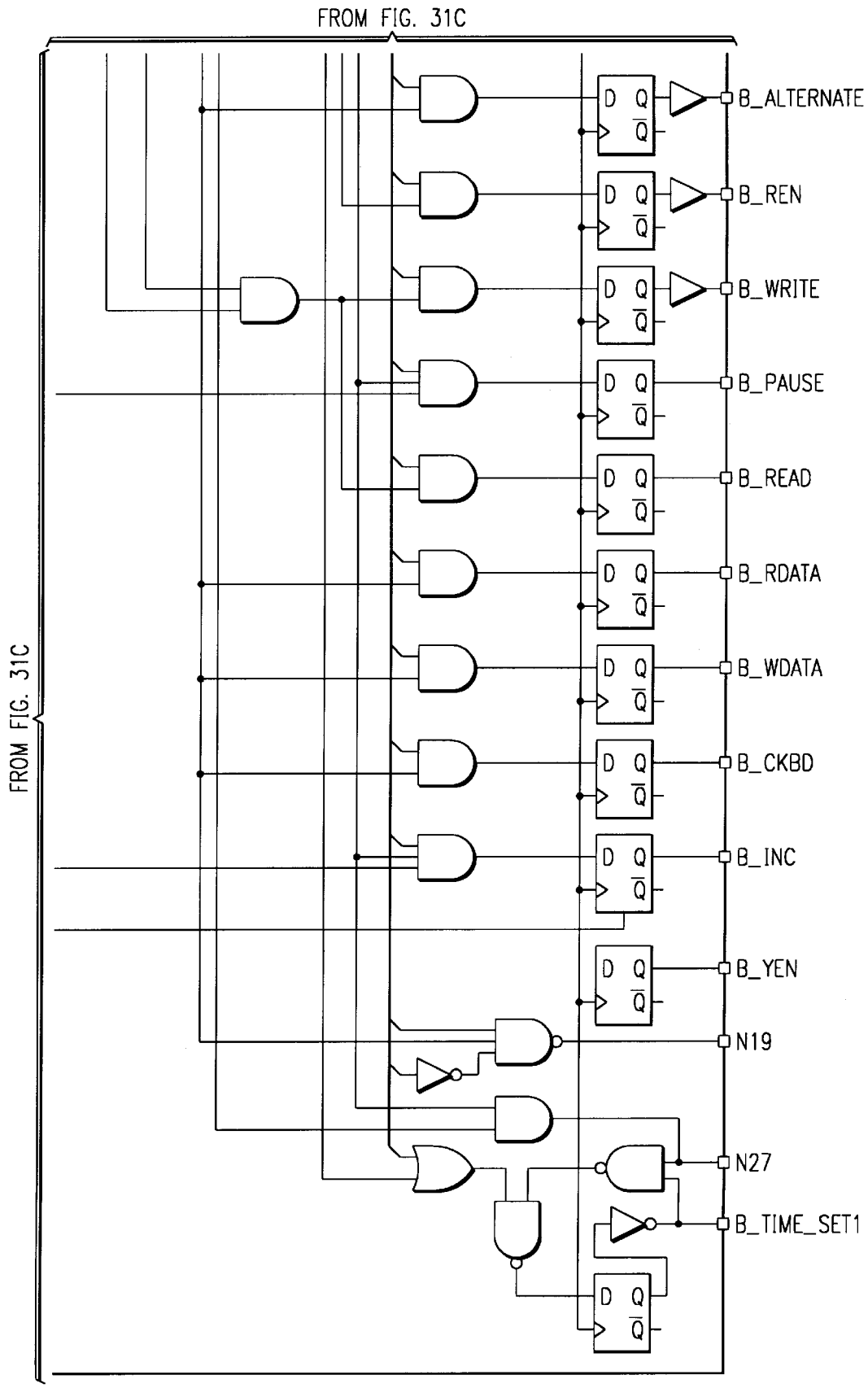

FIG. 27 shows the schemtic layout of an sixty-four word by twelve bit BIST ROM 400 of FIG. 4. The BIST ROM 400 is a sixty-four row read only memory that stores sequences of instructions for controlling several different test routines used to determine the operability of the memory array 220. The proposed BIST scheme has ten algorithms stored in a ROM. Each algorithm is typically made up of a series of instructions. The ten algorithms take up sixty-four ROM words and each Rom word has twelve bits. Each row address applied to the BIST ROM 400, accesses a row of data stored therein in response to a clock signal B_CLK.

The first instruction in an algorithm is an instruction to determine if that test is being enabled. Whether the test is enabled or not is decided at power up when test selection information is loaded into the test enabled register. All or any subset of tests can be selected. A block of test code is skipped if a '0' logical value is loaded in the corresponding tests enabled register.

For most algorithms, the last instruction in an algorithm tests for 'inverted pattern'. In a typical test, two data patterns ('0' and '1') need to be performed. This means each test is executed twice, once for each pattern. This instruction looks at a register to determine if the current test is executing the normal pattern (pattern '0'). If it is, then the program counter will jump to the start of the test and repeat the test with an inverted pattern. If the instruction determines that it is executing an inverted pattern, it will simple increment the program counter by 1 and move on to the next test since both data patterns have already been executed.

Referring now to FIG. 28, there is shown the table of data stored in the BIST ROM 400. In the lefthand column is the list of names of ten algorithms which represent the tests For a program control instruction such as the 'test enable' instruction. The four most significant bits are '0', Bit7 and Bit6 determines the program control type. The last six bits provides the address to be jumped to if indeed the decision is made to jump.

There is an unconditional jump instruction. '110011' for the most significant 6 bits, and the address to jump to for the 6 least significant bits.

The last instruction in the ROM, see FIG. 28, is an idle instruction to signal the end of BIST operation. The last six bits of this instruction holds the revision number of the current 256M.

There are many possible combinations of instructions that can be programmed with the current circuits. If a new algorithm is needed for a BIST operation. It can be included by simply reprogramming the ROM. Combinations of options available to make up an instruction are as follows:

| Timing sets | Access mode | Addressing | Array size | '0' or '1' | Data Pattern |
|---|---|---|---|---|---|
| TSETA | READ | INC | FULLA | PATTERN0 | CKBD |
| TSETB | WRITE | DEC | ROW | PATTERN1 | ALTERNATE |
| TSETC | RMW | | COL | | | which may be selected to be run plus an instruction that all tests have been completed.

The first algorithm GROSS is for running a gross test. There are four rows of data, each representing one instruction for the gross test. Addresses for the instructions are shown in hexadecimal code in the second column from the left. The righthand column presents the mnemonic name for each instruction. The main block of the table presents the data which is stored in the BIST ROM 400. There are twelve columns of data in the table. In the table, there is a bold horizontal line setting off the beginning and ending addresses of each algorithm. Thus there is a bold line below the address hex 3 which is the fourth instruction in the algorithm GROSS.

The four instructions in the algorithm GROSS are jump not test enable (jnte) to pause, write all cells zero, read all cells with expected data zero, and invert data and jump if not previously inverted (divnj). The Z1 is the label at which to jump.

Referring now to FIG. 29, there are two major types of instructions. The first type is the program control instruction. This type of instruction deals with the flow of the program. The program control instruction are introduced to control BIST operation. The second type is the array access instruction which control how the cells of the array are to be accessed and written to and/or read from. They are basically the same type of instruction usually found on a tester which are translated into BIST ROM format. An instruction that reads back a pattern from the array (220) is an example of a array access instruction.

The instruction is divided into two parts. The first six bits of an instruction defines the actions to be taken and the last six bits is the data associated with the instruction.

For an array access instruction such as read whole array, the first six bits define the type of array access, whether it is a write or a read or both, whether the full array, only the rows, or the columns are accessed. To read from the whole array, Read (bit11), X(bit9) and Y(bit8) are set to 1. The last six bits of the instruction provides information on how the whole array is read including the timing sets to be used (Tset0, Tset1), the data values (ED) and pattern ( ) and whether the address is to be incremented or decremented.

Referring now to FIGS. 30 and 31, there is shown logic schematics for a ROM logic circuit 410. As each of the instructions is read out of the BIST ROM 400, the data is applied to the input of the ROM logic circuit 410, which is a combinational logic circuit that decodes the twelve bits of data of each instruction word. Output signals from the ROM logic circuit 410 are applied to the data inputs of a ROM register circuit 420 where the data are stored for the duration required to complete execution of the instruction.

When the built-in self-test arrangement 60 is put into the active self-test mode, the BIST program counter 360 is reset. This initial state of the program counter 360 is decoded through BIST ROM address decoder 370 to produce a row address signal for the BIST ROM 400. After the row address is applied and in response to a clock signal, the data from the selected row of the BIST ROM 400 is read out. All of the data read out from the selected row is applied to the input of the ROM logic circuit 410.

FIGS. 30 and 31 present an exemplary logic schematic diagram of the ROM logic circuit 410 that performs desired combinational logic functions on the row of data applied from the selected row of the BIST ROM 400. The circuit 410 produces a group of output signals resulting from logical processing through the circuit 410. This group of output signals from the circuit are applied in parallel to and are stored in the ROM register 420, which is arranged to forward them by way of a BIST data bus 421 to the pass/fail comparator circuit 430, by way of a group of leads 422 to the BIST timing generator 440, and by way of a program counter input bus 423 to the BIST program counter 360.

Referring now to FIG. 31, there is shown a logic schematic of an exemplary ROM register circuit 420. The data applied onto the program counter input bus 423 is accepted by the program counter 360 only when a program control instruction is being executed. Data applied to the BIST timing generator controls generation of self-test signals, such as B_RAS_, B_CAS_ and B_WE_, which perform the functions of their similarly named control signals RAS_, CAS_, and WE_, used by a microprocessor to access the memory during normal operation. Signals, applied by way of the BIST data bus 421 to the pass/fail comparator circuit 430, include memory access instructions and a data bit.

Figure 44:
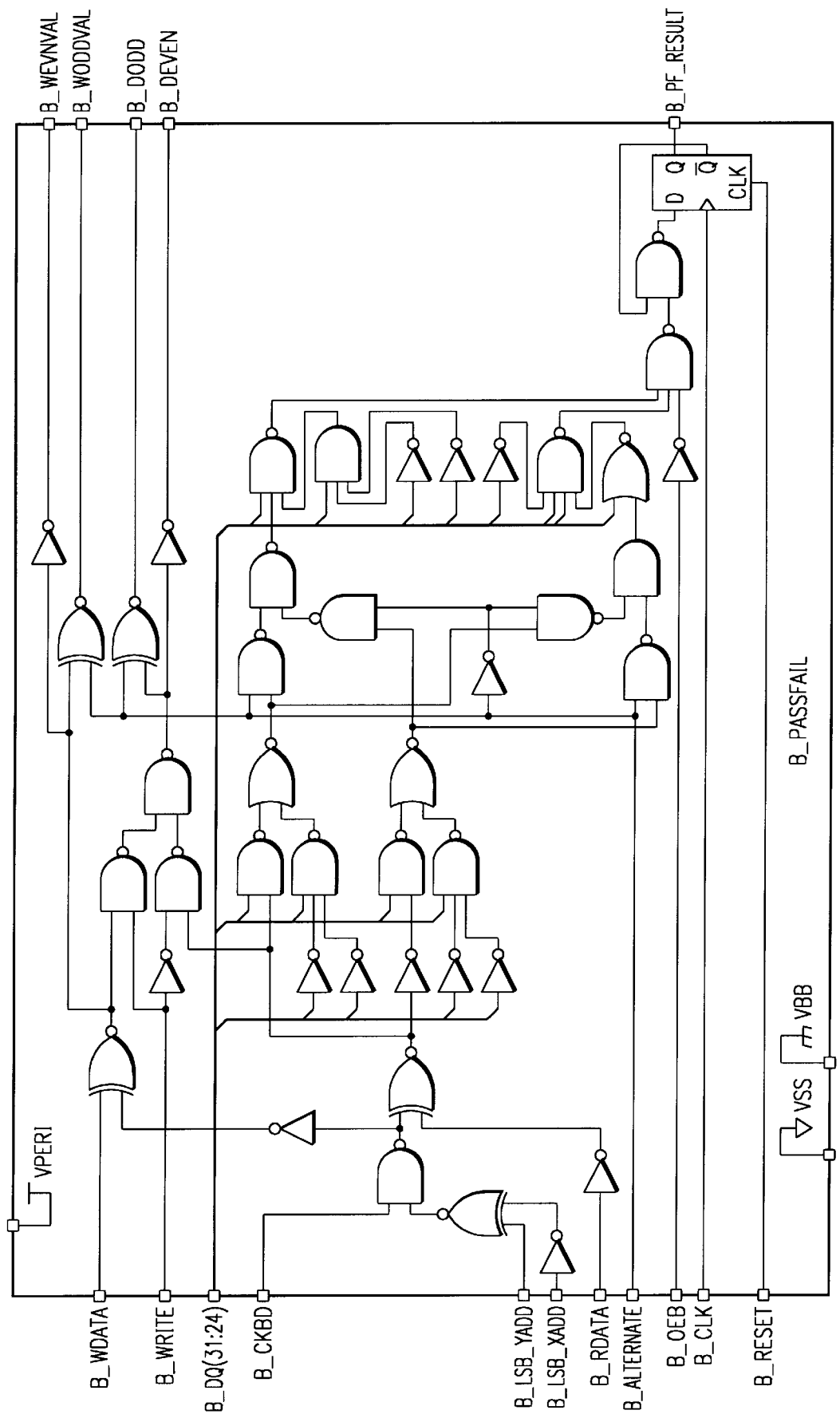
FIG. 44 shows a schematic of Pass Fail detection circuitry.
Figure 45A:
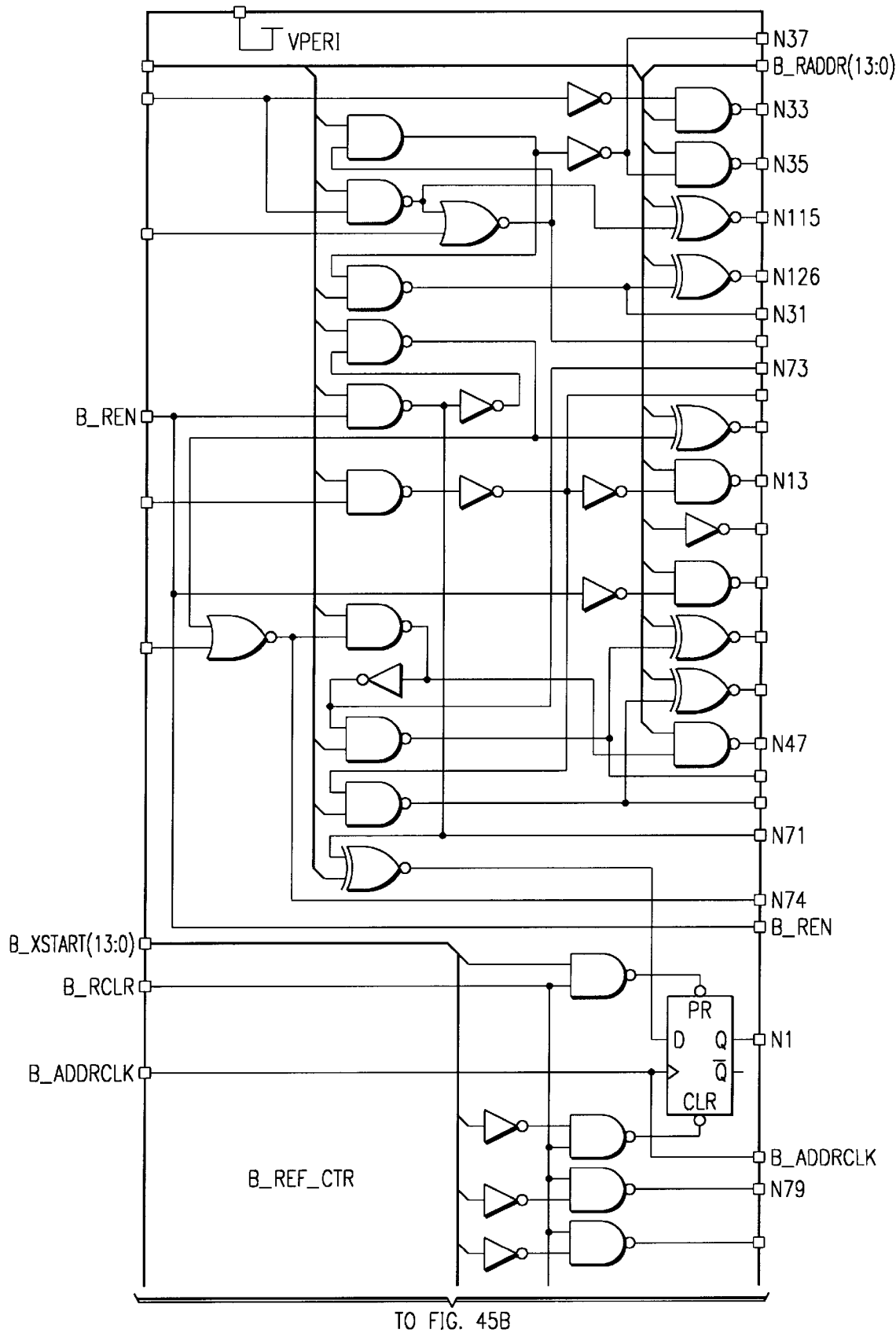
FIG. 45 shows a schematic of the Refresh Counter.
Figure 45B:
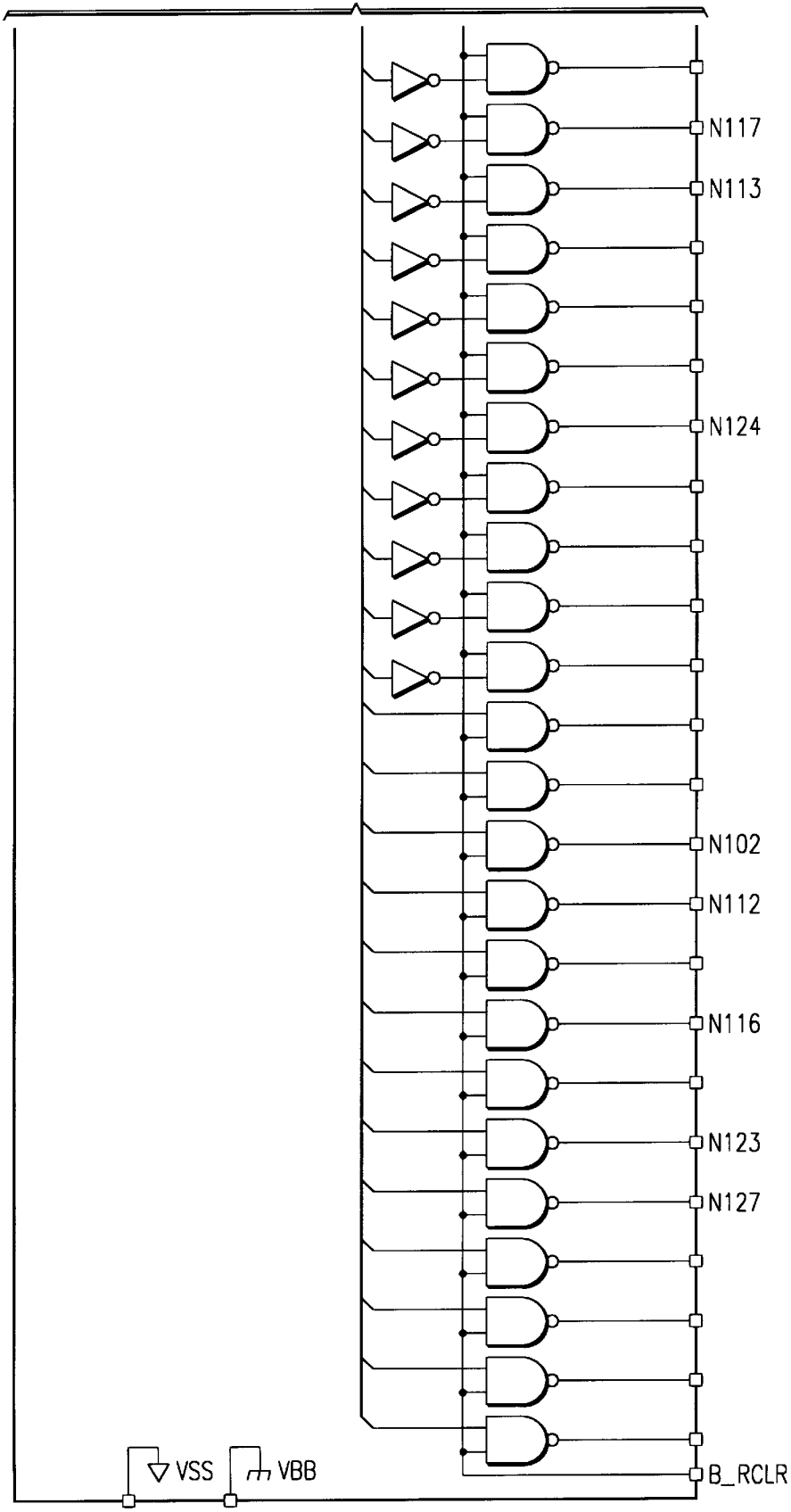
Figure 46A:
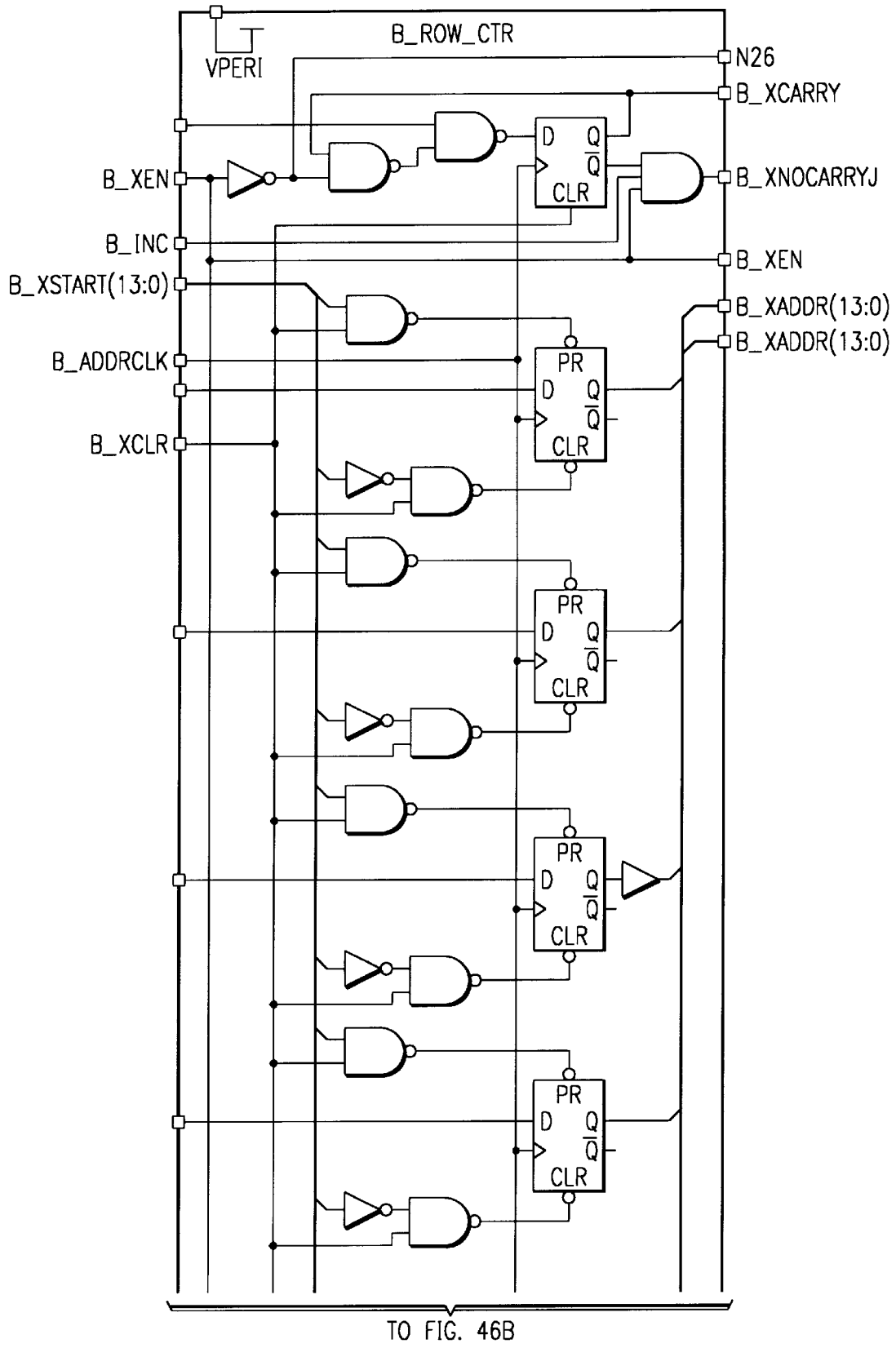
FIG. 46 shows a schematic of the Row Counter.
Figure 46B:
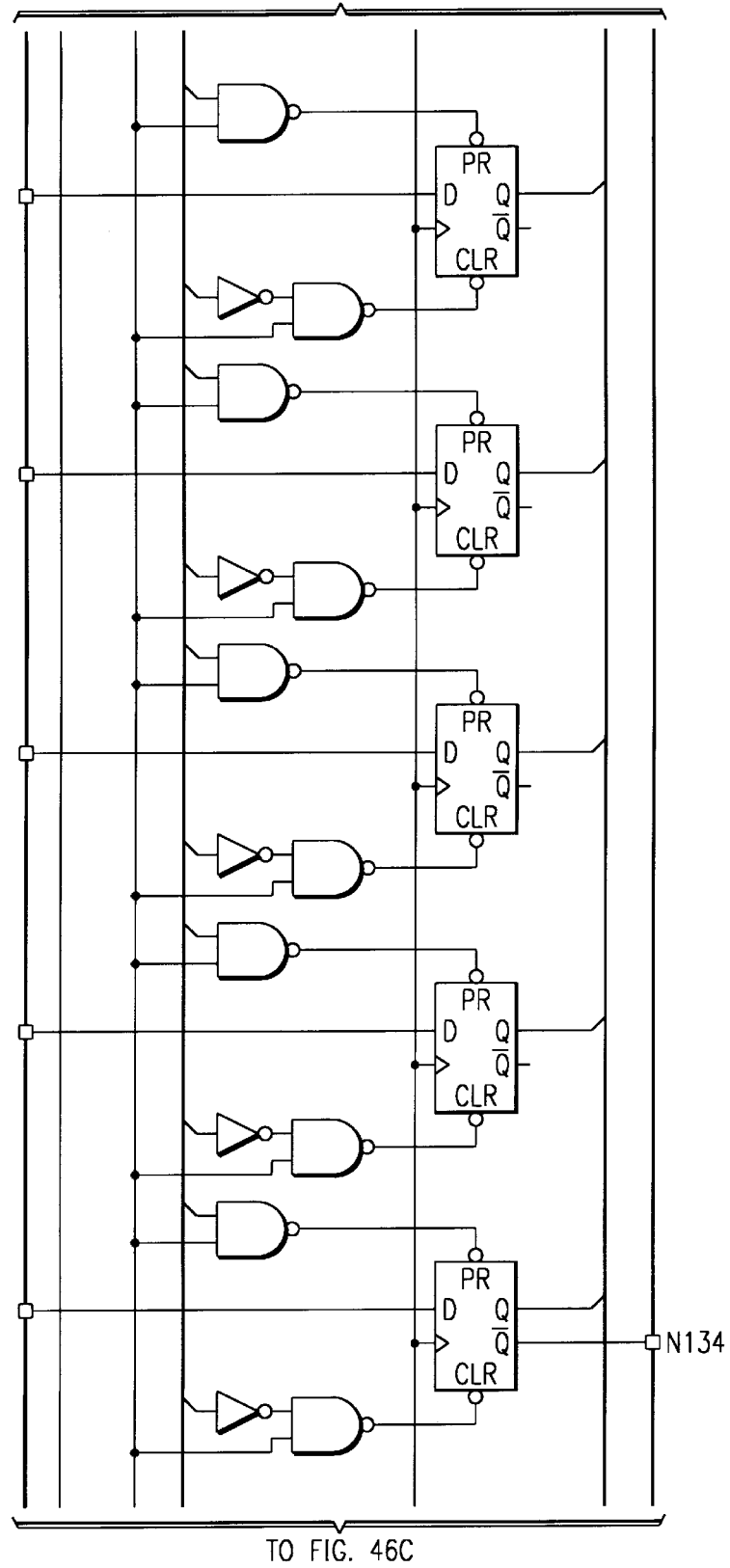
Figure 46C:
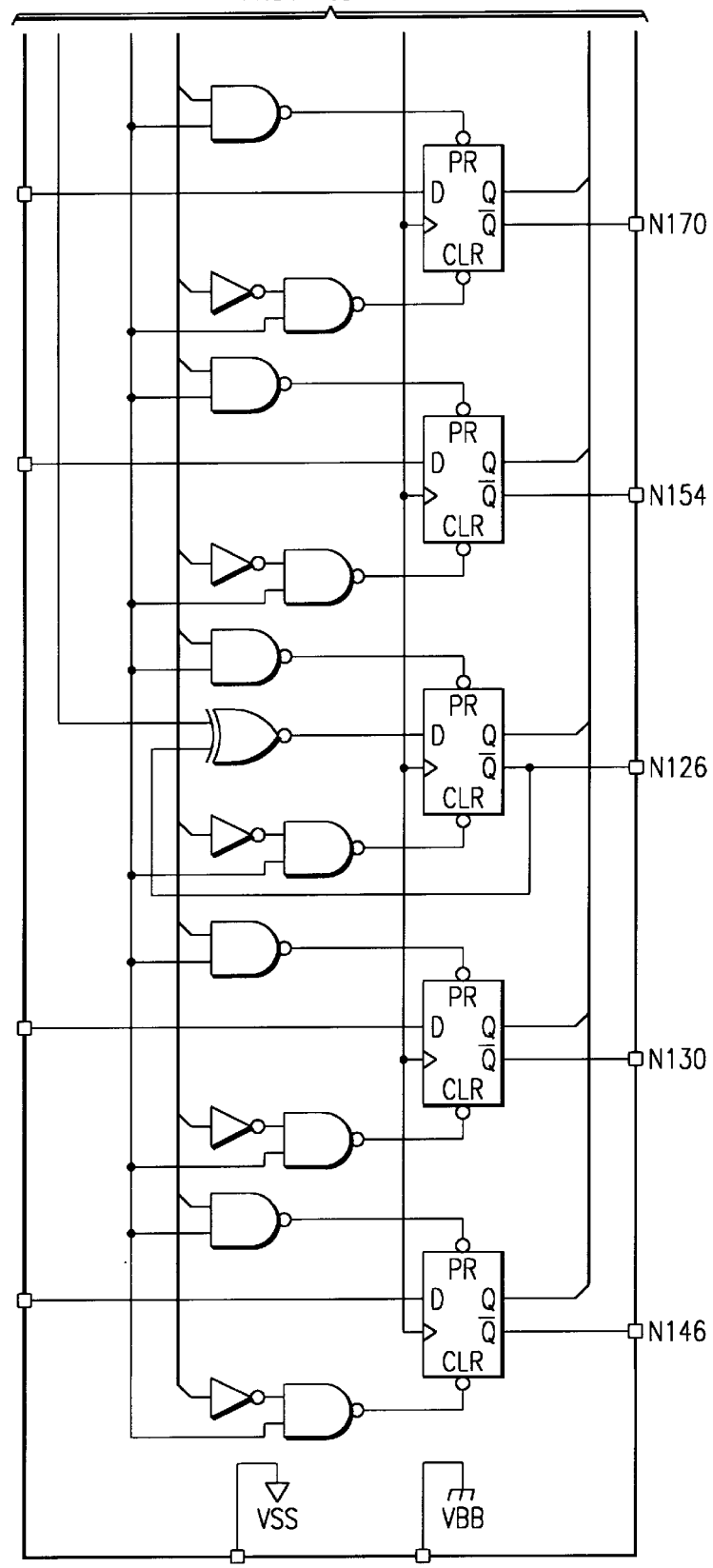

FIG. 44 presents the logic schematic diagram of an exemplary pass/fail circuit 430 that can be used in the built-in self-test arrangement 60. The pass/fail circuit 430 is responsive to control signals and a data bit received by way of the BIST data bus 421 from the ROM register 420 to produce a sequence of groups of data signals to be written into at least one bank of the memory array 220 in response to a write instruction from the BIST ROM 400. Pass/fail circuit 430 also receives control signals and a data bit by way of the BIST data bus 421 and read out data on a DQ bus 431 from the memory array 60, in response to a read instruction. In this instance, the data bit from the BIST data bus 421 is processed to agree with the state of a prior-existing data bit that was written into the array location/locations from which the data on the DQ bus 431 is read. The processed data bit is referred to as an expected data bit. This expected data bit is compared with the data read from the memory array 60 and the result of the comparison is a Pass signal if the compared data are equal and is a Fail signal if the compared data are not equal. The Pass signal, indicating that the circuits traversed by the written in and read out data and the storage cell are operating correctly, is a low level signal. A Fail signal, indicating that some part of the circuits traversed by the written in and read out data or the storage cell is malfunctioning, is a high level signal.

A Fail signal is transmitted by way of a lead B_Pass/Fail to a PF register 432 where it is stored. Subsequently the stored Fail signal can be conveyed through a DQ buffer circuit 230 to an external pad of the memory device. PF register 432 is reset upon entry of the active self-test mode. Pass signals are ignored and in effect discarded because they are a low level and the PF register is reset to begin the test operation. An assumption is made that the device is operable. So a single test failure is the only information of importance to be retained.

Referring to FIG. 32, a VHDL language description of the Pass/Fail comparator is shown. VHDL language is a standard language for describing logic circuits used by designers today. Using signal CKBDI for checker board data, B_ALTERNATE for alternate data, B_RDATA for expected data (ED) and B_WDATA for write data (DAT), the data which is expected to write and to compare the read data is calculated. The read data is compared to the calculated expected data to determine if the test passed or failed.

Figure 33:
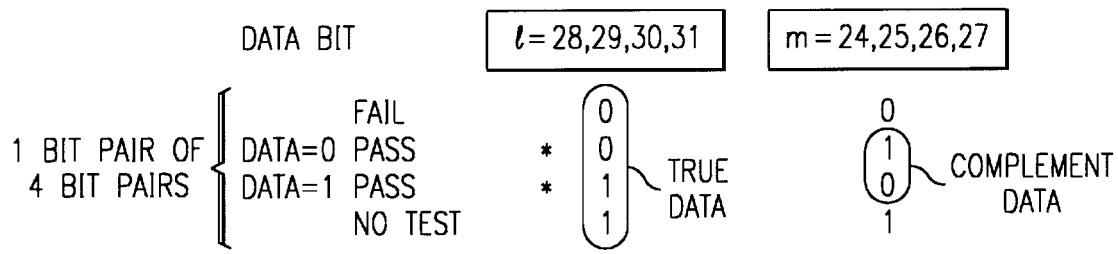
FIG. 33 is a truth table and definitions.
Figure 33A:
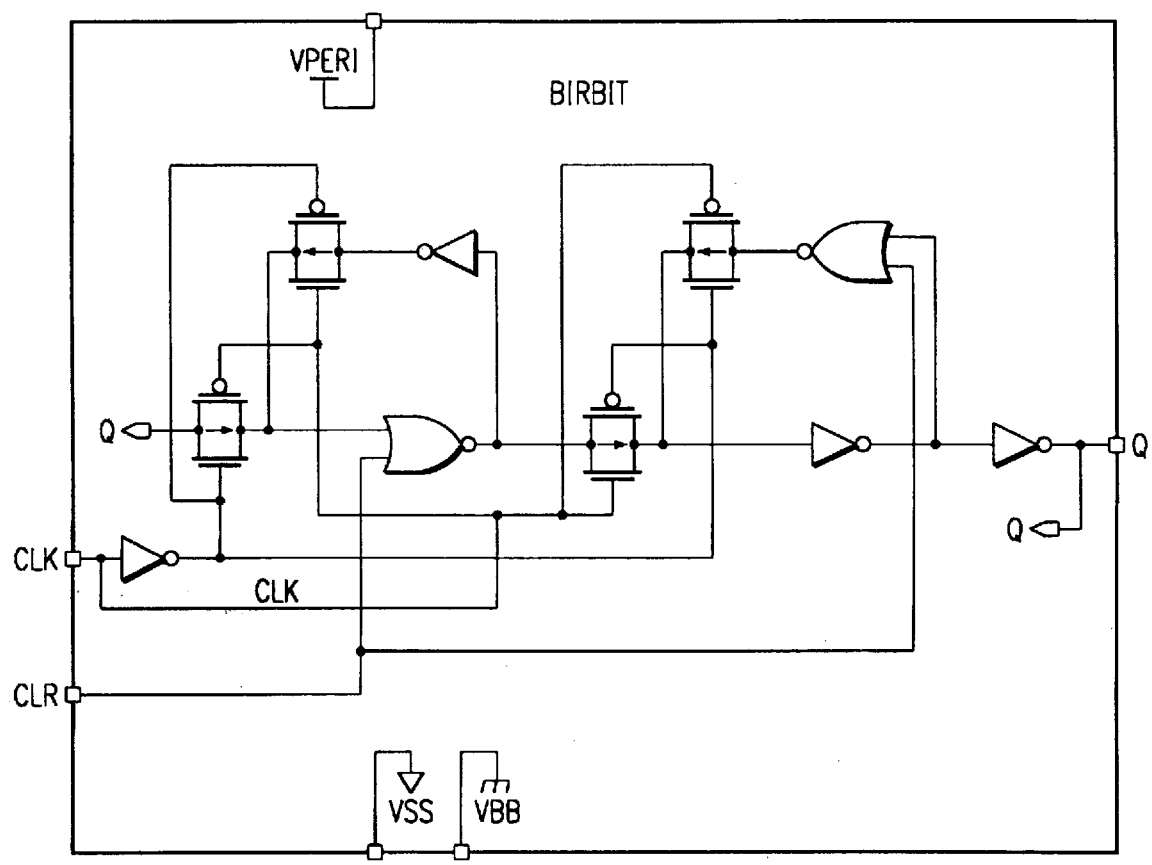
FIG. 33a shows a schematic of the Bist Internal Refresh Bit.

Referring to FIG. 33, the functional table is given. The 32 bits of the array 220 compressed to 4 data bits using 8 DQ lines. The compression table is shown in FIG. 33. B_PF_ results gives the pass or fail depending on the corresponding values shown in the table.

Build In Self Test (BIST)
10.00 Overview of BIST

Figure 51A:
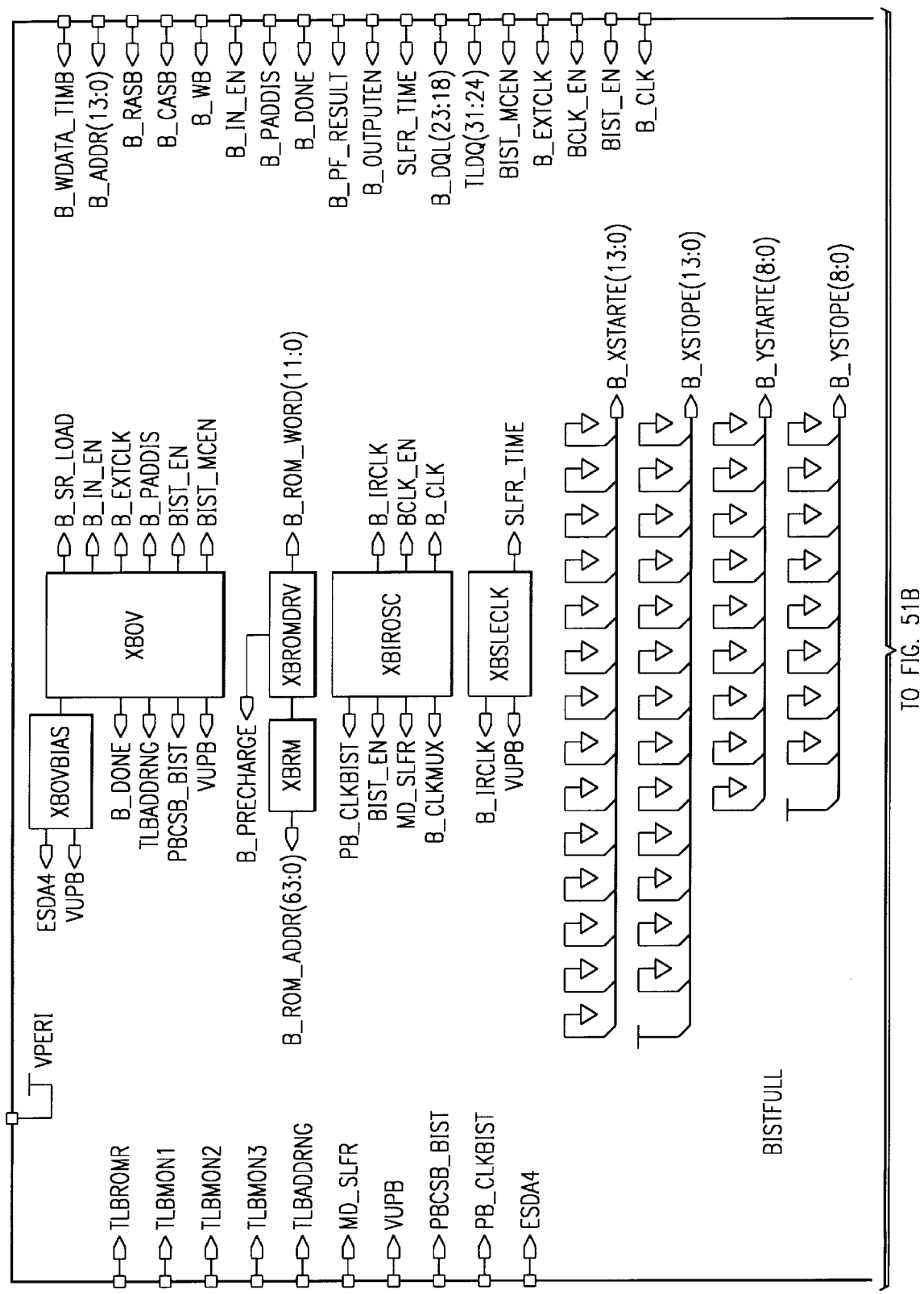
FIG. 51 shows a schematic of the full BIST logic.
Figure 51B:
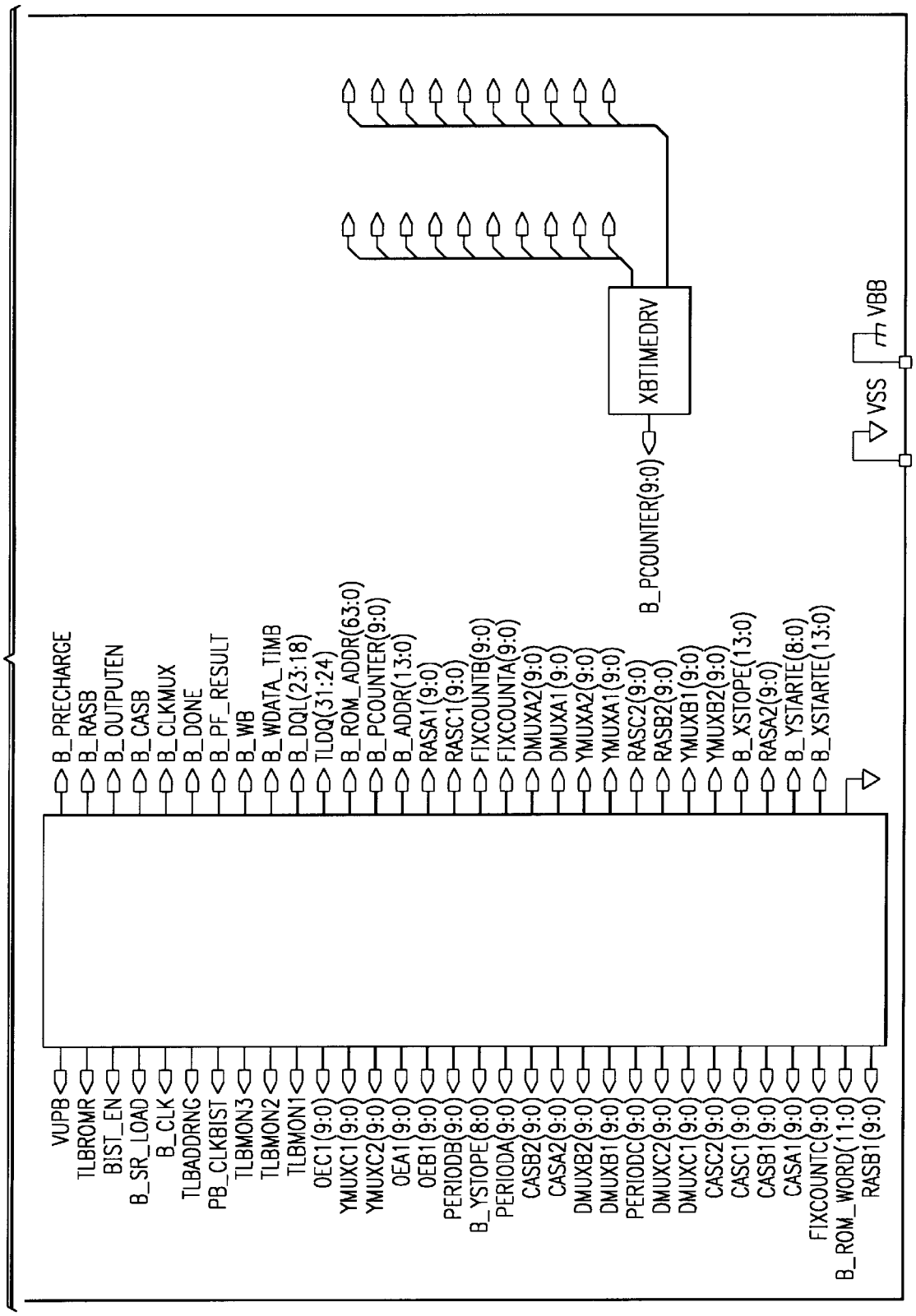
Figure 52A:
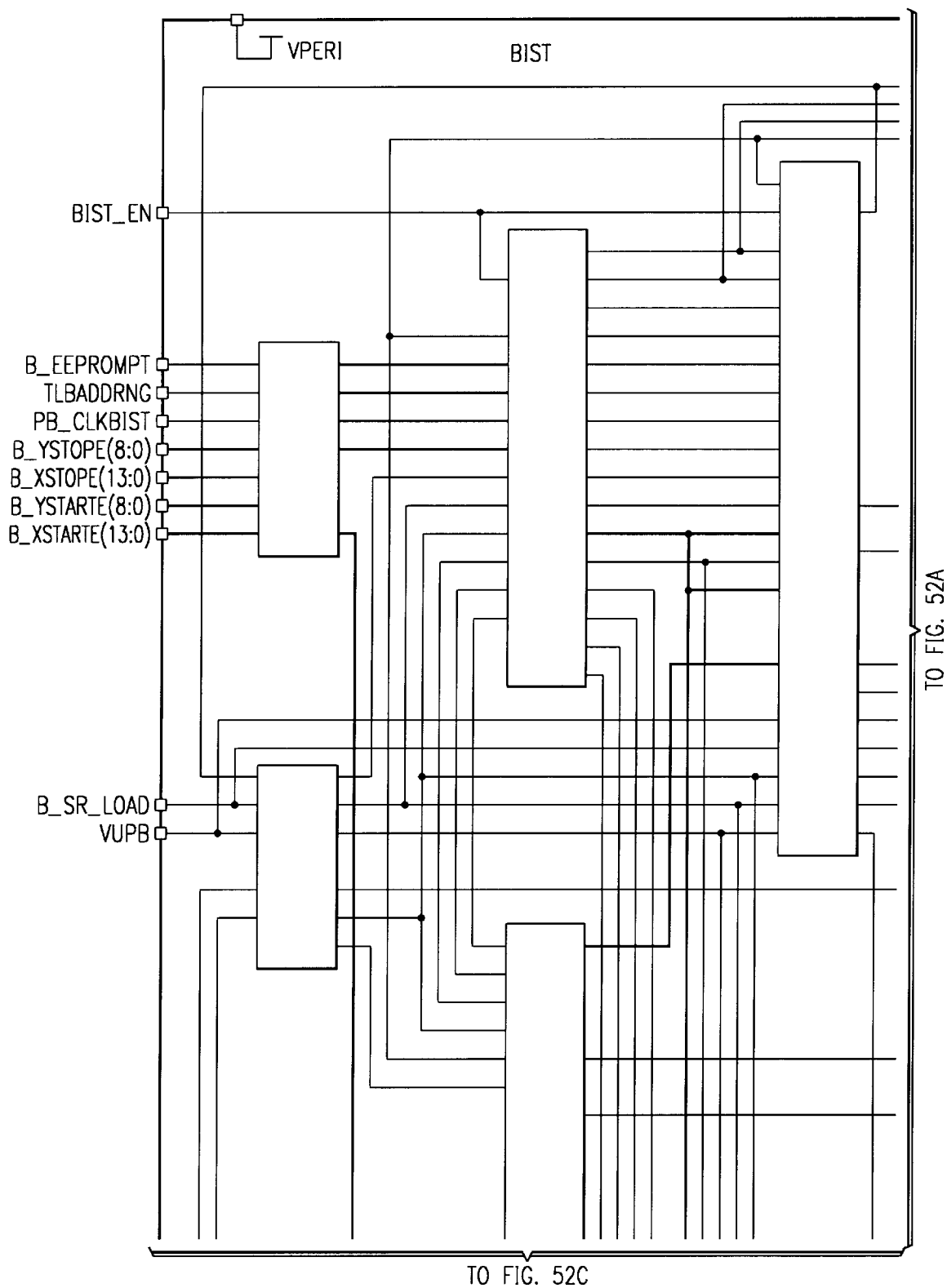
FIG. 52 shows a schematic of the full BIST functional logic.
Figure 52B:
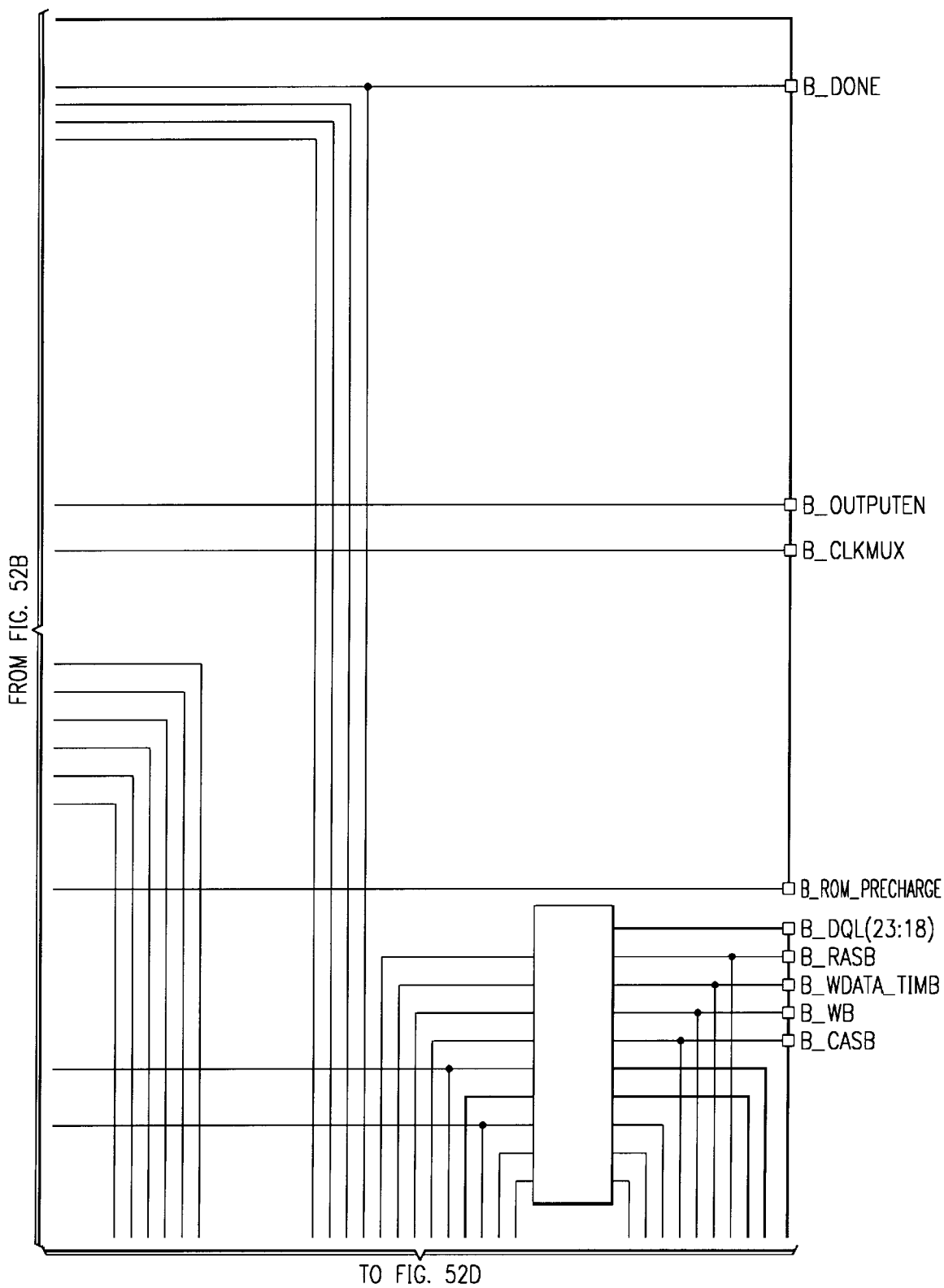
Figure 52C:
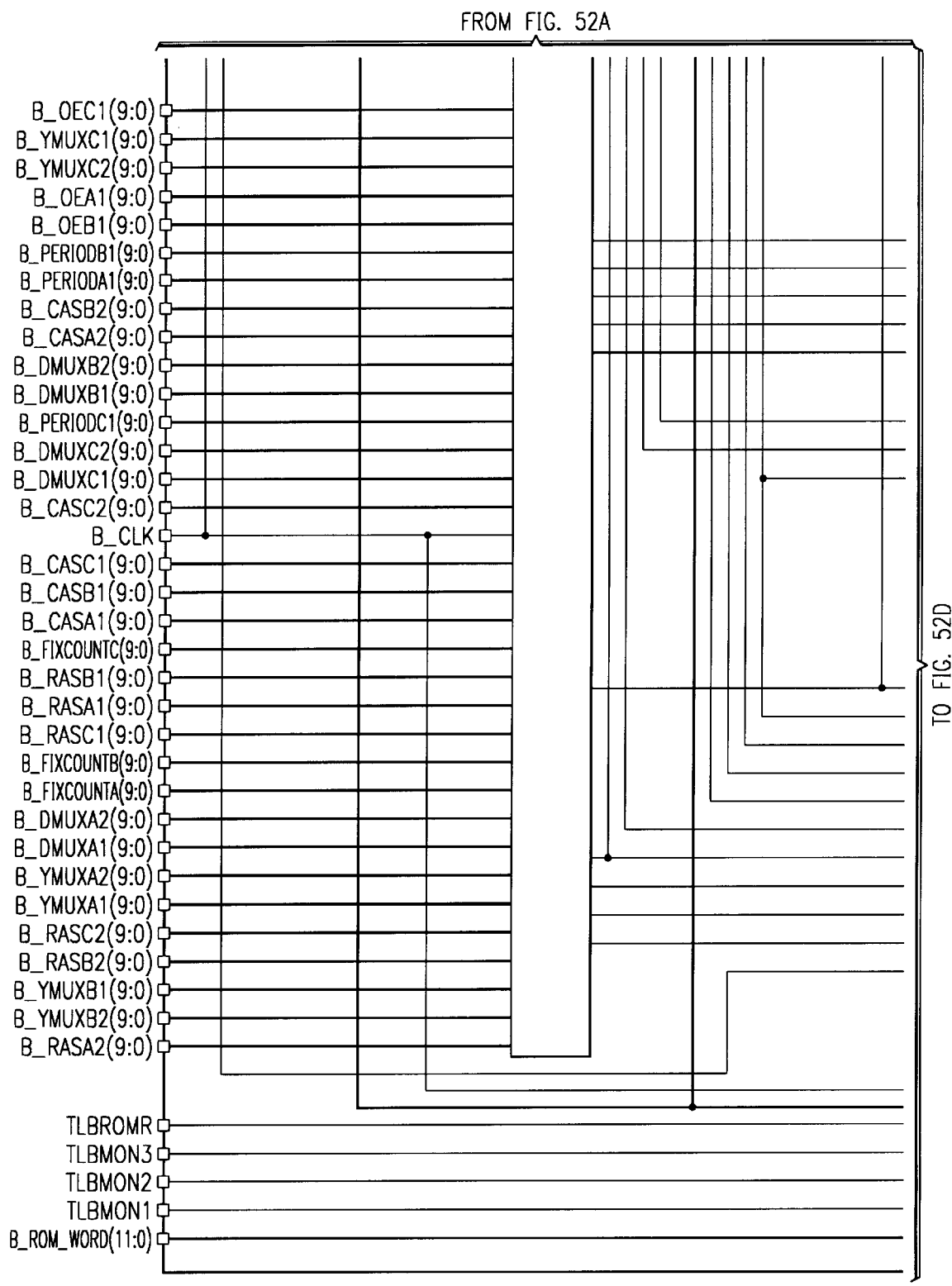
Figure 52D:
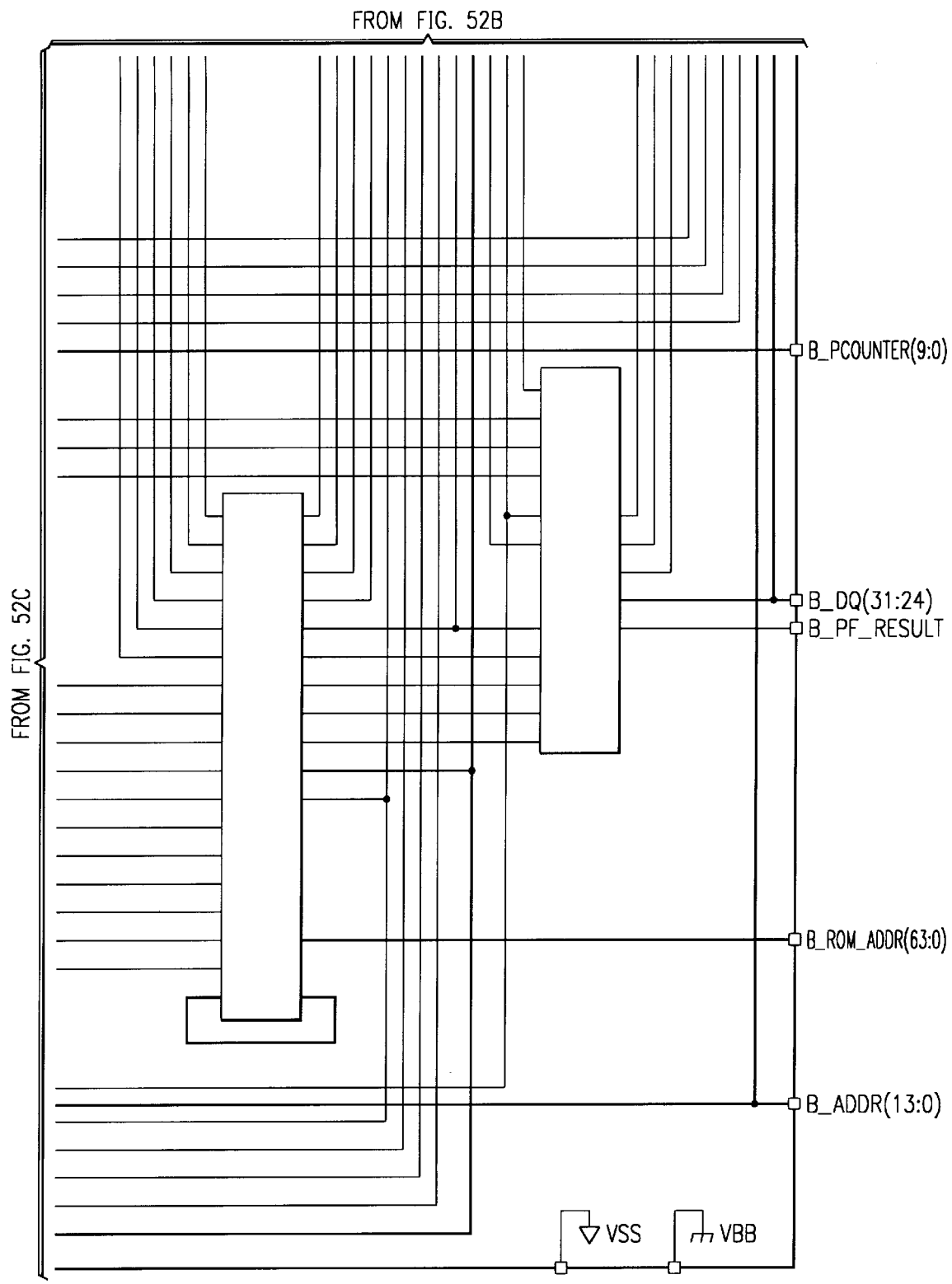
Figure 53:
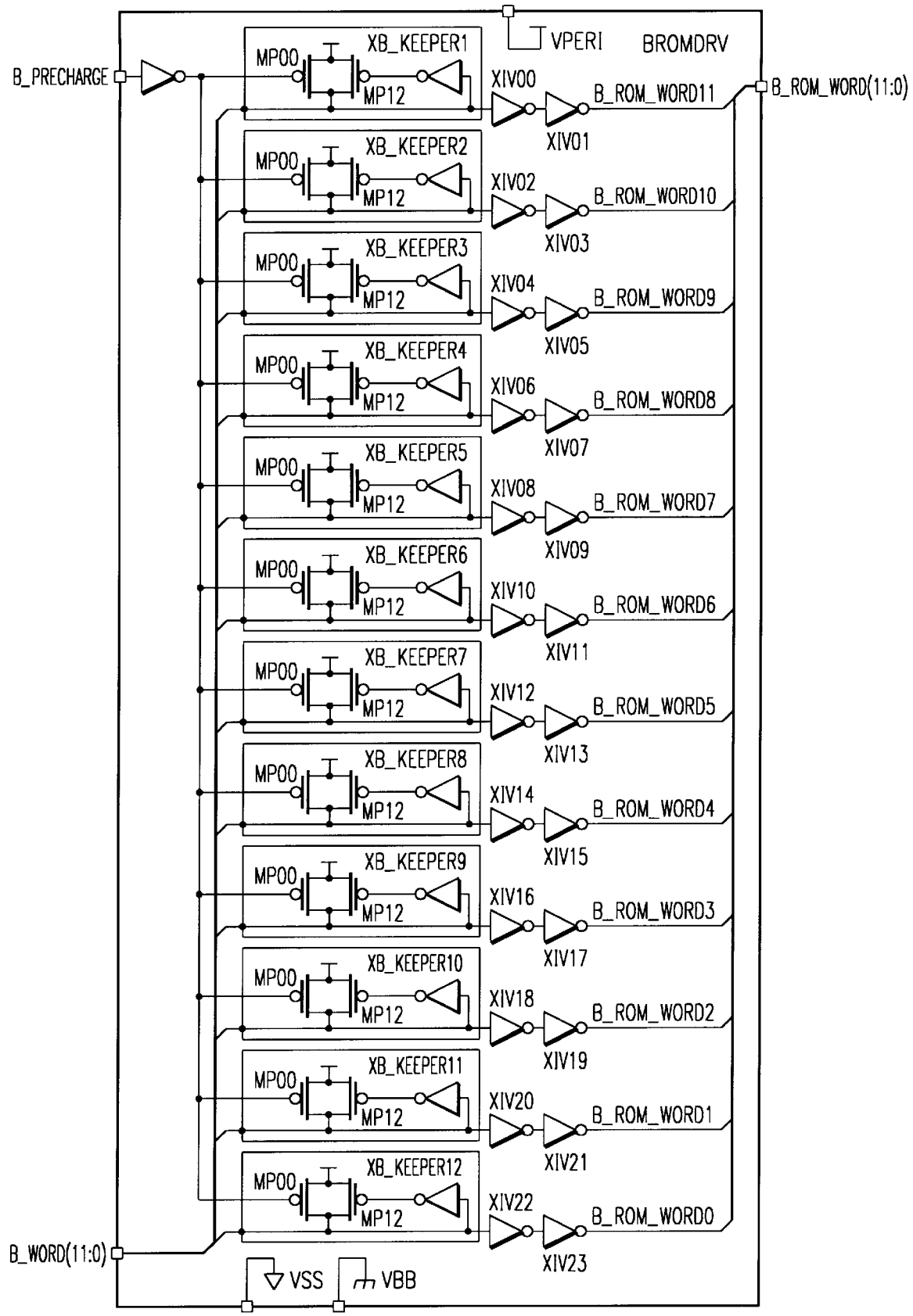
FIG. 53 shows a schematic of the ROM Driver logic.
Figure 54:
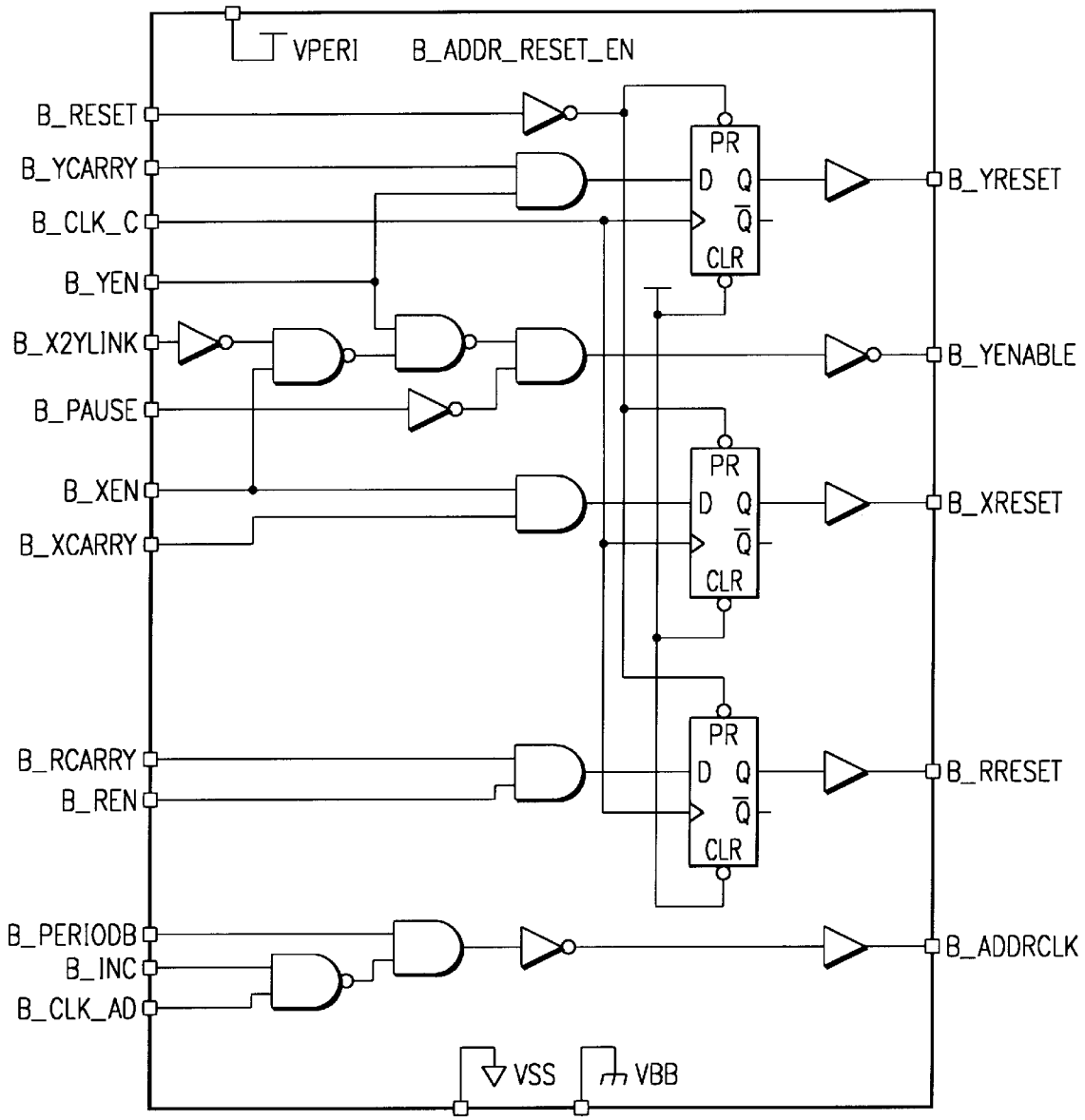
FIG. 54 shows a schematic of the Address Reset Enable.
Figure 55A:
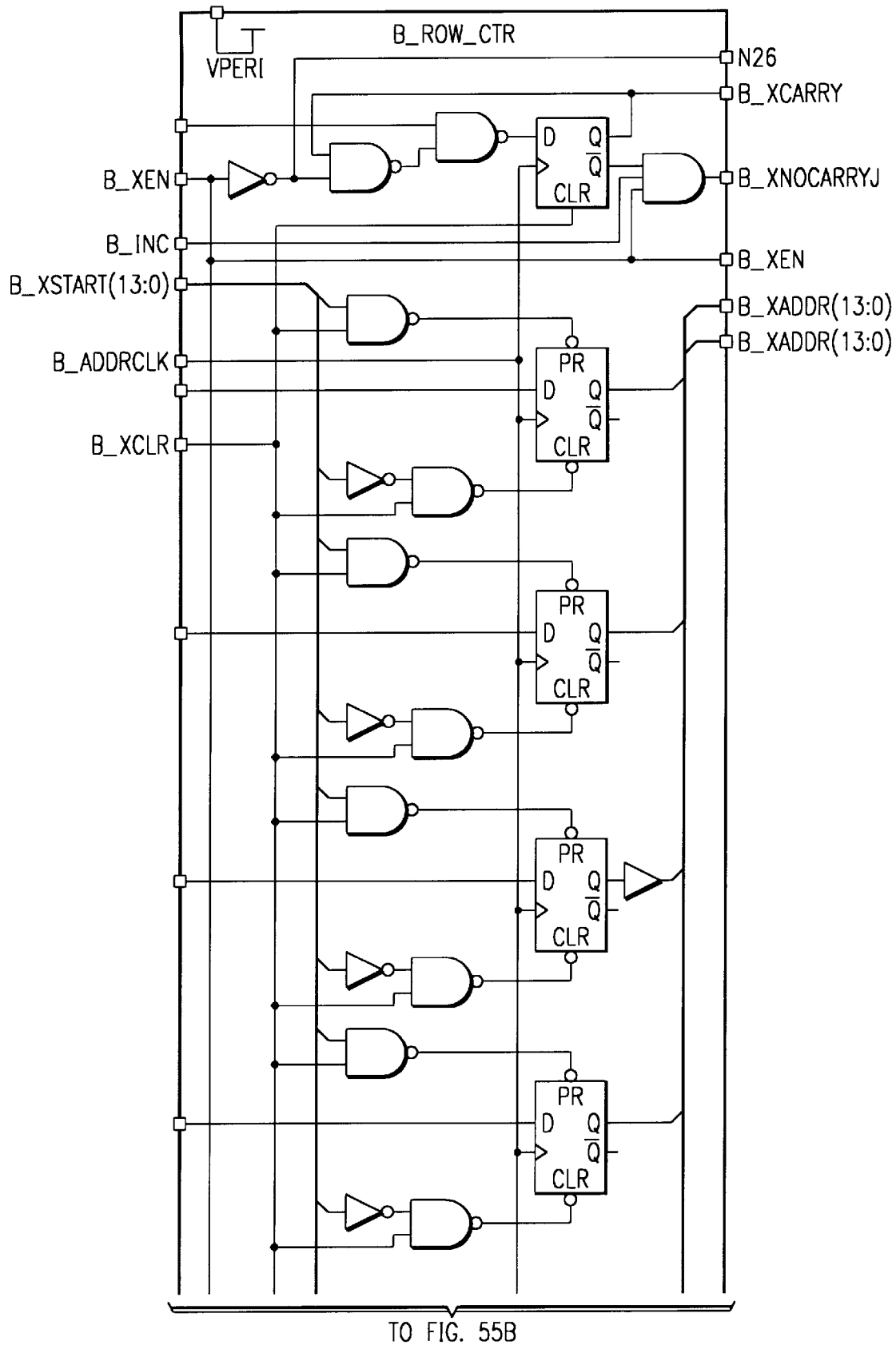
FIG. 55 shows a schematic of the Row Counter.
Figure 55B:
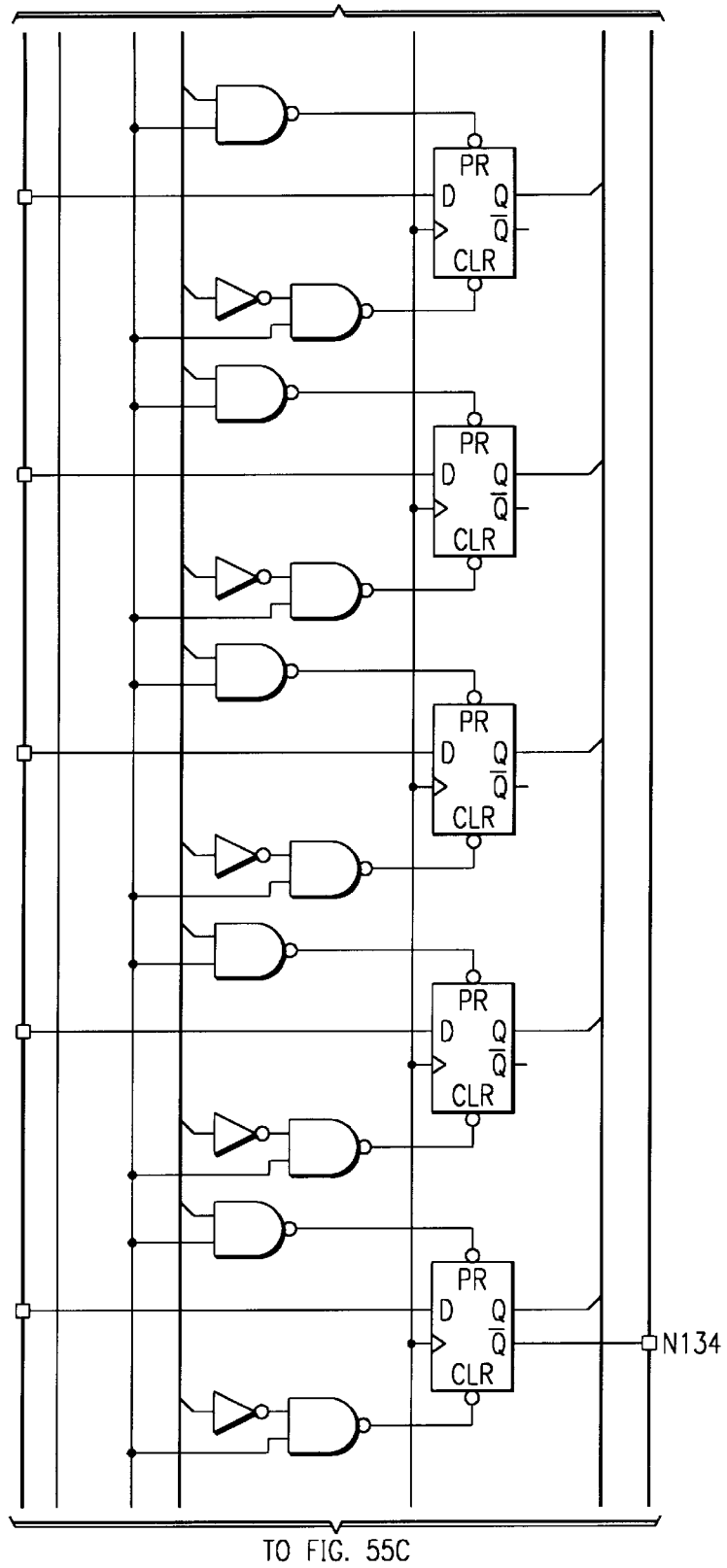
Figure 55C:
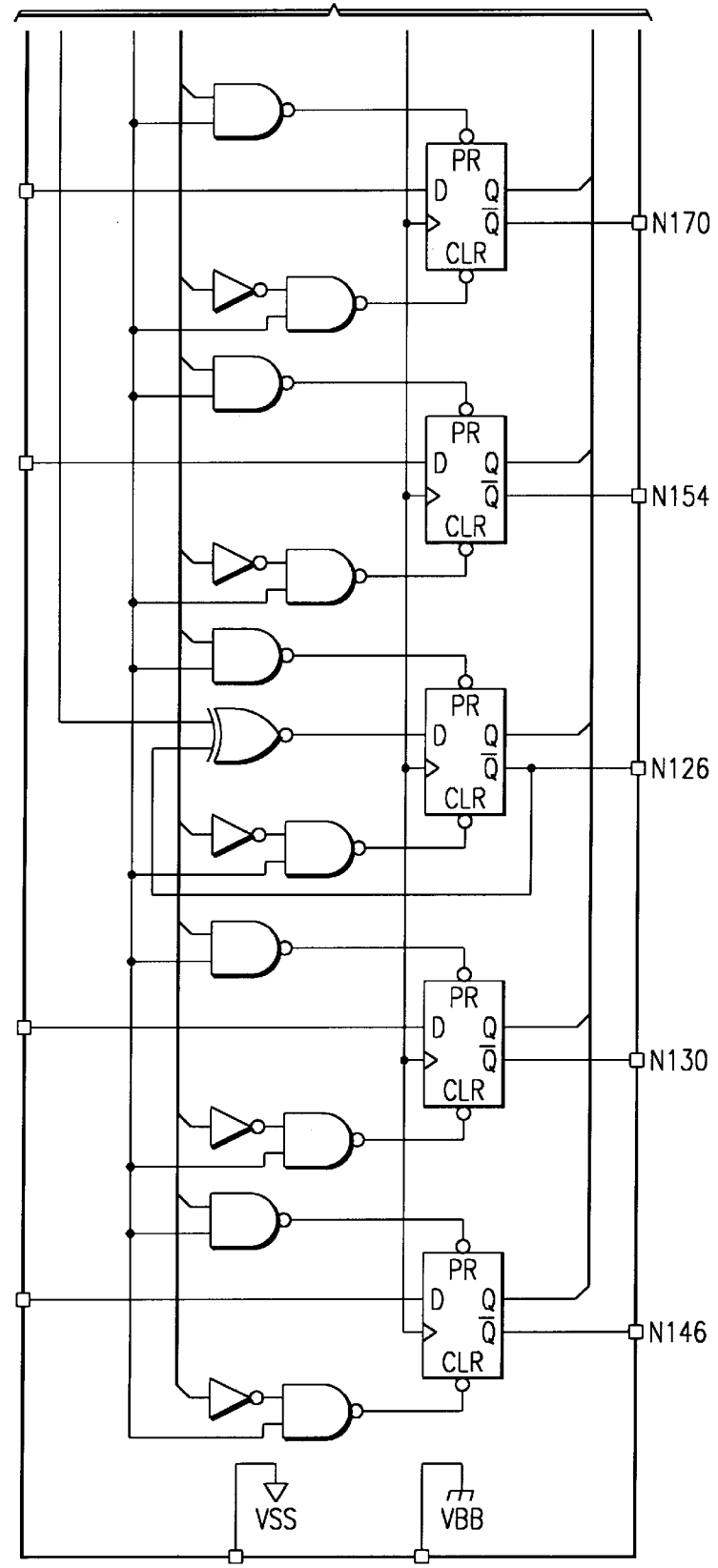
Figure 56A:
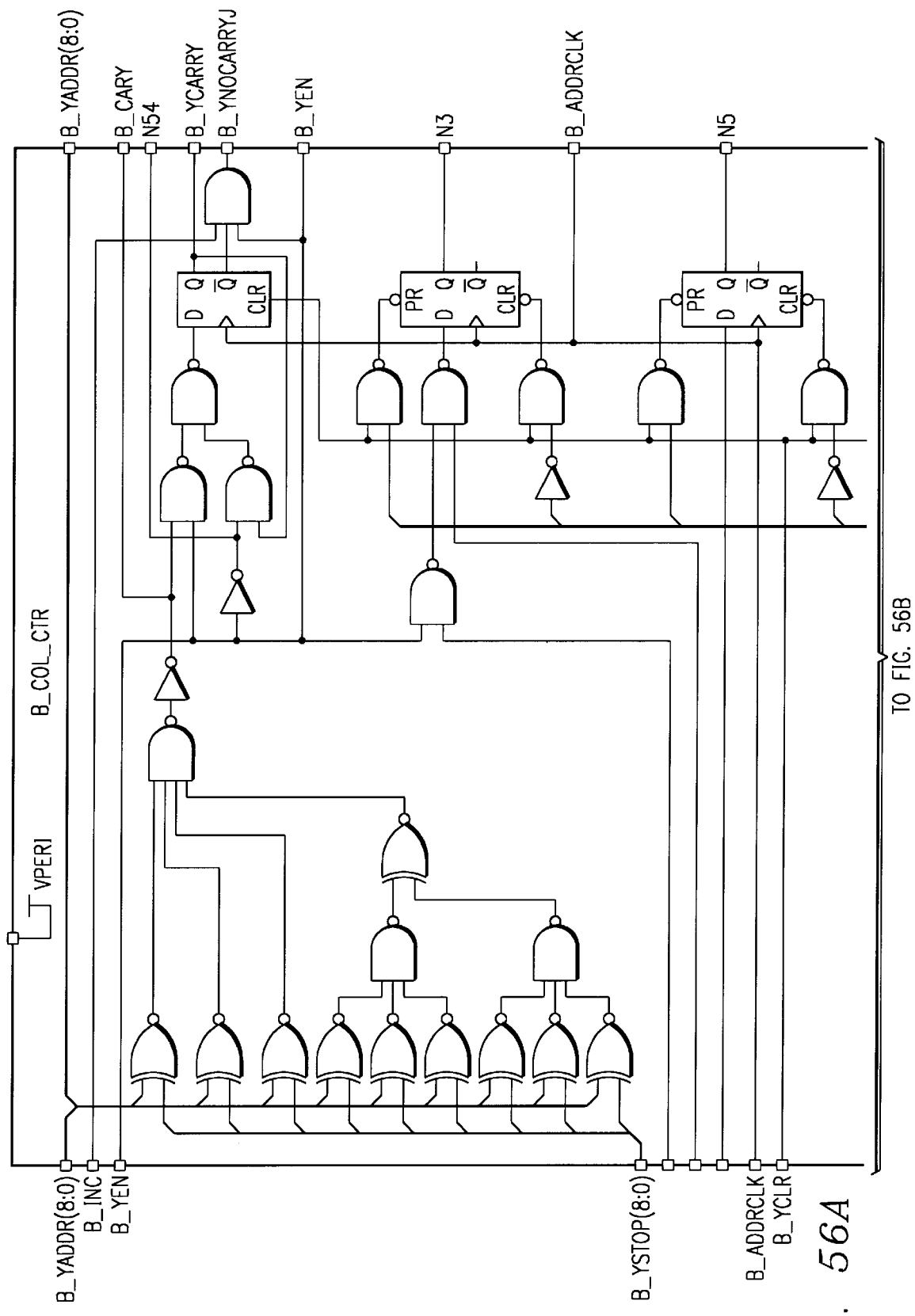
FIG. 56 shows a schematic of the Column Counter.
Figure 57A:
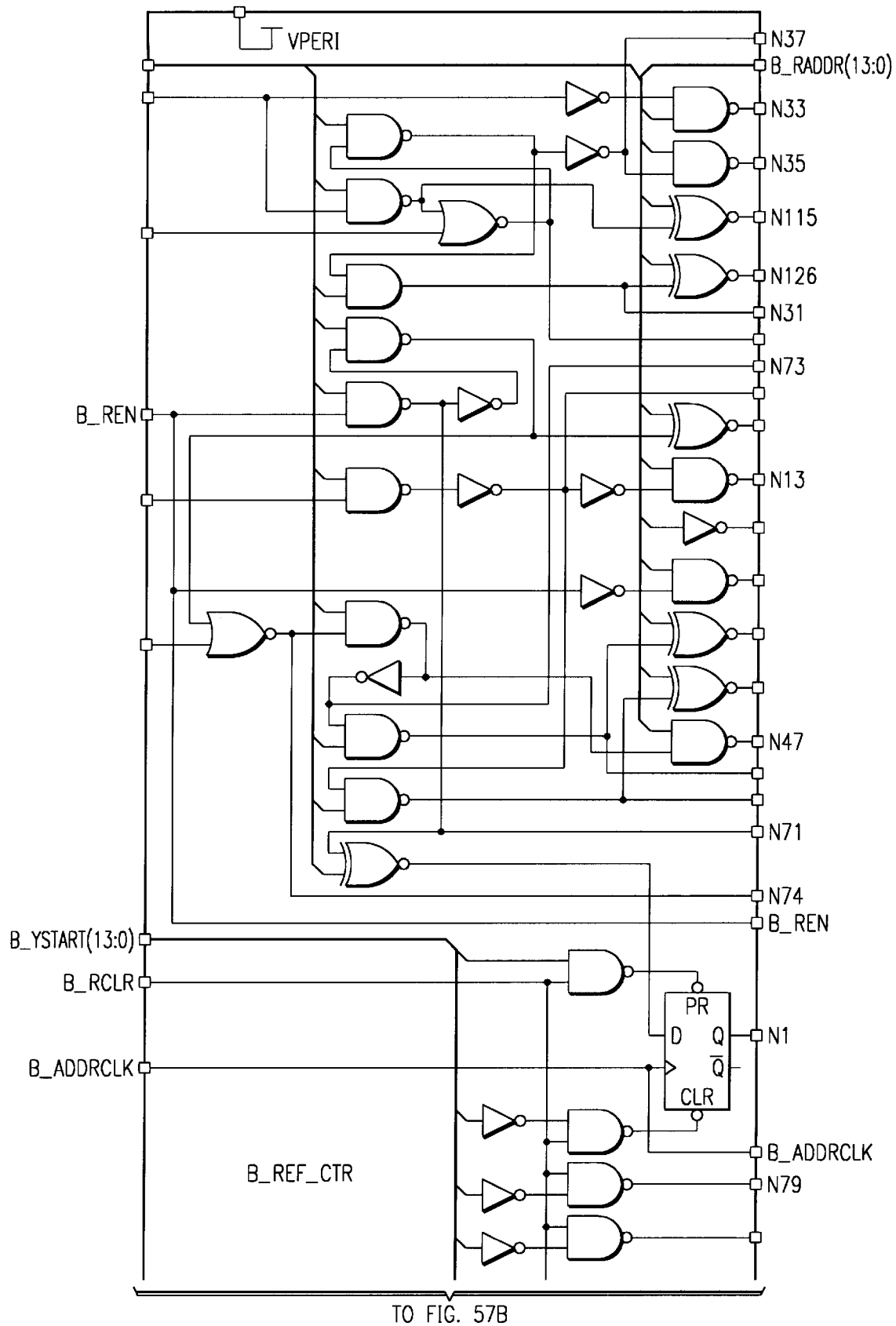
FIG. 57 shows a schematic of the Refresh Counter.
Figure 58A:
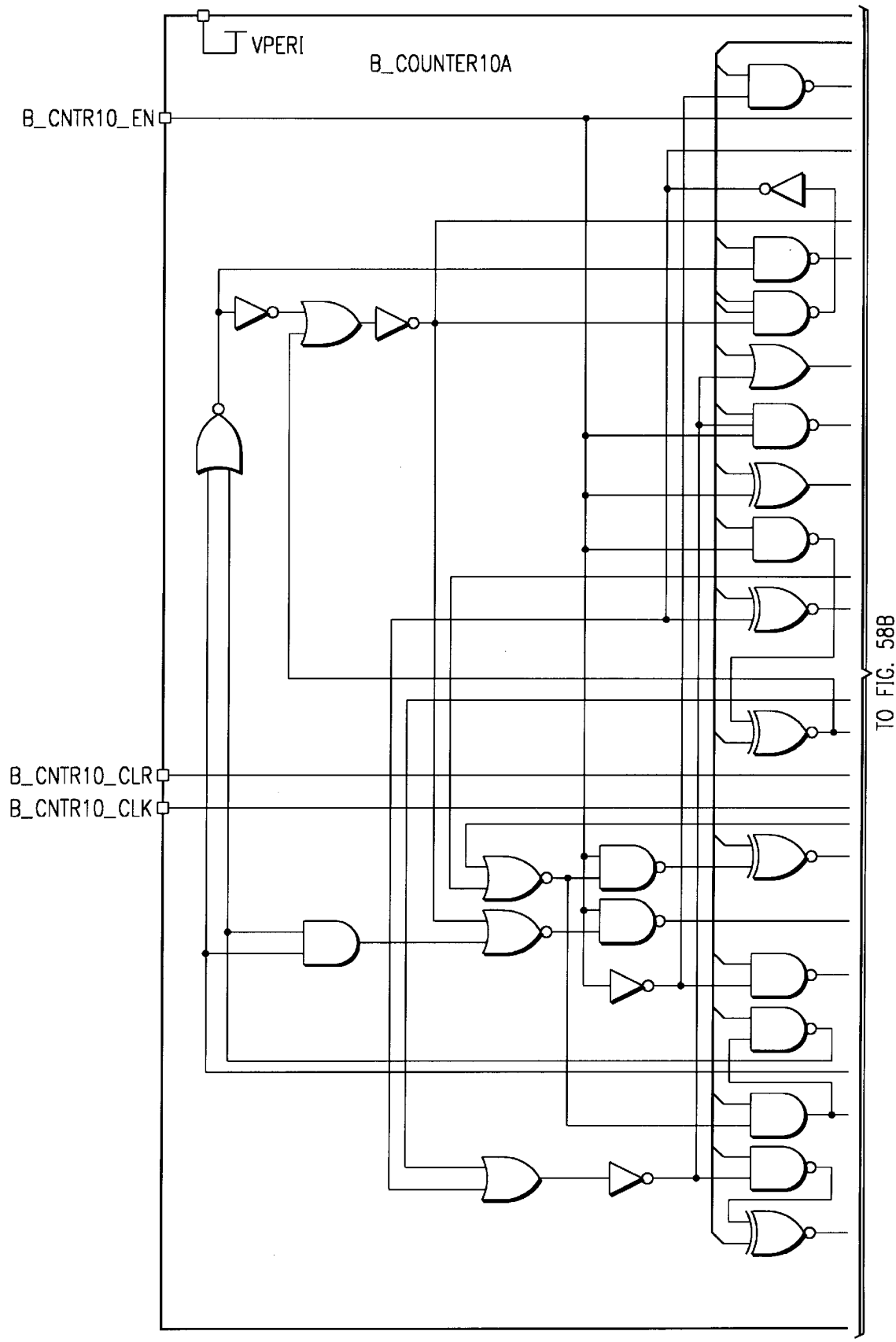
FIG. 58 shows a schematic of the 10 bit Counter "A"
Figure 58B:
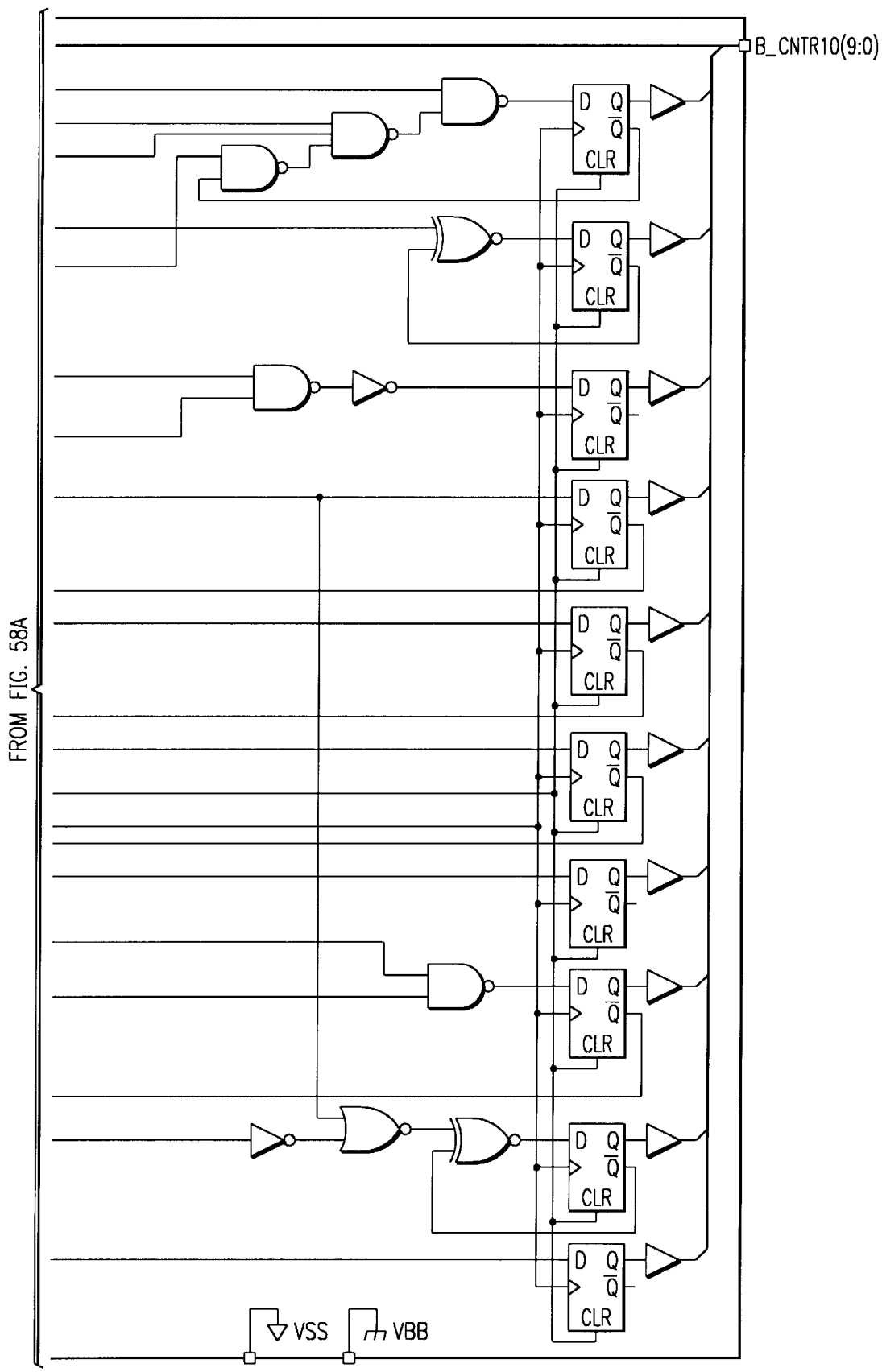
Figure 59:
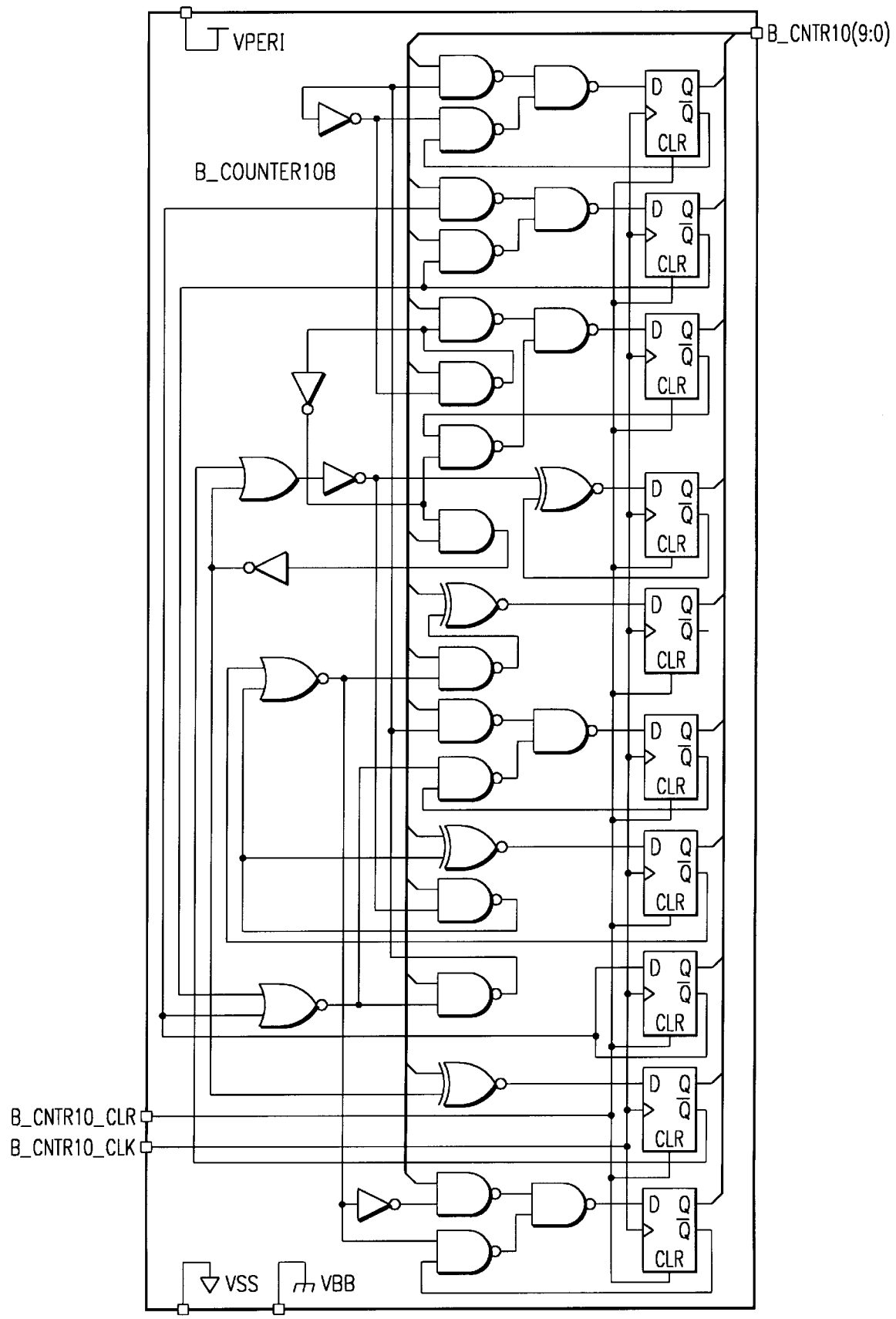
FIG. 59 shows a schematic of the 10 bit Counter "B"

In memory functional testing, various algorithms are used to to test a device. Tester are normally used to generate test signals, which represent the test algorithms, to the device. The outputs of the device are then sampled by the tester to determine pass or fail. For very high density memory devices such as 256M SDRAM, test time is expected to be very high thus making it not practical or cost efficient to do all functional testing on a tester. Build In Self Test (BIST) circuits are designed to replace the testers. The role of BIST circuits (FIGS. 51, 52) is to generate all the test signals associated with the test algorithms internal to the device. Instead of using a tester, a device under test will power up in BIST mode, if certain voltage conditions are satisfied, and test itself In BIST mode, BIST generated signals takes control of control signals such as RAS and CAS as well as all the addresses and data.

Advantage of BIST: Test Cost savings.

Figure 60:
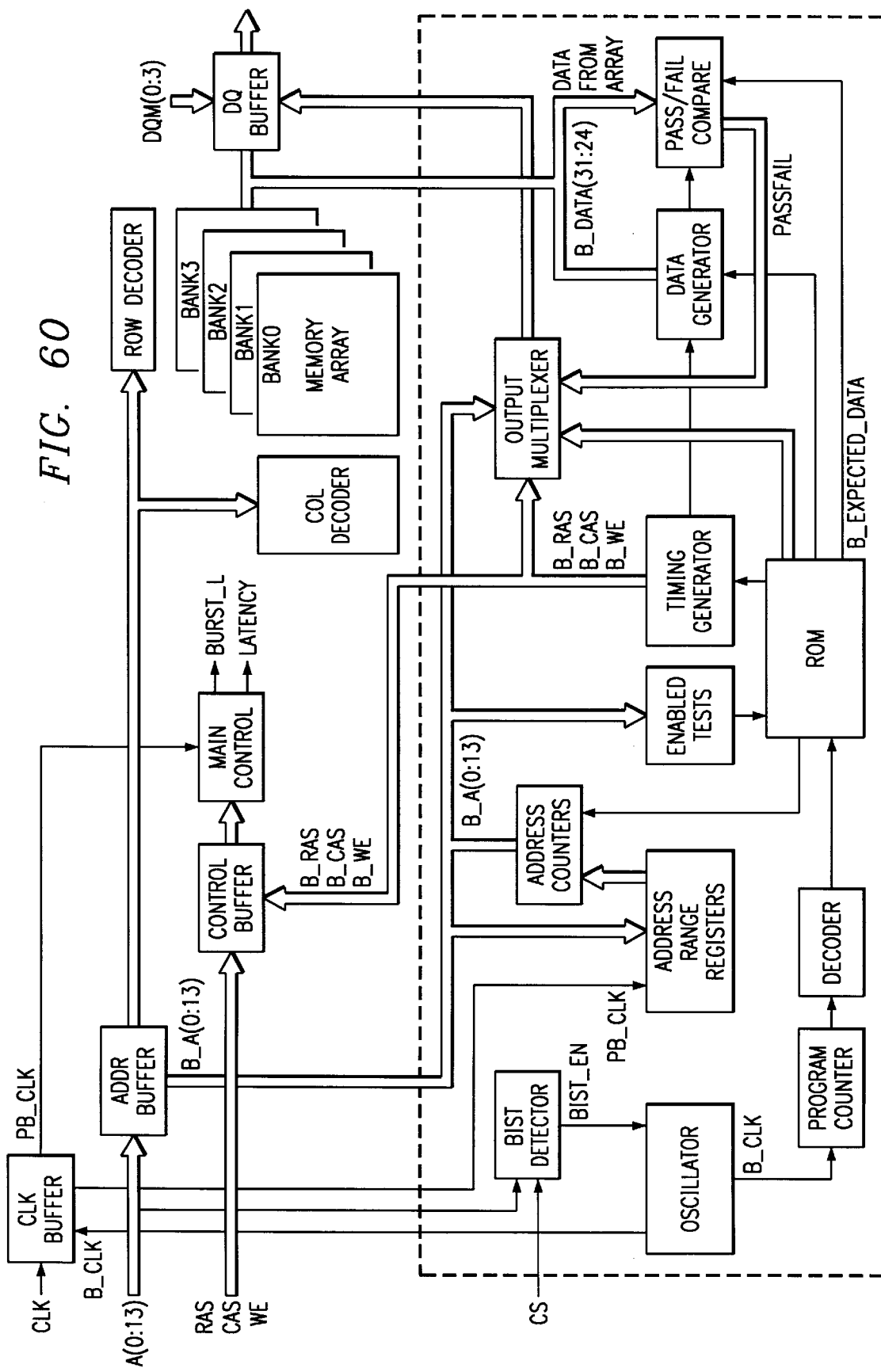
FIG. 60 shows a diagram of the BIST block and Interface.

The build In self circuit is made up of the following (FIG. 60):

Oscillator with a 50 Mhz frequency
Overvoltage detector on A4
64 word X 12 Bit ROM
6 Bit Program counter
6 to 64 decoder
14 bit X register, 9 bit Y register and 14 bit refresh register
Timing generators
Address range counters
Shift register for storage of enabled test algorithms
Internal pattern data generator
Pass fail compare circuits
Output mutiplexer.

BIST circuit takes up 1.9 mm$^2$ in silicon area and occupies about 0.5% of the total chip area. It is located at the right most end of the chip, critical speed interface logic such as the address interface is placed near the speed path to avoid slowing down the normal operation. Control logic, ROM and various other BIST logic is placed on the end of the chip where silicon area is lower priority than in the center or intersection areas of the chip (FIG. 61):

10 algorithms were implemented in the 256M BIST scheme, Summary for them are show (FIG. 62)

Behavior for BIST circuits has been described in VHDL code and simulated using QVHDLsim. ALL BIST circuits except for the oscillator, over voltage detector and ROM were synthesized using Autologic 2.

10.01 BIST Entry and Exit

BIST Entry and Exit scheme is designed to satisfy the following requirements.

1. Simple Entry and Exit sequence with no timing required in order for BIST to operate with low cost BIST boards.
2. No inadvertent BIST entry.
3. Ability to alternate between Normal and BIST mode for read and write for testing BIST circuit operation.

It is important to have a simple entry and exit sequence so that BIST operation can be done on a simple BIST board with very high parallelism without having to worry about signal quality.

BIST Entry:

To do this, BIST entry is designed such that only DC signal is needed. To get into BIST, all that is needed is an overvoltage on A4 and low on CS during power up (and high or low on other pins depending the options chosen). This will put the device into a BIST standby mode (FIG. 63)

While in standby mode the device will operate as if it is in normal mode and it can perform read, write and regular MRS or even DFT commands.

A rising edge on the CS pin will start the BIST operation while device is in BIST standby mode.

It is important to have a delay from overvoltage detection to actually starting BIST operation because it gives the user the opportunity to start the BIST operation at a time suitable to him.

It allows the user to use a DFT mode to set the address range, for example or giving the device enough time to settle down to a steady state before BIST operation began. It will also allow the user to write a row in normal mode and later enter BIST to read back the data in the array in BIST mode (or vice versa) to check BIST circuit functionality.

BIST Exit:

A falling edge of CS will exit all BIST operation unconditionally and the only way to get back into BIST mode is to power down and then power up again with overvoltage.

It is also imperative to prevent inadvertent BIST entry. To achieve this, overvoltage can only be detected at power up at the falling edge of VUPB. It cannot be detected at any other time. This and the CS interlock during power up gives the device only one chance to go into BIST standby mode. This minimizes the chance of inadvertent BIST entry during device operation.

When an overvoltage is detected at A4, it generates a B_SR_LOAD pulse. This pulse loads the information available on the other 13 addresses into a shift register. These contain the information on which tests are to be executed while in BIST as well as information for clock option, array size option and output enable option. Details on these can be found in B_SHIFT block.

The Entry and Exit timing sequence for BIST operation is summarized here (FIG. 64):

An example of a power up setup is on an example pinout (FIG. 65).

10.1 BOV

INPUTS: B_OVDETECT,B_DONE,TLBADDRNG,PBCSB_BIST,VUPB
OUTPUTS: B_SR_LOAD,B_IN_EN,B_EXTCLK,B_PADDIS BIST_EN BIST_MCEN
OF CIRCUITS: 1/chip
LOCATION: right side of chip The function of this circuit is to detect overvoltage during power up. It does not detect overvoltage at any other time.

During power up, at the falling edge of VUPB, a pulse VUPBN which gives about 16 ns to charge up B_OVERDETECT is generated. The falling edge of VUPBN will set the overvoltage latch OVLATCHB to low if B_OVERDETECT is a high and if PBCSB_BIST is low. A low on OVLATCHB signals the detection of overvoltage and entry to BIST standby mode.

During the BIST standby mode, if PBCSB_BIST subsequently goes high, BIST_EN will go high to signal the start of BIST operation. A high to low transition of PBCSB_BIST will reset the overvoltage latch and set OVLATCHB to high. It also brings BIST_EN to low signalling BIST exit.

If there is no overvoltage detected during power up, B_OVERDETECT will be low and it will not get into BIST standby mode.

If overvoltage is detected at power up and OVLATCHB latch is set at power up, B_SR_LOAD pulse is generated to load the information on the address lines into a shift register. This information determines which test will be performed in BIST mode.

B_PADDIS and B_IN_EN are used to control the multiplexing of BIST signals and external signals. In normal operation, external signals are used. This is the normal mode in which the device operates in.

If overvoltage is detected at power up and the device is ready for BIST operation, B_IN_EN will be set to high to allow address signals to get to BIST circuits. In TLBAD-DRNG DFT mode, where the start and stop addresses are loaded into the BIST circuit, B_IN_EN is also high.

In BIST operation, external signals are ignored and BIST signals (B_ADDRx) are used.

B_EXTCLK is used to bring in the external clock signal to the BIST circuits for two purposes. The external clock is needed for the external clock option. It is also needed during the DFT mode to load in the address range (TLBADDRNG)

10.2 BOVBIAS

INPUTS: ESDA4, VUPB
OUTPUTS: B_OVDETECT
OF CIRCUITS: 1/chip
LOCATION: right corner BOVBIAS is the overvoltage detector. Node OV will be charged up if there is an overvoltage condition on ESDA4 after VUPB goes low. This will set B_OVDETECT to high. A voltage higher than 5.2V on ESDA4 is sufficient for an overvoltage to be detected.

10.3 BIROSC (FIG. 34)

Figures 64, 66:
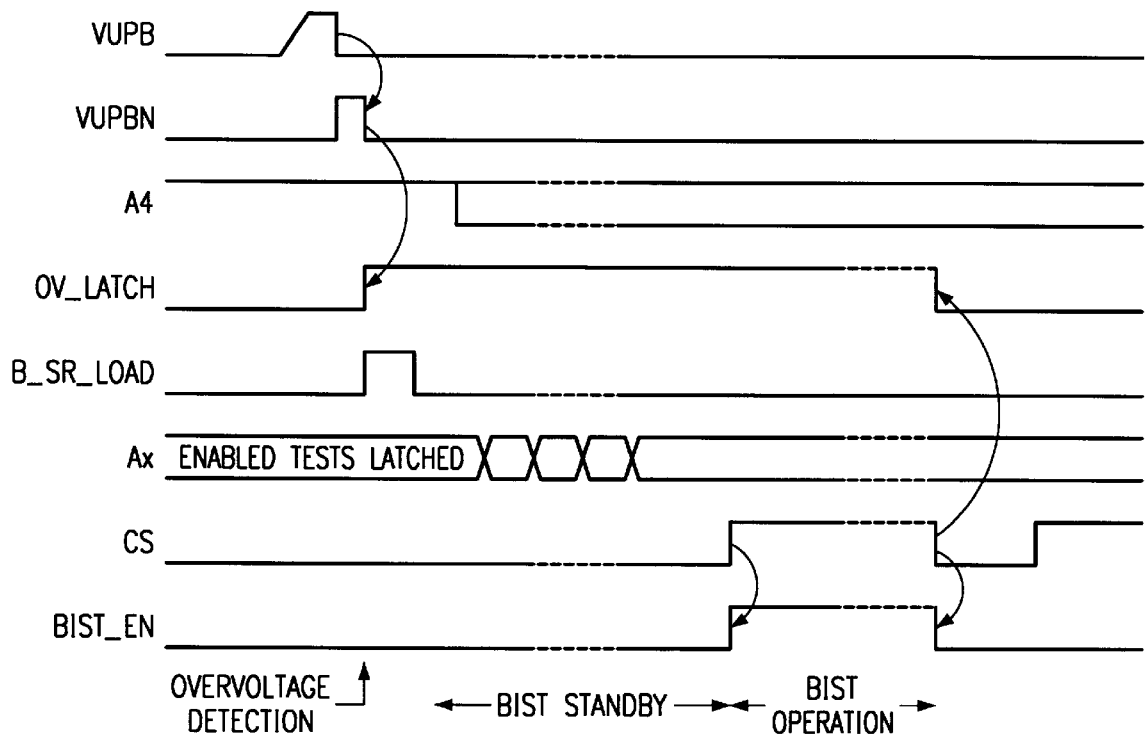
FIG. 64 shows a timing diagram.
FIG. 66 shows a table for clock multiplexing.
Figure 67:
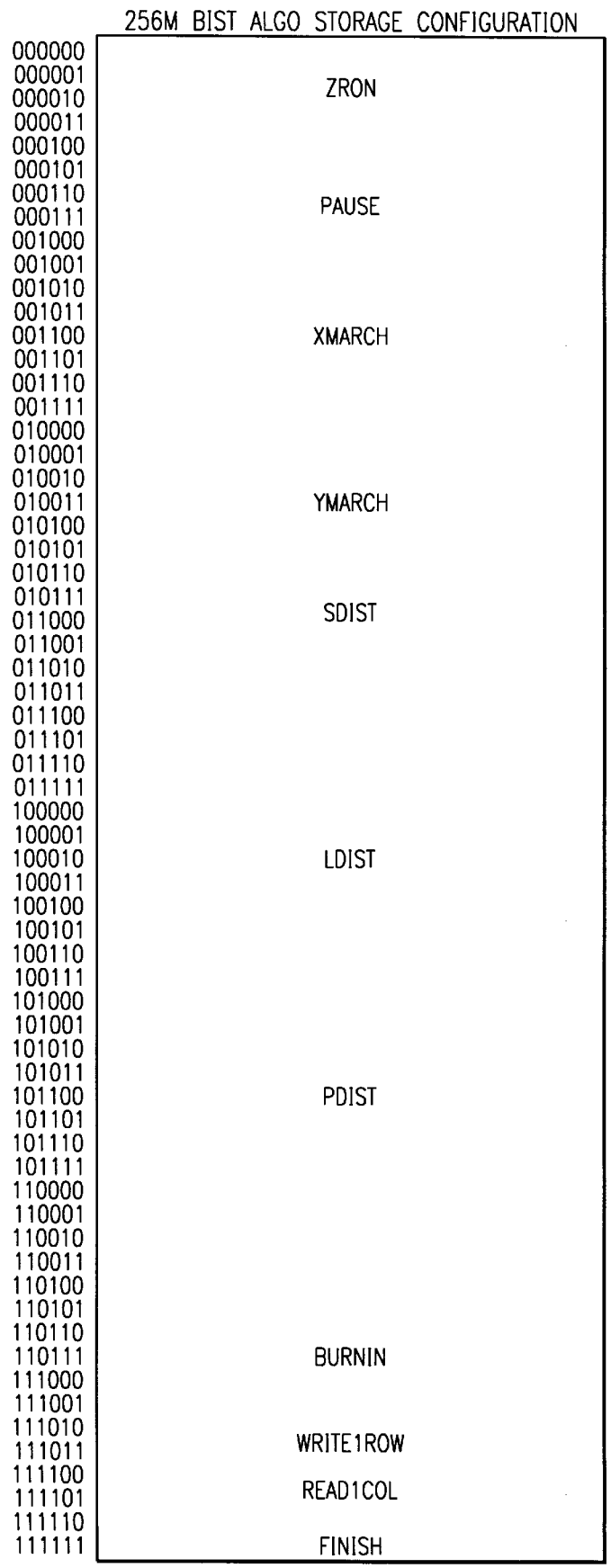
FIG. 67 shows a diagram the ROM Memory Map.

INPUTS: PB_CLKBIST,BIST_EN,MD_SLFR,B_CLKMUX
OUTPUTS: B_IRCLK,BCLK_EN,B_CLK
OF CIRCUITS: 1/chip
LOCATION: right corner of chip The BIROSC is the primary oscillator that generates the clock signal for all BIST operation. It is a dual mode oscillator circuit. In BIST mode (when BIST_EN is high). It operates in the high frequency mode and provides B_CLK to the BIST circuit to synchronously control BIST operation. In normal mode (when BIST_EN) is low, it operates at the low frequency mode and produce a low frequency B_IRCLK used for self refresh mode. It is also a low frequency clock for the VBB circuits (FIG. 66).

This circuit is also used to control internal and external clock for BIST operation.

If the device power up in BIST mode and the internal clock option is selected, B_CLKMUX will be set to low. This will set BCLK_EN to high to take over control of the CLK signals going into the device. The oscillator will generate 20 ns clock needed for BIST operation. Externally CLK needs to be pulled low. If B_CLKMUX is high, external clock option is chosen, PB_CLKBIST will be used as the clock for BIST.

Nodes BNN and IRNN are used to compensate for process variation to ensure a more constant oscillator frequency.

10.4 BIRBIT (FIG. 33)

INPUTS: CLK
OUTPUTS: Q
OF CIRCUITS: 6/chip
LOCATION: right corner of chip

This circuit is used to divide the CLK frequency by half Q has half the frequency of CLK.

10.5 BSLFRCLK

INPUTS: B_IRCLK,VUPB
OUTPUTS: SLFR_TIME
OF CIRCUITS: 1/chip
LOCATION: right corner of chip SLFR_TIME is the clock used for self refresh and also in VBB pump. It oscillates with a period of about 8 US.

10.9 BTIMEDRV

Figure 47A:
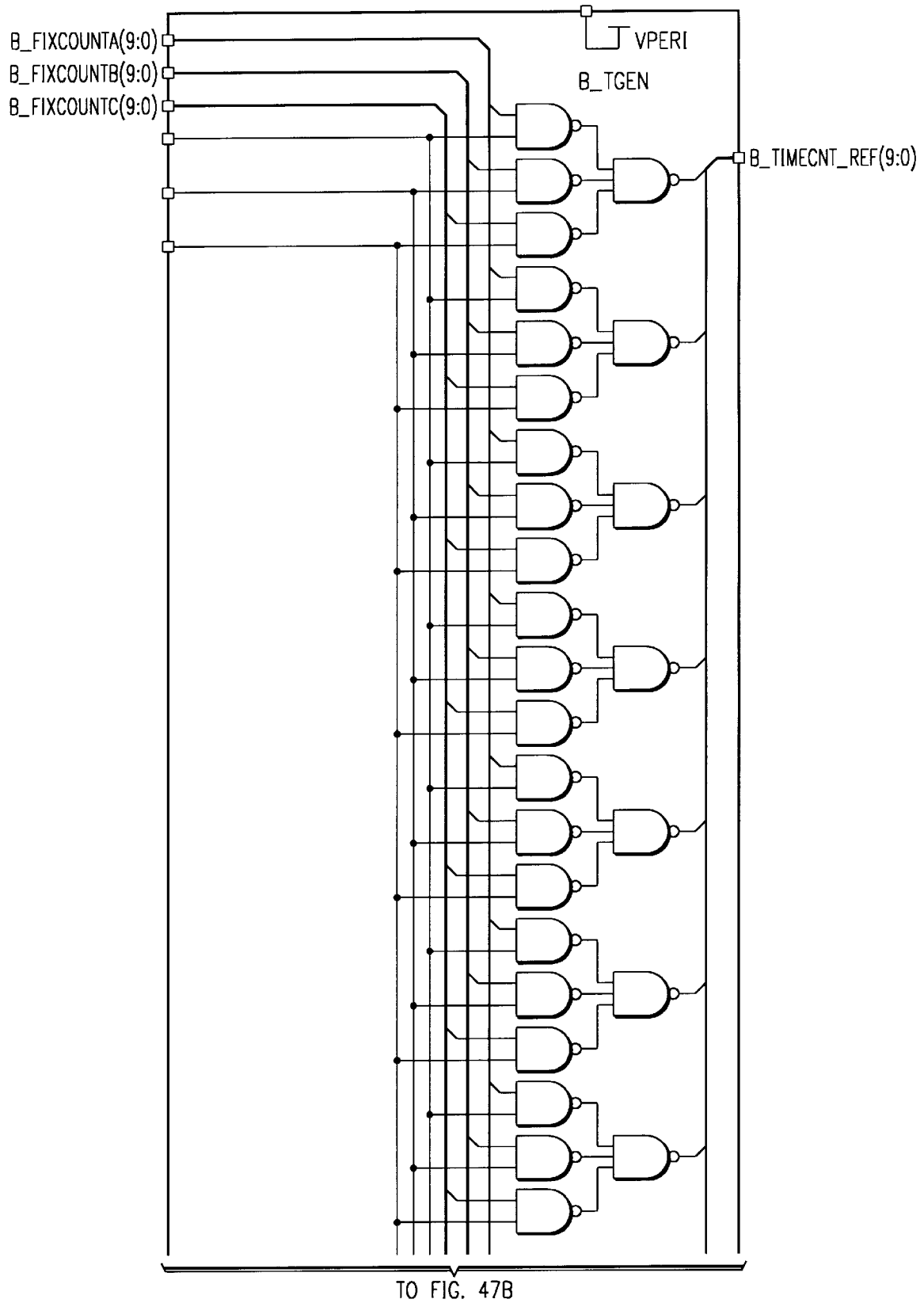
FIG. 47 shows a schematic of the Timing Generator Sheet 1.
Figure 47B:
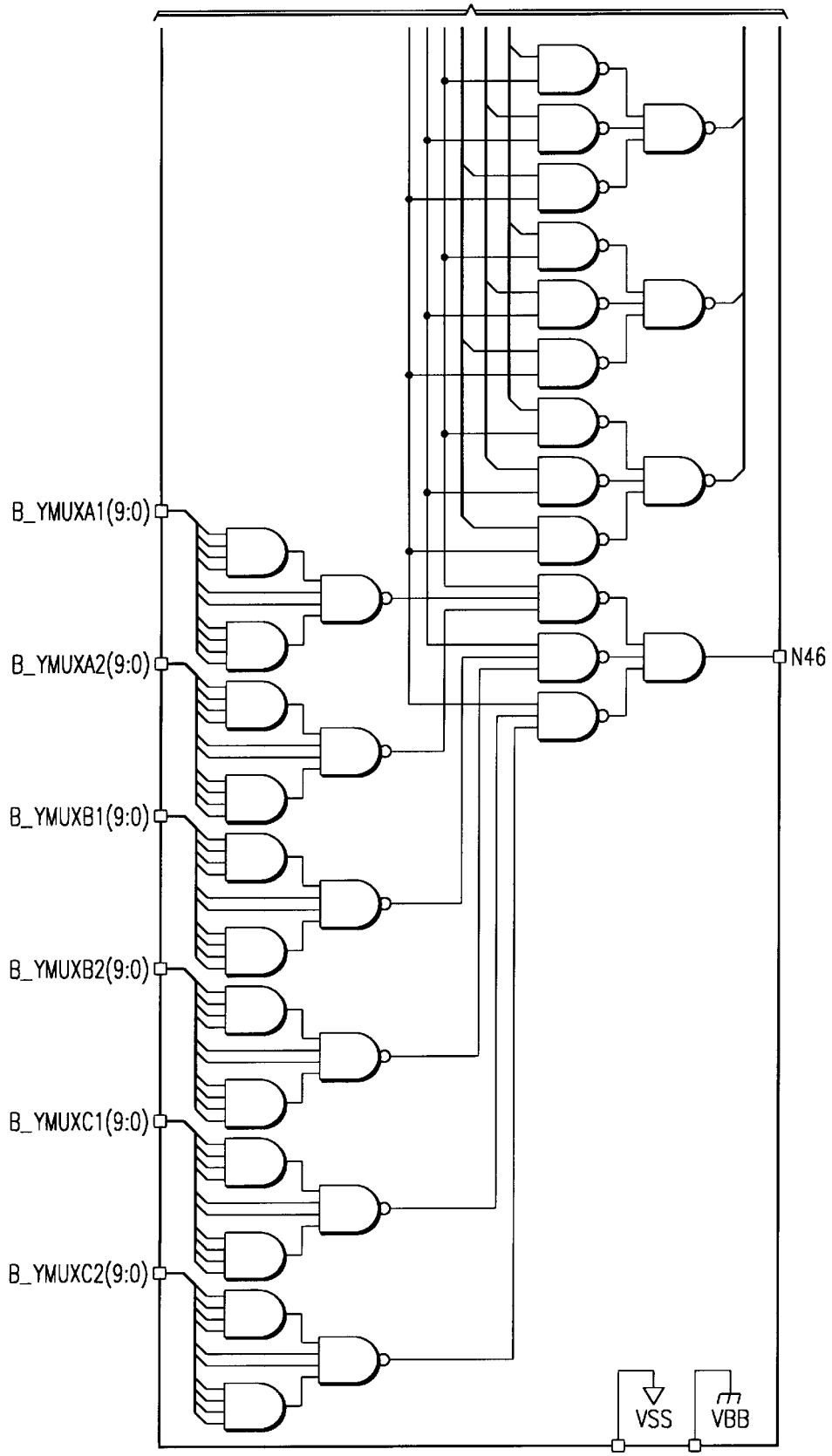
Figure 48A:
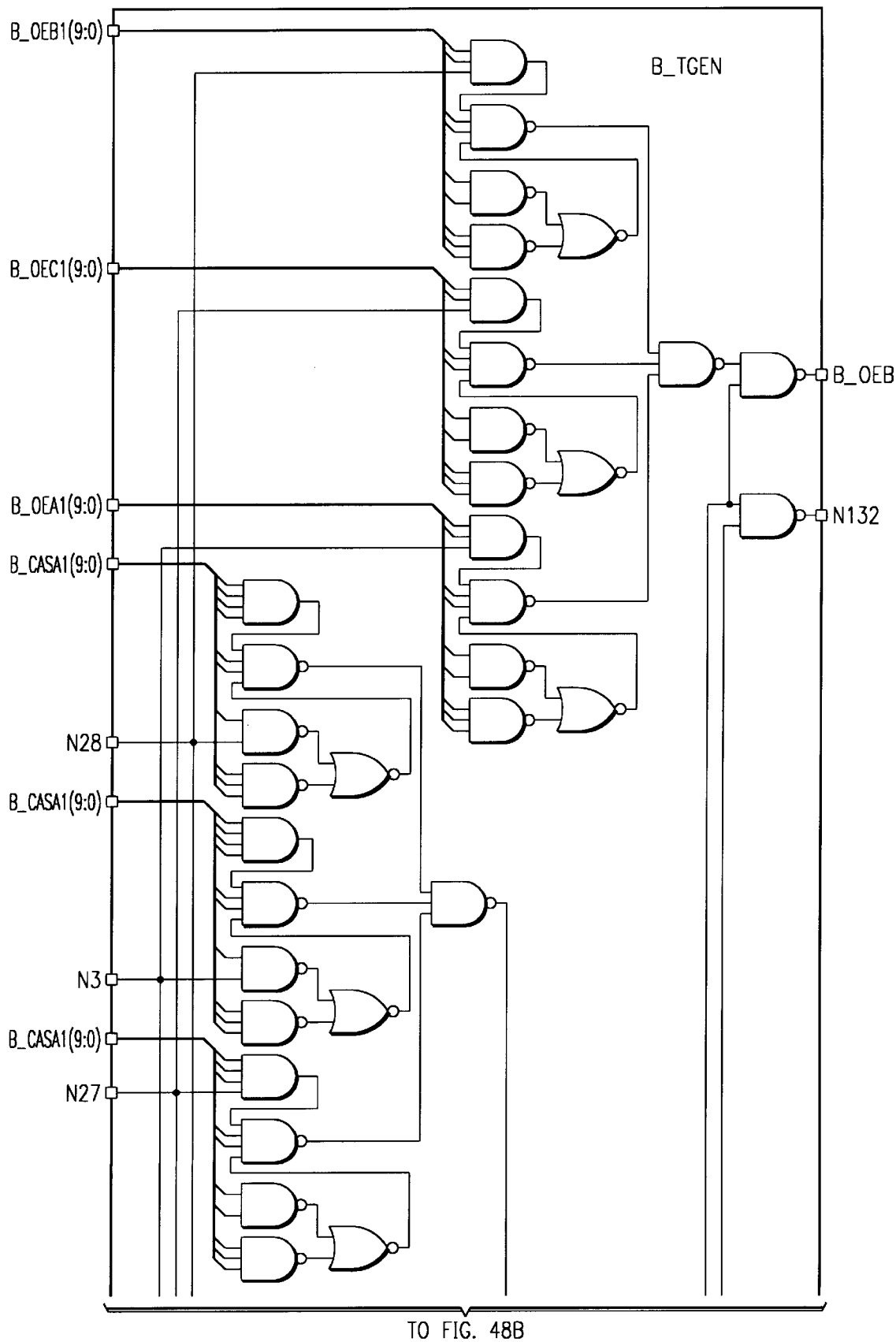
FIG. 48 shows a schematic of the Timing Generator Sheet 2.
Figure 48B:
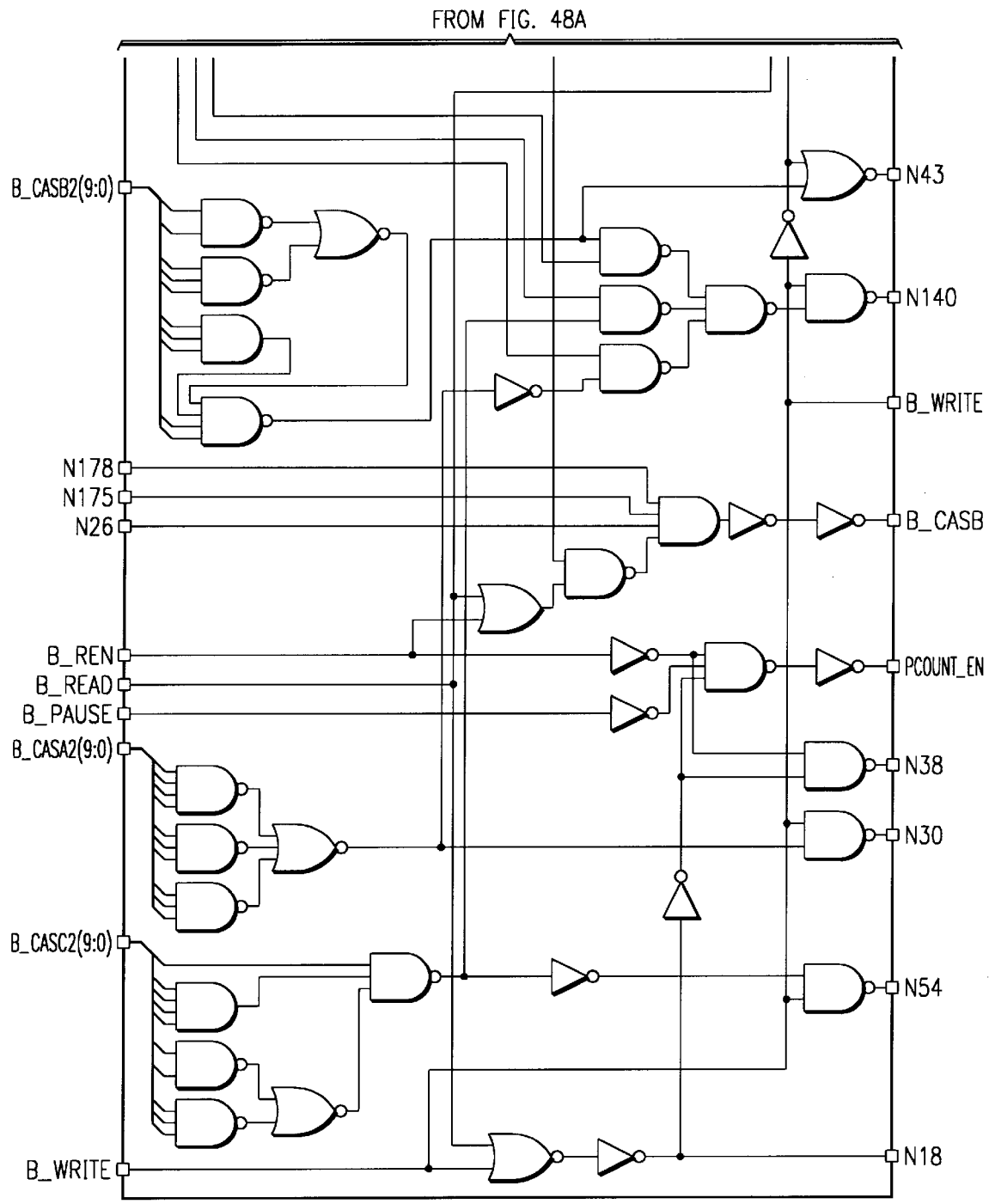
Figure 49A:
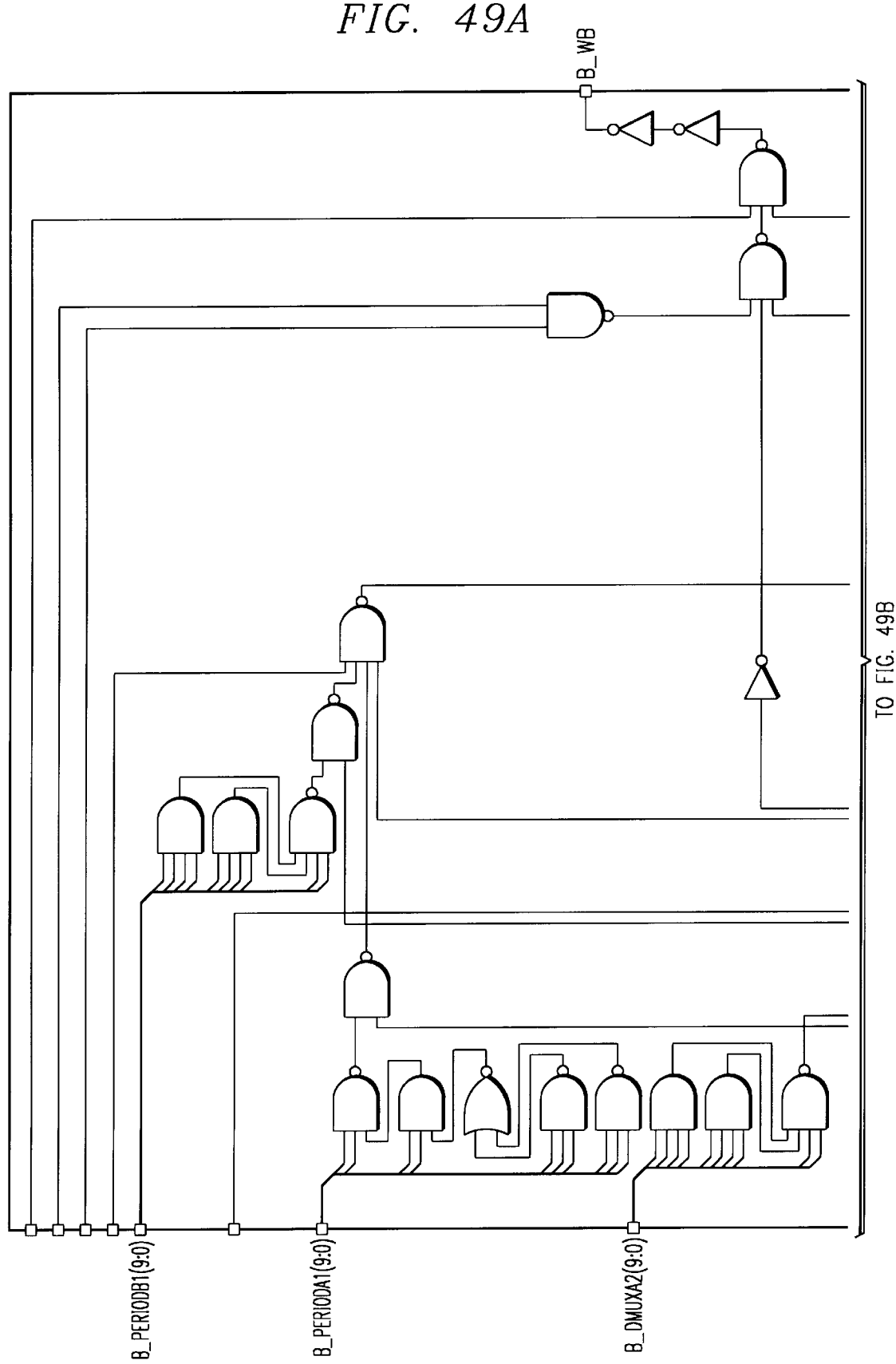
FIG. 49 shows a schematic of the Timing Generator Sheet 3.
Figure 49B:
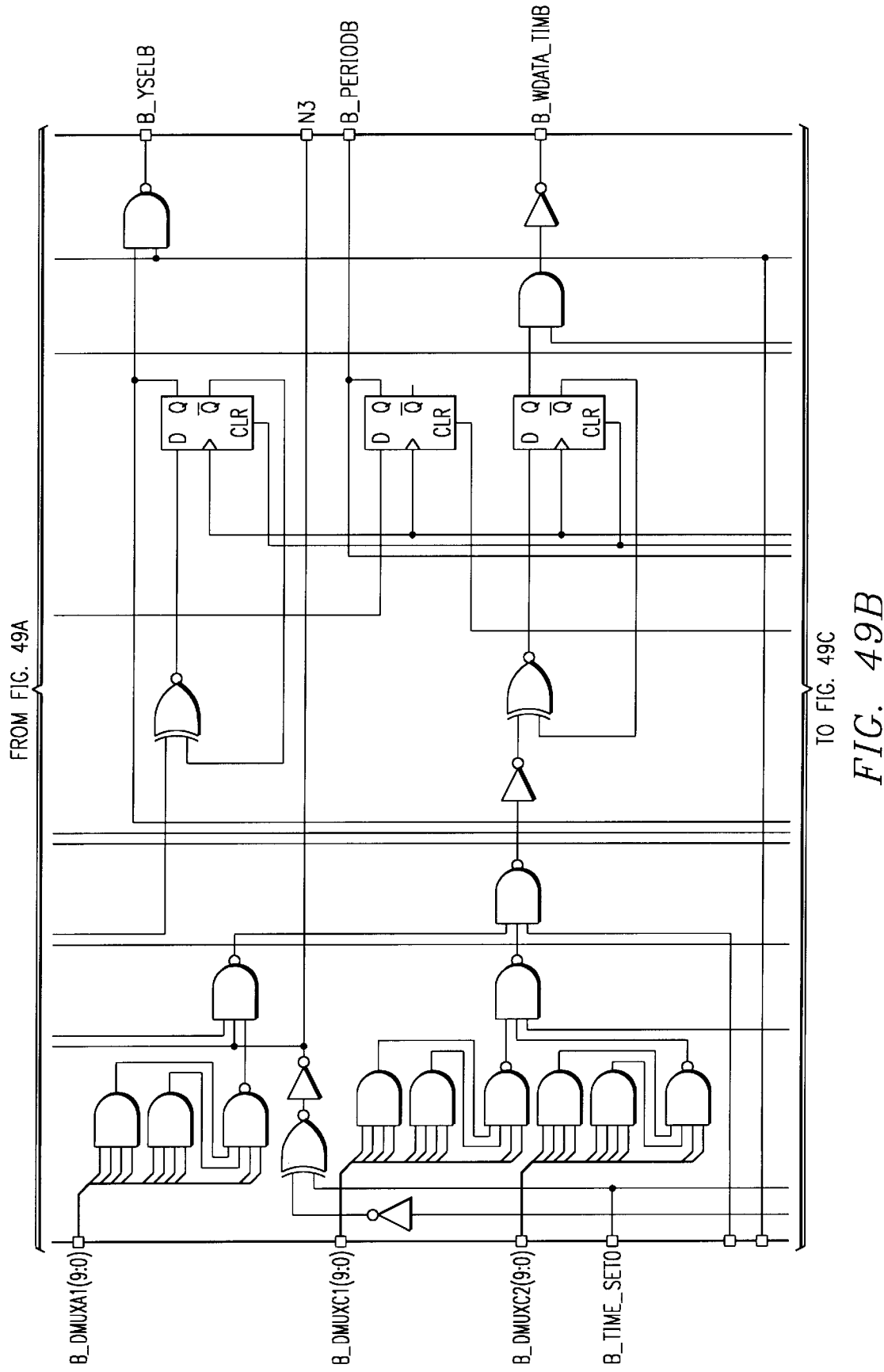
Figure 49C:
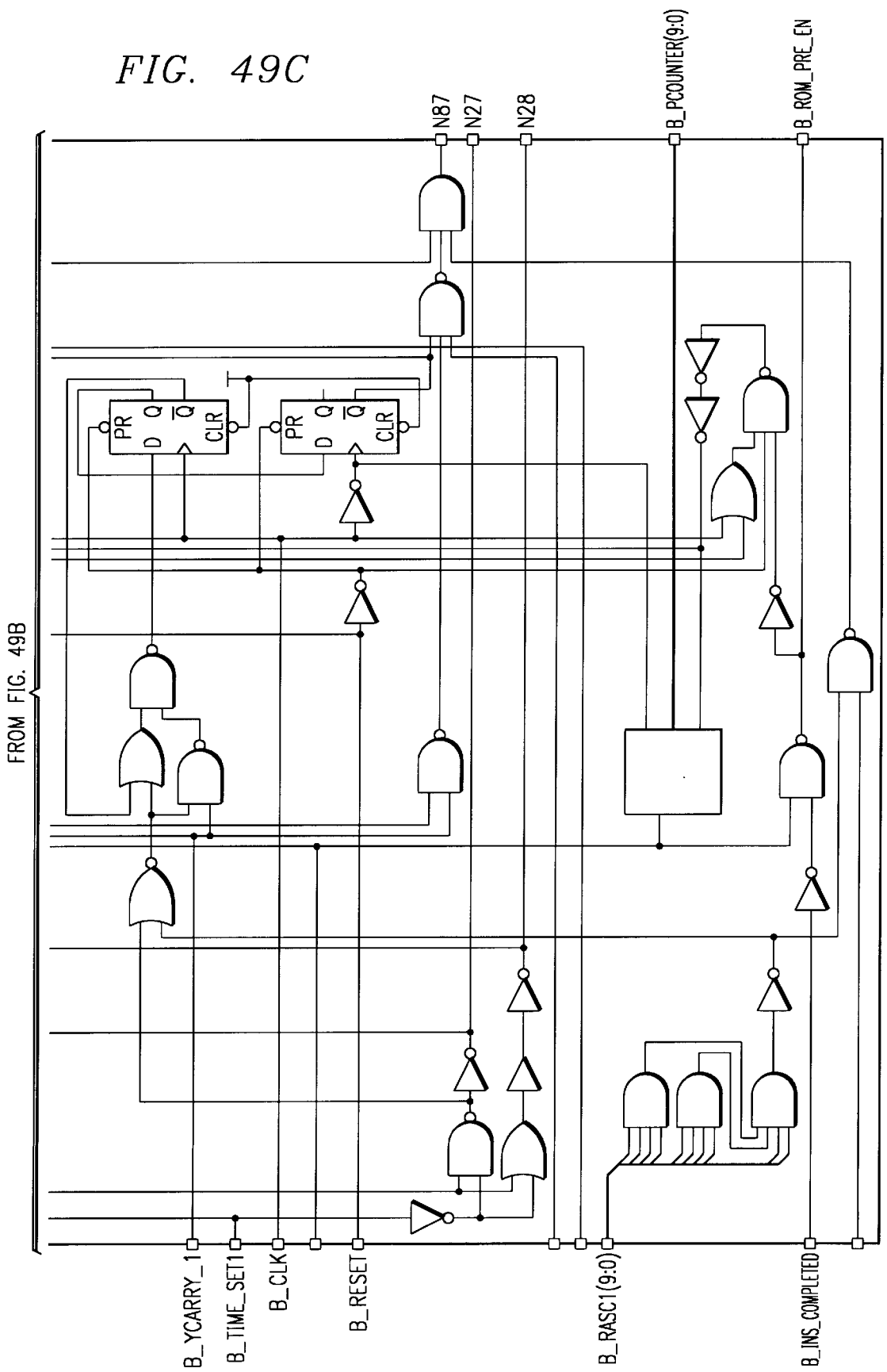
Figure 50:
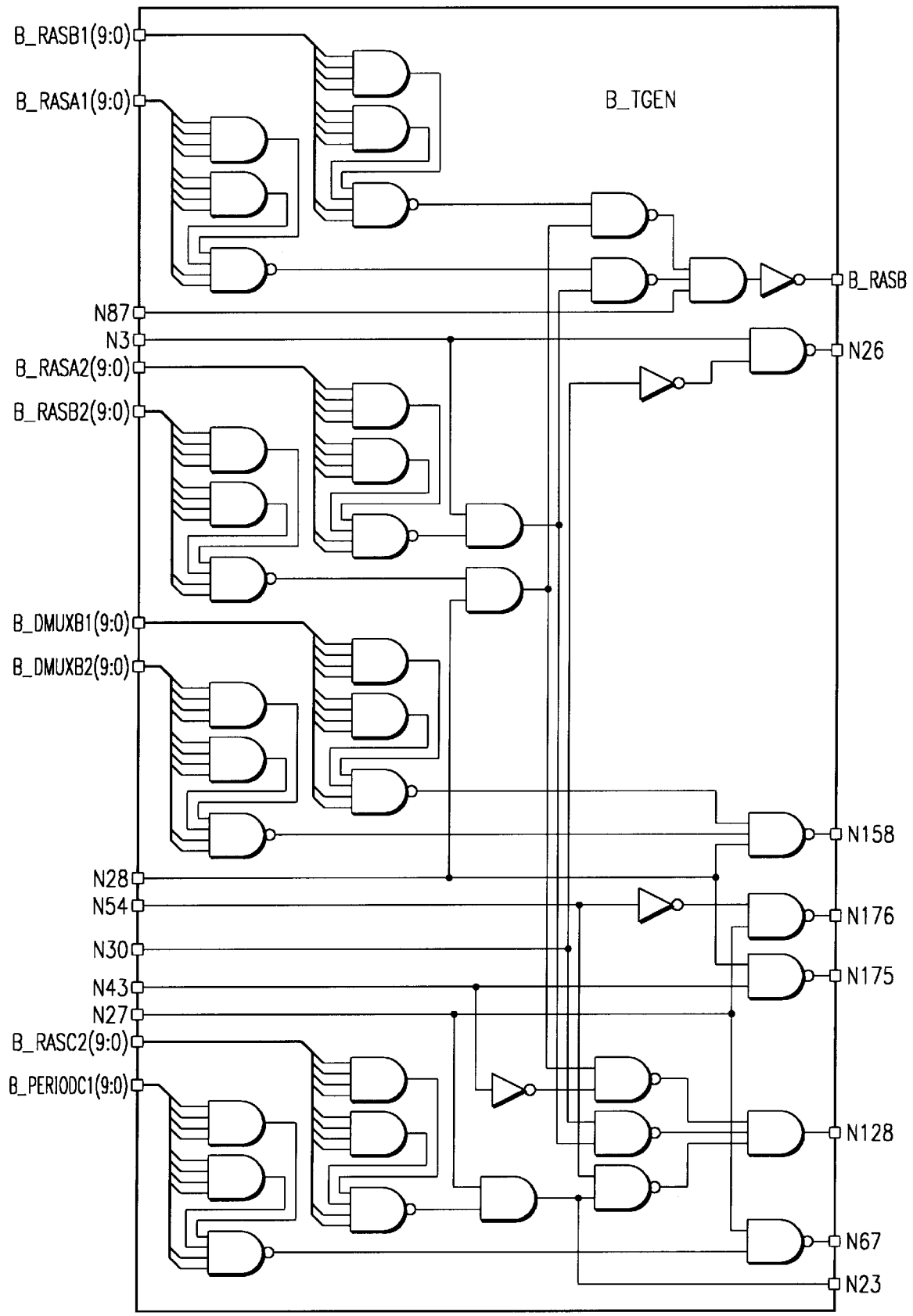
FIG. 50 shows a schematic of the Timing Generator Sheet 4.

INPUTS: B_PCOUNTER(0)
OUTPUTS: B_PCOUNTERD(9:0),B_PCOUNTERDB(9:0)
OF CIRCUITS: 1/chip
LOCATION: right corner of chip Generate true and bar signals from the primary counter in the BIST circuit. The true and bar signals goes into the B_TGEN (FIG. 47) circuit to generate the timing sets.

10.10 BRM (FIG. 27)

INPUTS: B_ROM_ADDR(63:0)
OUTPUTS: B_WORD(11:0)
OF CIRCUITS: 1/chip
LOCATION: right corner of chip The BRM has 64 ROM words and each word is 12 bit wide. The decoder in BIST circuit decides which ROM word is to be read.

10.10.1 Gross (Zrom) Algorithm
1. Write array with selected pattern.
2. Read array to confirm selected pattern was written.

Note:
a) Selected pattern is an all 0's pattern, an all 1's pattern or any combination of 0's and 1's.

10.10.2 Pause Algorithm
1. Write array with selected pattern.
2. Wait for specified time to elapse.
3. Read array to confirm selected pattern written is retained.

Note:
a) Selected pattern is an all 0's pattern, an all 1's pattern and/or any combination of 0's and 1's.

10.10.3 Xmarch Algorithm
1. Write array with background pattern.
2. For each row read the background pattern and write the inverted pattern into each column.
3. For each row read the inverted pattern and write the original pattern into each column.
4. Read original background pattern to confirm no defect has occurred.

Notes:
a) Background pattern is an all 0's pattern, an all 1's pattern or combination of 0's and 1's.

10.10.4 Ymarch Algorithm
1. Write array with background pattern.
2. For each column read the background pattern and write the inverted pattern into each row.
3. For each column read the inverted pattern and write the original pattern into each row.
4. Read original background pattern to confirm no defect has occurred.

Notes:
a) Background pattern is an all 0's pattern, an all 1's pattern or combination of 0's and 1's.

10.10.5 Sdist Algorithm
1. Write array with background pattern (optional)
2. Write target row with disturb pattern repeatedly until specified time has elapsed.
3. Refresh
4. Read neighboring rows to target row to confirm no disturb type error defect has occurred.
5. Return background pattern to target row.
6. Repeat by targeting all rows in the chip.

Notes:
a) Disturb pattern is an all 1's pattern, an all 0's pattern or any combination of 1's and 0's.
b) Background pattern is an all 0's pattern, an all 1's pattern or combination of 0's and 1's.
c) Steps 4 and 5 can be interchanged.

10.10.6 Ldist Algorithm
Algorithm steps are the same as for Sdist Algorithm. The Ldist algorithm utilizes a different time set to lengthen the time between a RASB and CASB pulses.

10.10.7 Pdist Algorithm
Algorithm steps are the same as for Sdist Algorithm. The Pdist algorithm writes the disturb pattern in a page mode. In the page mode the row remains activated until all columns are written into the row.

10.10.8 Burnin Algorithm
1. Continually write array with selected pattern.

Note:
a) Selected pattern is an all 0's pattern, an all 1's pattern or any combination of 0's and 1's.

10.10.9 Write 1 Rom Algorithm
1. Write one row in the array with selected pattern.

Note:
a) Selected pattern is an all 0's pattern, an all 1's pattern or any combination of 0's and 1's.

10.10.10 Read 1 Column Algorithm
1. Read one column in the array.

Note:
a) Selected pattern is an all 0's pattern, an all 1's pattern or any combination of 0's and 1's.

10.10.11 Finish Algorithm
Set the DONE flag to true and deactivate the program counter.

10.11 to 10.18 BRM0_7 to BRM56_63

INPUTS: B_ROM_ADDRx where x ranges from 0 to 63
OUTPUTS: B_WORD0 to B_WORD11
OF CIRCUITS: 1/chip
LOCATION: right corner of chip The BIST ROM circuits is divided into 8 individual circuits with each circuit having 8 words.

10.19 BROMDRV (FIG. 53)

Figure 68:
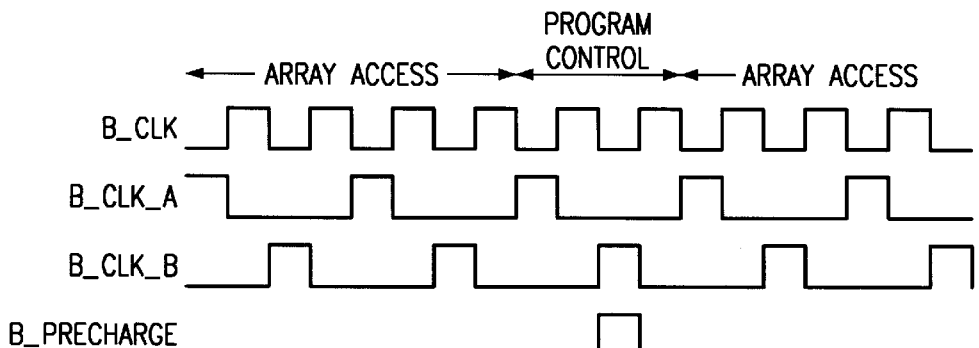
FIG. 68 shows a timing diagram for array access and program control.

INPUTS: B_WORD,B_PRECHARGE,B_ROM_WORD
OUTPUTS: B_WORD0..B_WORD11
OF CIRCUITS: 1/chip
LOCATION: right corner of chip BROMDRV is a driver circuit for the 12 bits of a ROM word. The 12 bits of data line is precharged once every 2 clock cycle during BIST operation when the device is not in the array access mode (FIG. 68).

10.20 BIST (FIGS. 51, 52)

10.22 B_CROM (FIG. 40)

| | |
|---|---|
| INPUTS: | BIST_EN,B_EEPRMOPT,TLBADDRNG,PB_CLKBIST,B_SR_LOAD, B_YSTOPE,B_XSTOPE,B_YSTARTE,B_XSTARTE,VUPB,TLBMON3 TLBMON2,TLBMON1,TLBROMR,B_ROM_WORD B_RASA1,B_RASB1,B_RASC1,B_RASA2,B_RASB2,B_RASC2, B_CASA1,B_CASB1,B_CASC1,B_CASA2,B_CASB2,B_CASC2, B_OEA1,B_OEB1,B_OEC1,B_OEA2,B_OEB2,B_OEC2, B_DMUXA1,B_DMUXB1,B_DMUXC1,B_DMUXA1,B_DMUXB1,B_DMUXC1, B_YMUXA1,B_YMUXB1,B_YMUXC1,B_YMUXA1,B_YMUXB1,B_YMUXC1 B_FIXCOUNTA,B_FIXCOUNTB,B_FIXCOUNTC B_PERIODA1,B_PERIODB1,B_PERIODC1, |
| OUTPUTS: | B_DONE,B_OUTPUTEN,B_CLKMUX,B_ROM_PRECHARGE, B_DQL(23:18),B_RASB,B_CASB,B_WDATA_TIMB,B_WB, B_PCOUNTER,B_ADDR,B_PF_RESULTS,B_ROM_ADDR,B_DQ |
| # OF CIRCUITS: | 1/chip |
| LOCATION: | right corner of chip |

All circuits in this block is synthesized using Autologic2 after coding in VHDL code. It has 8 major blocks:

1. B_CLK_GEN (FIG. 22): Generates auxiliary clocks of different phases. Also generates the precharge signal for the ROM
2. B_ADDRCTL (FIGS. 8–12): Generates and control the addresses of the cells to be accessed

| | |
|---|---|
| INPUTS: | B_CLK_A,B_CLK_C,B_ROM_WORD,TLBROMR,B_RESET, B_INS_COMPLETED,B_PC_LOAD,B_CLK_B,B_PC_LO_ADDR, B_RPTINV_STATE |
| OUTPUTS: | B_RPT_N_INV,B_YEN,B_DONE,B_DECR,B_ALTERNATE,B_INC, B_XEN,B_TIME_SET1,B_XEN,B_TIME_SET0,B_CKBD,B_CHK_KEY, B_REN,B_READ,B_PAUSE,B_JUMP,B_CHK_TIMEOUT,B_WRITE, B_JMP_ADDR,B_ROM_ADDR,B_RDATA,B_WDATA |
| # OF CIRCUITS: | 1/chip |
| LOCATION: | right corner of chip |

Figure 40:
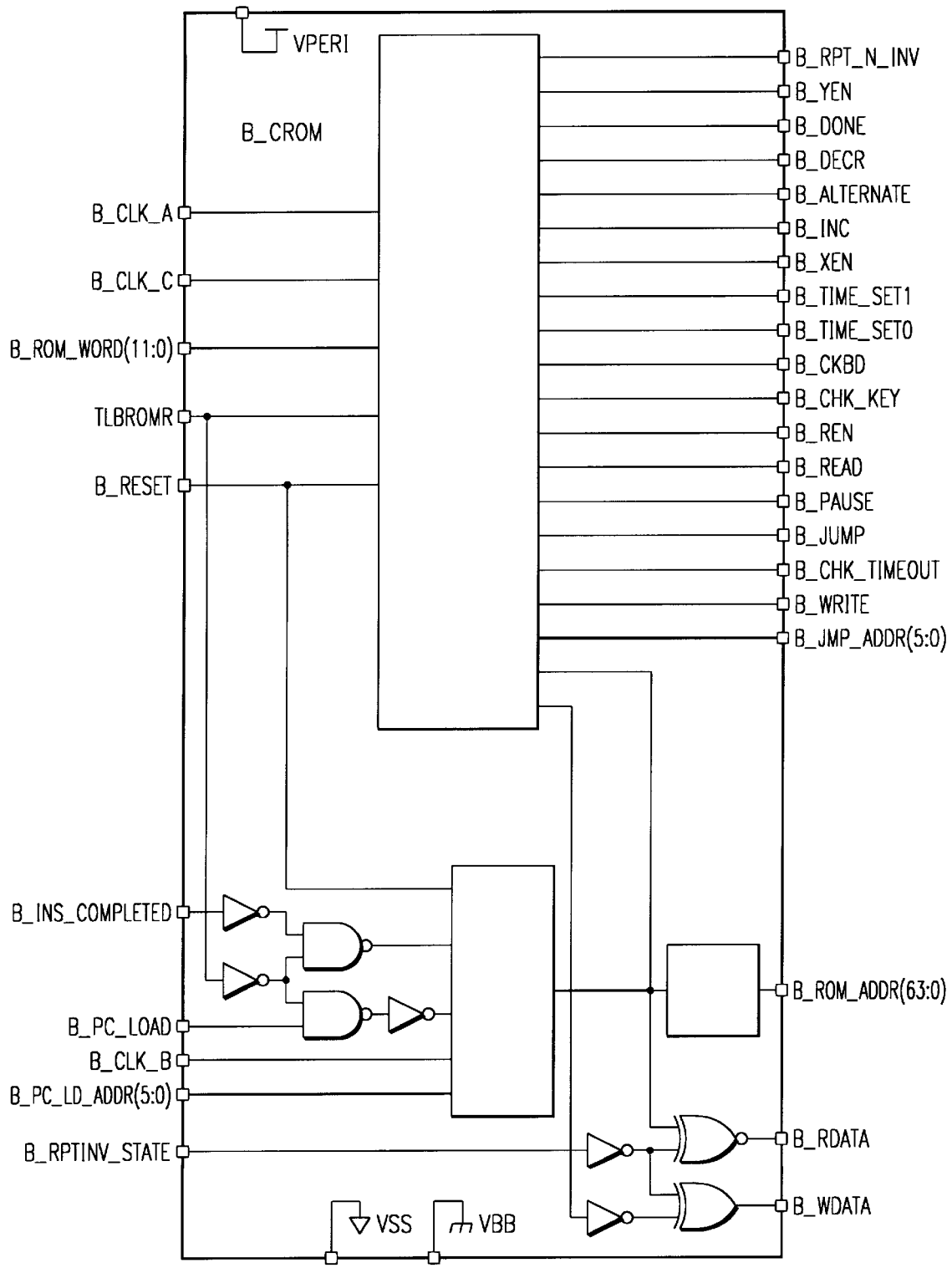
FIG. 40 shows a schematic of the Control ROM.
Figure 41A:
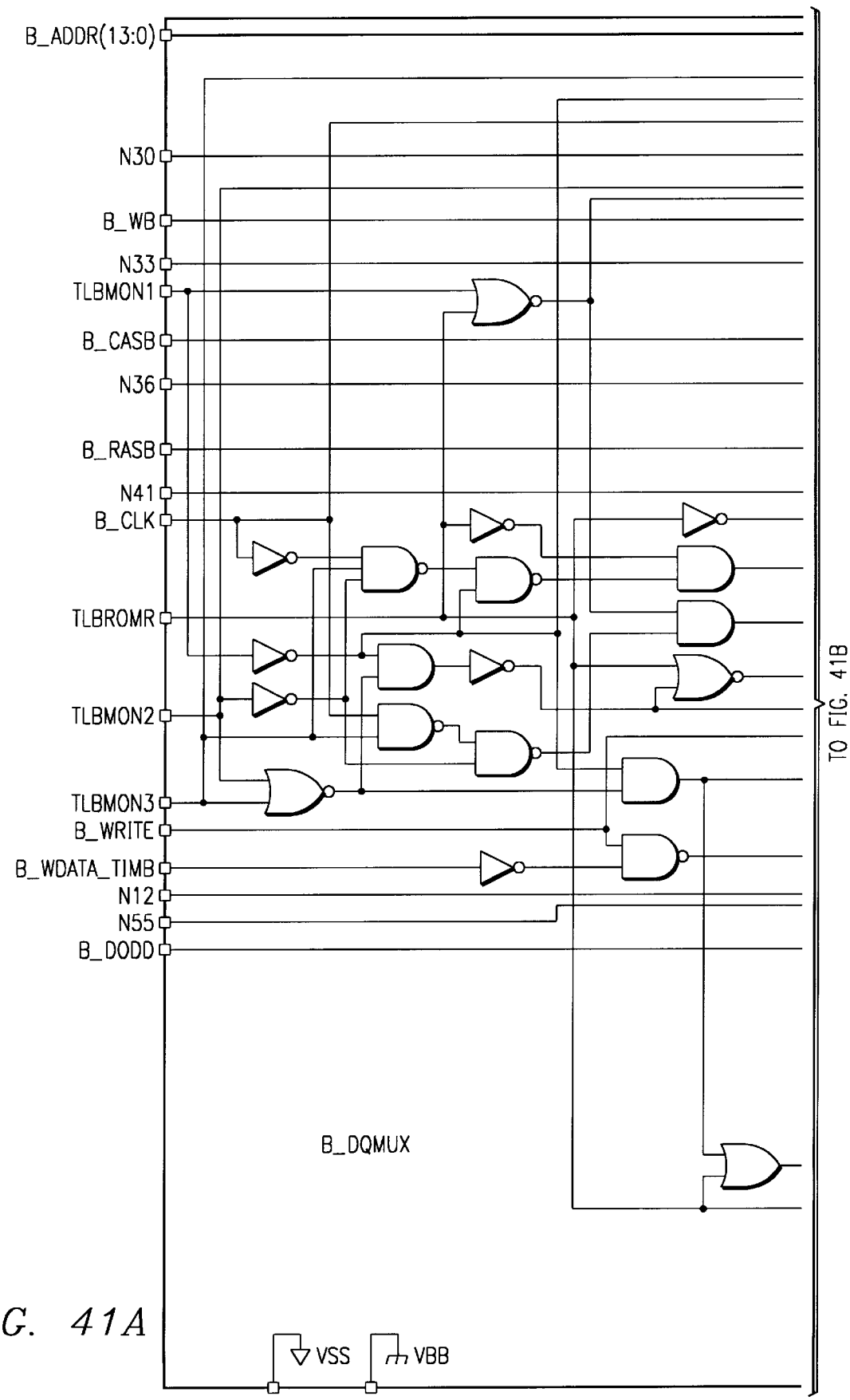
FIG. 41 shows a schematic of a Data Multiplexer (MUX)
Figure 41B:
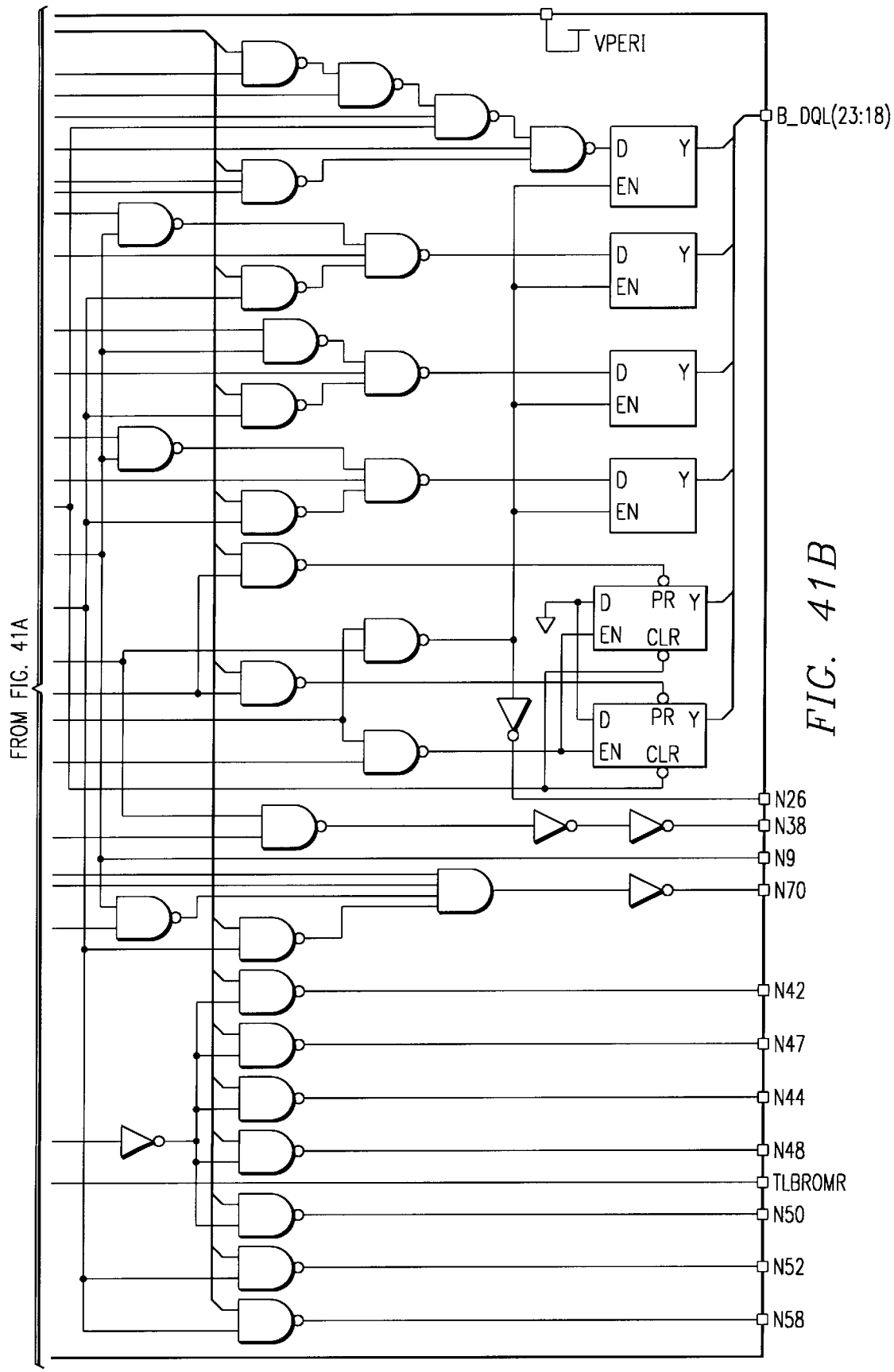
Figure 42:
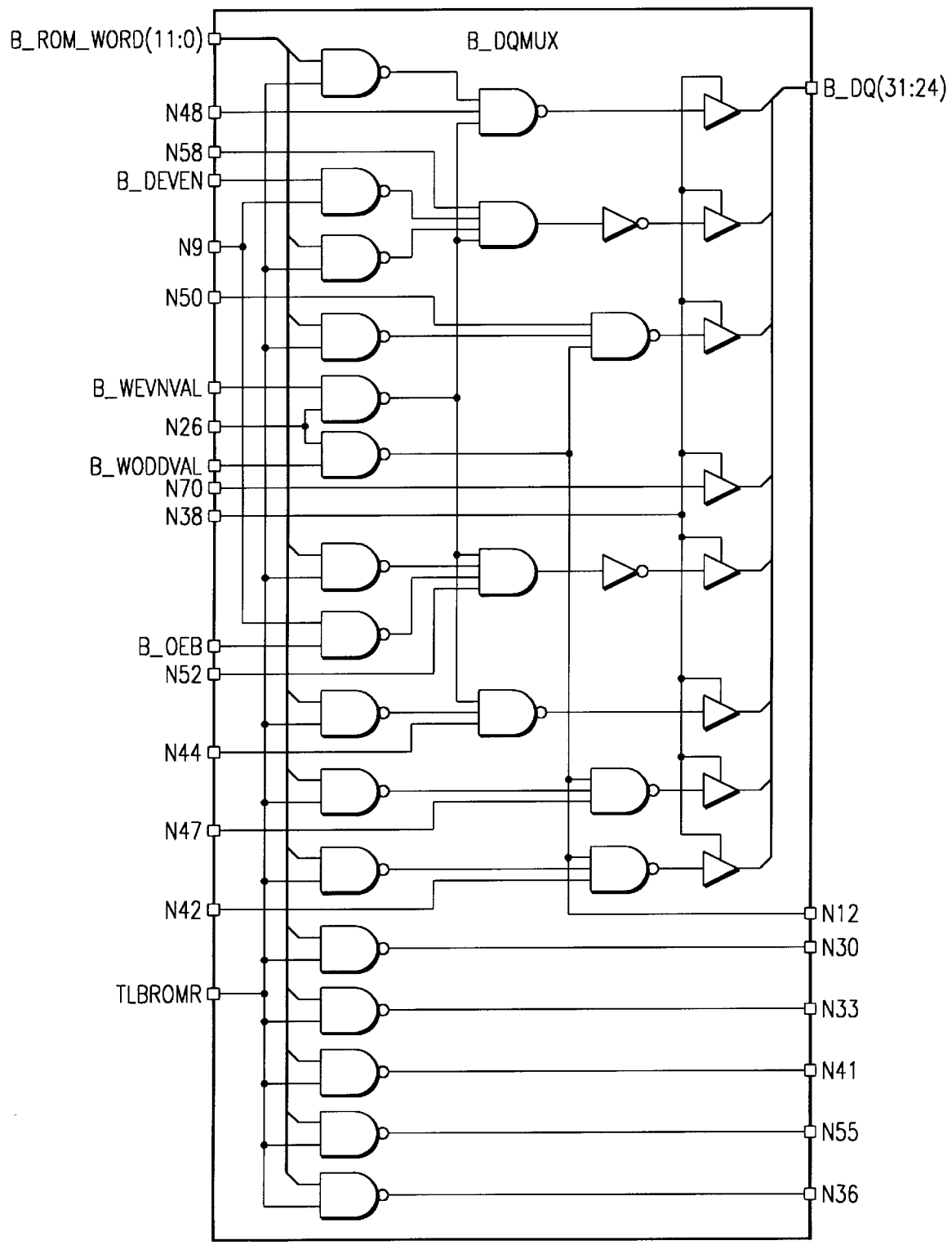
FIG. 42 shows a schematic of the Data Multiplexer (MUX) (Con't)
Figure 43:
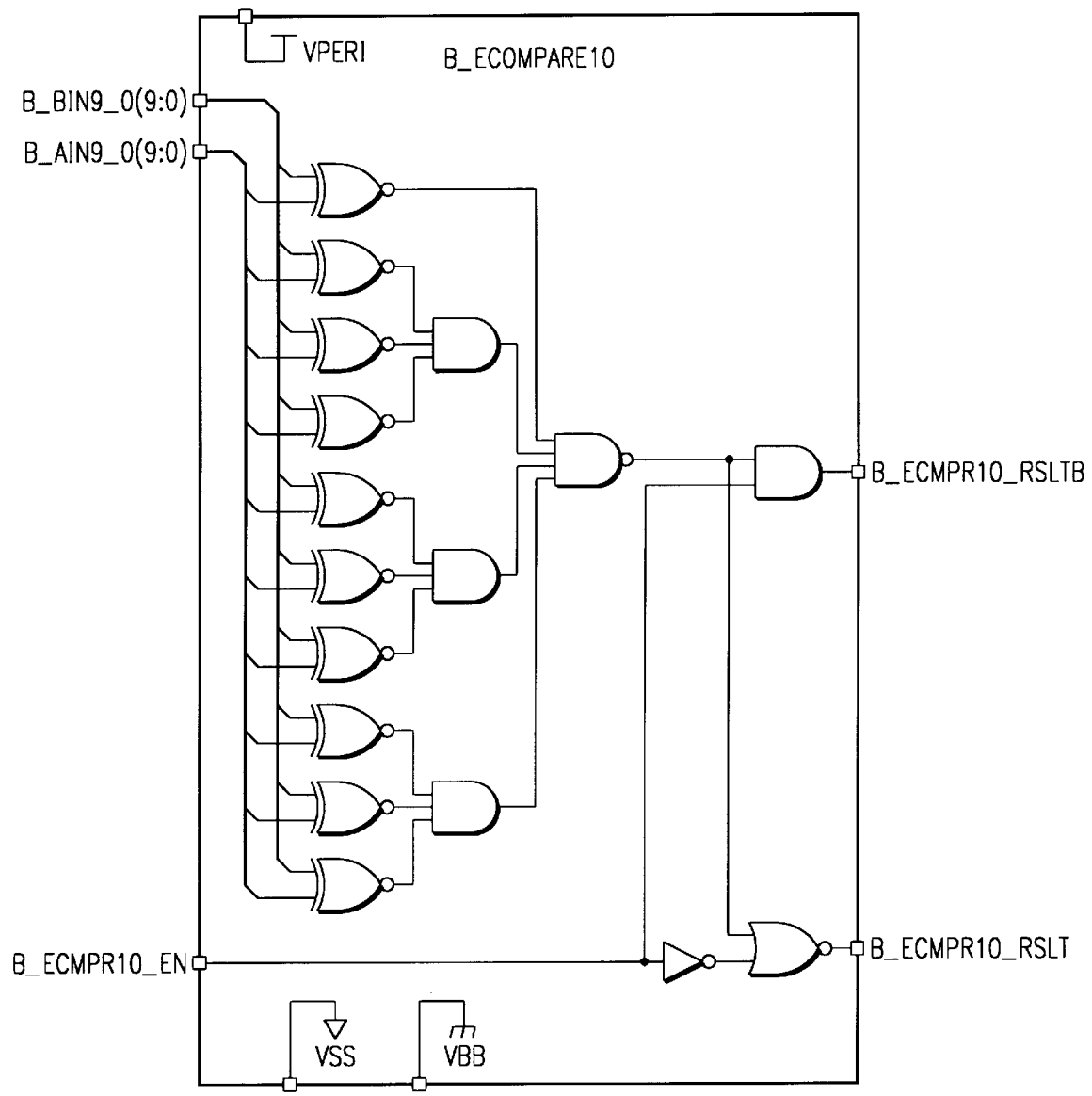
FIG. 43 shows a schematic of Compare Circuitry.

3. B_CROM (FIG. 40): Stores the test conditions in the ROM, holds the program counter and decoder
4. B_PG_CONTROL (FIG. 24): Controls the flow of test program.
5. B_PASSFAIL: Generates the data pattern to be written to array, perform pass fail comparison.
6. B_DQMUX : Control the multiplexing for BIST signals to appear at the DQs.
7. B_ADDRNG (FIGS. 16–21): Control the start and stop address of BIST operation.
8. B_TGEN (FIGS. 47–50): Control and generates the timing of all the Control, Data, and address signals.

10.21 B_CLK_GEN

| | |
|---|---|
| INPUTS: | B_CLK,VUPB,B_SR_LOAD,B_DONE,B_ROM_PRE_EN, |
| OUTPUTS: | B_CLK_B,B_RESET,B_CLK_C,B_CLK_A,B_ROM_PRECHARGE, B_CLK_AD |
| # OF CIRCUITS: | 1/chip |
| LOCATION: | right corner of chip |

This circuit takes the bist primary clock B_CLK and makes 4 other clocks out of it in 2 clock cycles. Rising edge of B_CLK_A updates the newest instruction pointed to by the Program counter. Decoding of the newest instruction starts at this edge. Rising edge of B_CLK_AD is the clock that executes the newly decoded instruction. At the rising edge of B_CLK_B, a decision is made on the action to take with the program counter. B_CLK_C acts as a reset signal.

Figure 69:
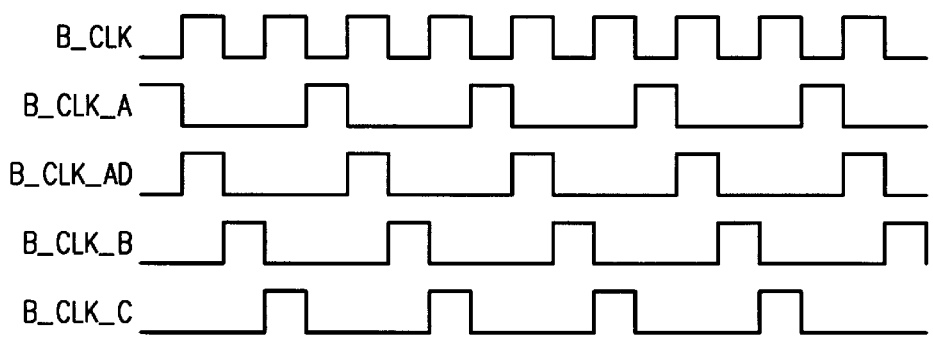
FIG. 69 shows a timing diagram.

It also generates the precharge signal for the ROM (FIG. 69).

Figure 70:
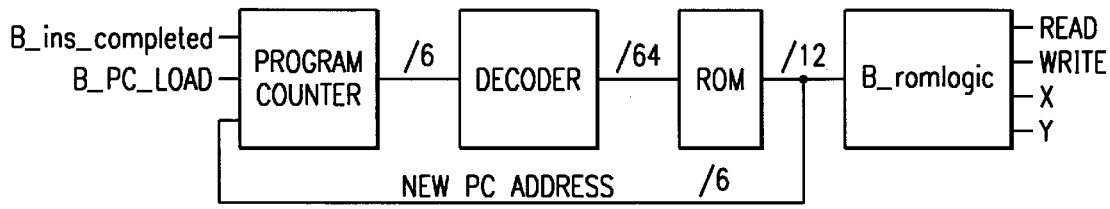
FIG. 70 shows a block diagram of the ROM interface.

B_CROM controls the operations of the ROM. It is made up of a decoder, a program counter and B_ROMLOGIC (FIG. 30) which decodes what the current instruction. The program counter points to word 0 during power up. Subsequently in BIST operation, PC will point to the relevant word in the ROM to execute the desired instruction. The decoder decodes the 6 bit program counter to point to one of the 64 words in the ROM (FIG. 70).

10.23 B_DECODER (FIG. 26)

| | |
|---|---|
| INPUTS: | B_PC_ADDR |
| OUTPUTS: | B_ROM_ADDR |
| # OF CIRCUITS: | 1/chip |
| LOCATION: | right corner of chip |

This is a simple 6 to 64 decoder. 6 bit input address from the program to be decoded into 64 words in the ROM
10.24 B_PC (FIG. 25)

```
      INPUTS: B_PC_LOAD,B_PC_LD_ADDR,B_CLK_B,B_RESET,
              B_INS_COMPLETED
     OUTPUTS: B_PC_ADDR,
# OF CIRCUITS: 1/chip
    LOCATION: right corner of chip
```

The program counter points to an instruction in the ROM to be executed. B_CLK_B is used to change the program counter to its new value.

At the completion of an instruction, program counter can change in 2 ways. It can either be incremented by 1 (normal program flow), or it can jump to any one of the 64 words of the ROM (conditional or unconditional jump).

At the rising edge of B_CLK_B, the circuit will look at two signals that comes in: B_PC_LOAD and B_INS_COMPLETED.

Figure 71:
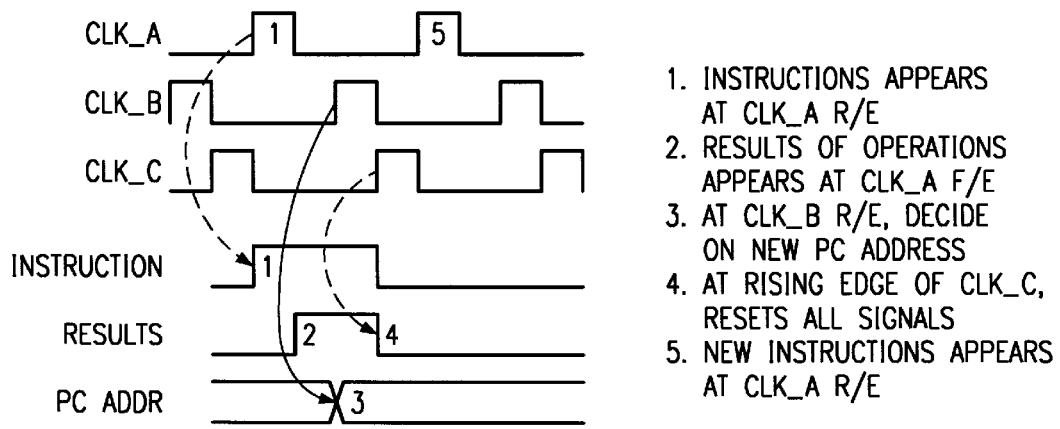
FIG. 71 shows a diagram of the Instruction Timing.

If B_PC_LOAD is a high, it will do a jump by loading the PC with the address that appears on B_PC_LD_ADDR. If B_INS_COMPLETED is a high, it will increment the PC by 1 and proceed to the next instruction. If neither B_PC_LD_ADDR nor B_INS_COMPLETED is high then no action will be taken and the PC will remain the same. B_PC_LOAD and B_PC_LD_ADDR cannot be high at the same time (FIG. 71).

If one wants to read the content of the ROM and output it to the DQ pins, ROM read DFT mode can be used. The device needs to be powered up with overvoltage, then perform a DFT entry to TLBROMR while in BIST standby mode, then pull CS high to go into BIST mode.

The external clock is used to move from one ROM word to the next ROM word. The PC is incremented every 2 clock cycles, ie on every rising edge of B_CLK_B. This is done by forcing B_INS_COMPLETED to be high all the time during the DFT TLROMR mode.
10.25 B_ROMLOGIC (FIGS. 30, 31)

instruction deals with the flow of the program. They are introduced to control BIST operation. Second is the array access instruction and they control how the array is to be tested. They are basically the same type of instruction usually found on a tester. They are translated into BIST format in this case.

An instruction is divided into two parts. The first six bits of an instruction defines the actions to be taken and the last six bits is the data associated with the instruction.

For an read whole array instruction, Read(bit11),X(bit9) and Y(bit8) are set to 1. The last six bits of the instruction provides information on how the read whole array is to be achieved, ie timing sets to be used, data pattern to be used, etc.

For a program control instruction, the 4 most significant bits are '0', Bit 7 and Bit 6 determines the program control instruction. The last six bits provides the address to be jumped to if indeed the decision is made to jump.

There is an unconditional jump instruction. '110011' for the most significant 6 bits, and the address to jump to for the 6 least significant bits.

The last instruction in the ROM is an idle instruction to signal the end of BIST operation. The last six bits of this instruction holds the revision number of the current 256M (FIG. 72).

The instruction above will perform a read, from the whole array (both X and Y enabled), using timing set A, expected data '0', true internal data pattern, and same data among the DQ.

There are many possible combination of instructions that can be programmed with the current circuits. If a new algorithm is need for BIST. It can be included by simply

```
      INPUTS: B_ROM_WORD,TLBROMR,B_CLK_C,B_CLK_A,B_RESET
     OUTPUTS: B_JMP_ADDR,B_DONE,B_CHK_TIMEOUT,B_RPT_N_INV,
              B_TIMESET1,B_TIMESET0,B_DECR,B_XEN,B_JUMP,B_CHK_KEY
              B_ALTERNATE,B_REN,B_WRITE,B_PAUSE,B_READ,B_RDATA,
              B_WDATA,B_CKBD,B_INC,B_YEN,B_CLK_ARESET
# OF CIRCUITS: 1/chip
    LOCATION: right corner of chip
```

B_ROMLOGIC decodes the 12 bits of data contained in an instruction word. There are two major types of instructions. First is the program control instruction. This type of reprogramming the ROM. Combinations of options are available to make up an instruction (FIG. 73)
10.26 B_TGEN

```
INPUTS: B_READ,B_RESET,B_PAUSE,B_YCARRY_1,B_CLK,B_WRITE,
        B_TIME_SET0,B_TIME_SET1,B_INS_COMPLETED,B_REN,
        B_OEA1,B_OEA2,B,B_OEB1,B_OEB2,B,B_OEC1,B_OEC2,
        B_RASA1,B_RASA2,B_RASB1,B_RASB2,B_RASC1,B_RASC2,
        B_CASA1,B_CASA2,B_CASB1,B_CASB2,B_CASC1,B_CASC2,
        B_DMUXA1,B_DMUXB1,B_DMUXC1,B_DMUXA1,B_DMUXB1,B_DMUXC1,
        B_YMUXA1,B_YMUXB1,B_YMUXC1,B_YMUXA1,B_YMUXB1,B_YMUXC1
        B_FIXCOUNTA,B_FIXCOUNTB,B_FIXCOUNTC
        B_PERIODA1,B_PERIODB1,B_PERIODC1,
```

|  |  |
|---|---|
| OUTPUTS: | B_YSELB,B_RASB,B_CASB,B_WB,B_OEB,B_PERIODB, B_ROM_PRE_EN,B_WDATA_TIMB,B_TIMECNT_REF,B_PCOUNTER |
| # OF CIRCUITS: | 1/chip |
| LOCATION: | right corner of chip |

Figure 34:
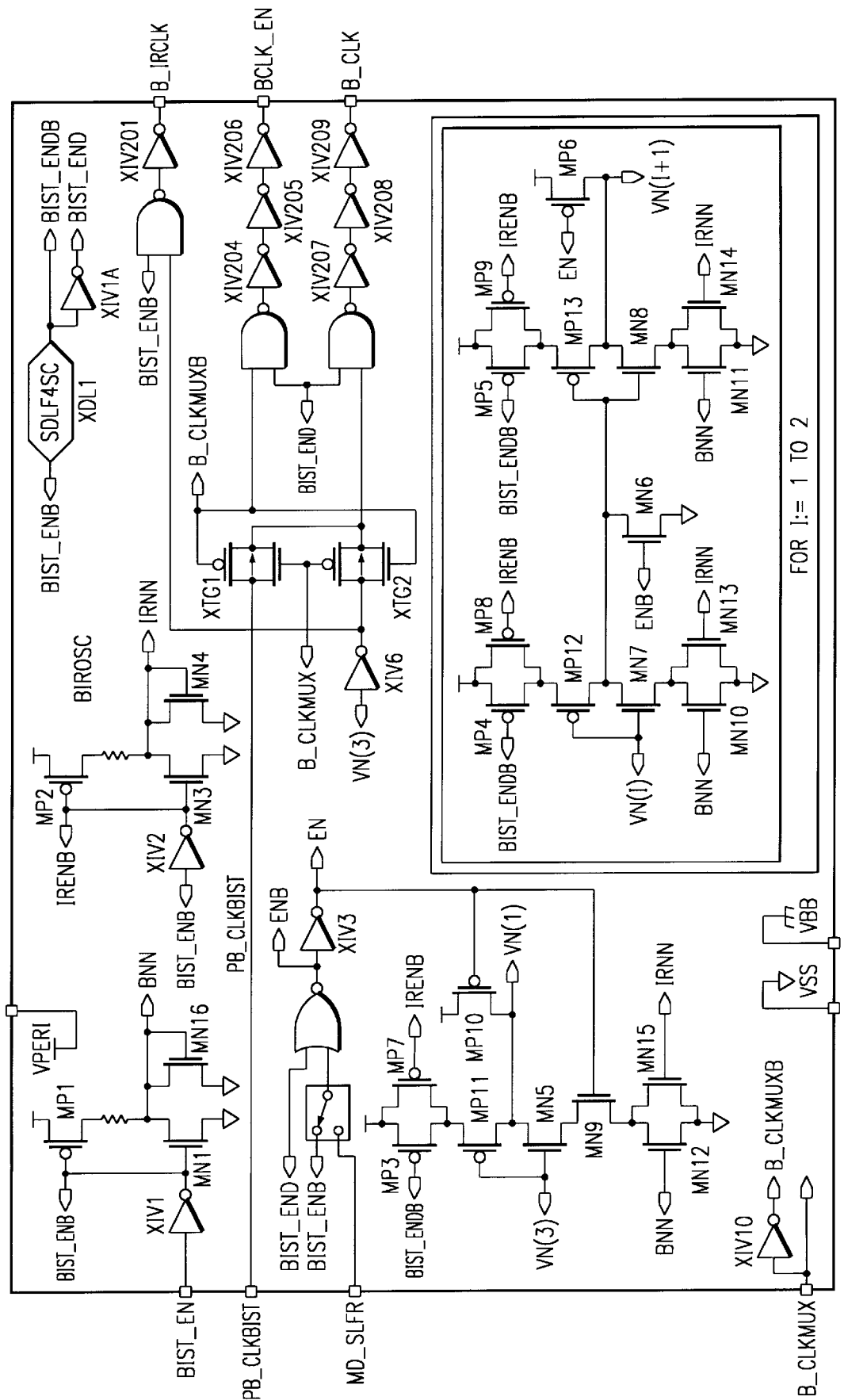
FIG. 34 shows a schematic of the Internal Refresh Oscillator.
Figure 35:
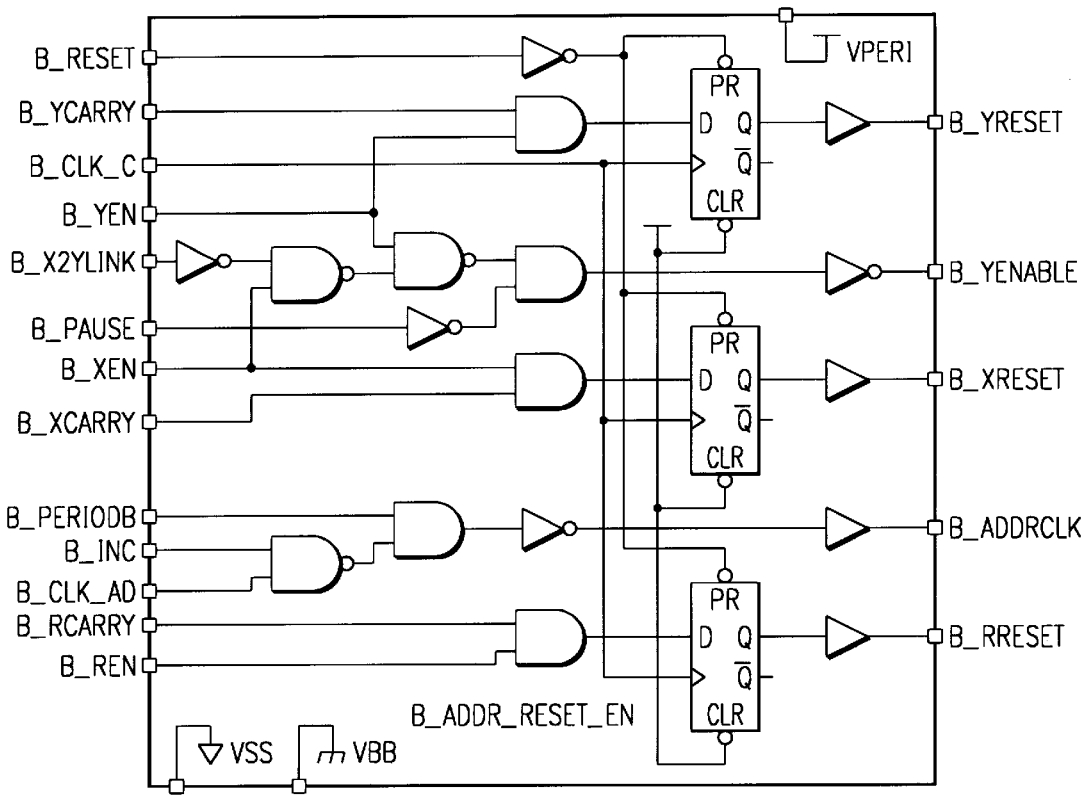
FIG. 35 shows a schematic of the Address Reset Circuitry Sheet1.
Figure 36:
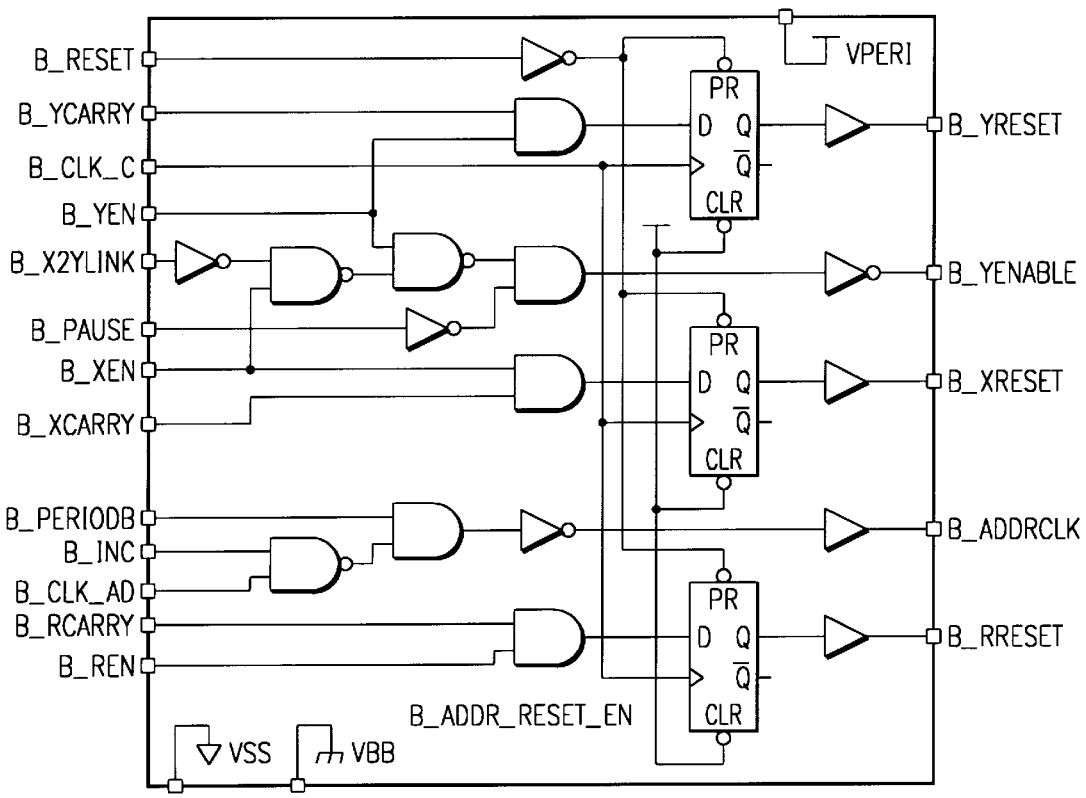
FIG. 36 shows a schematic of the Address Reset Circuitry Sheet2.
Figure 37A:
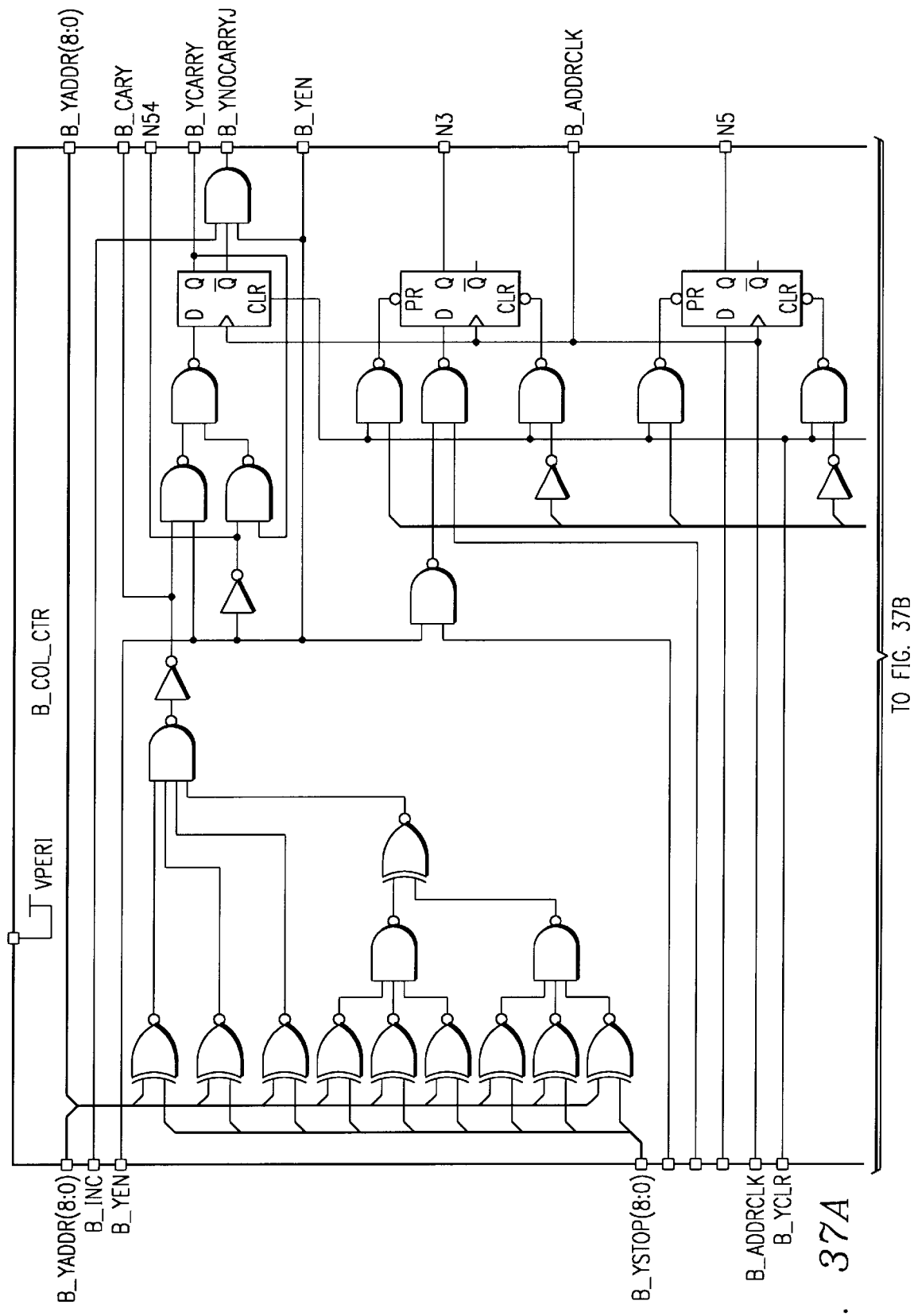
FIG. 37 shows a schematic of the Column Counter.
Figure 37B:
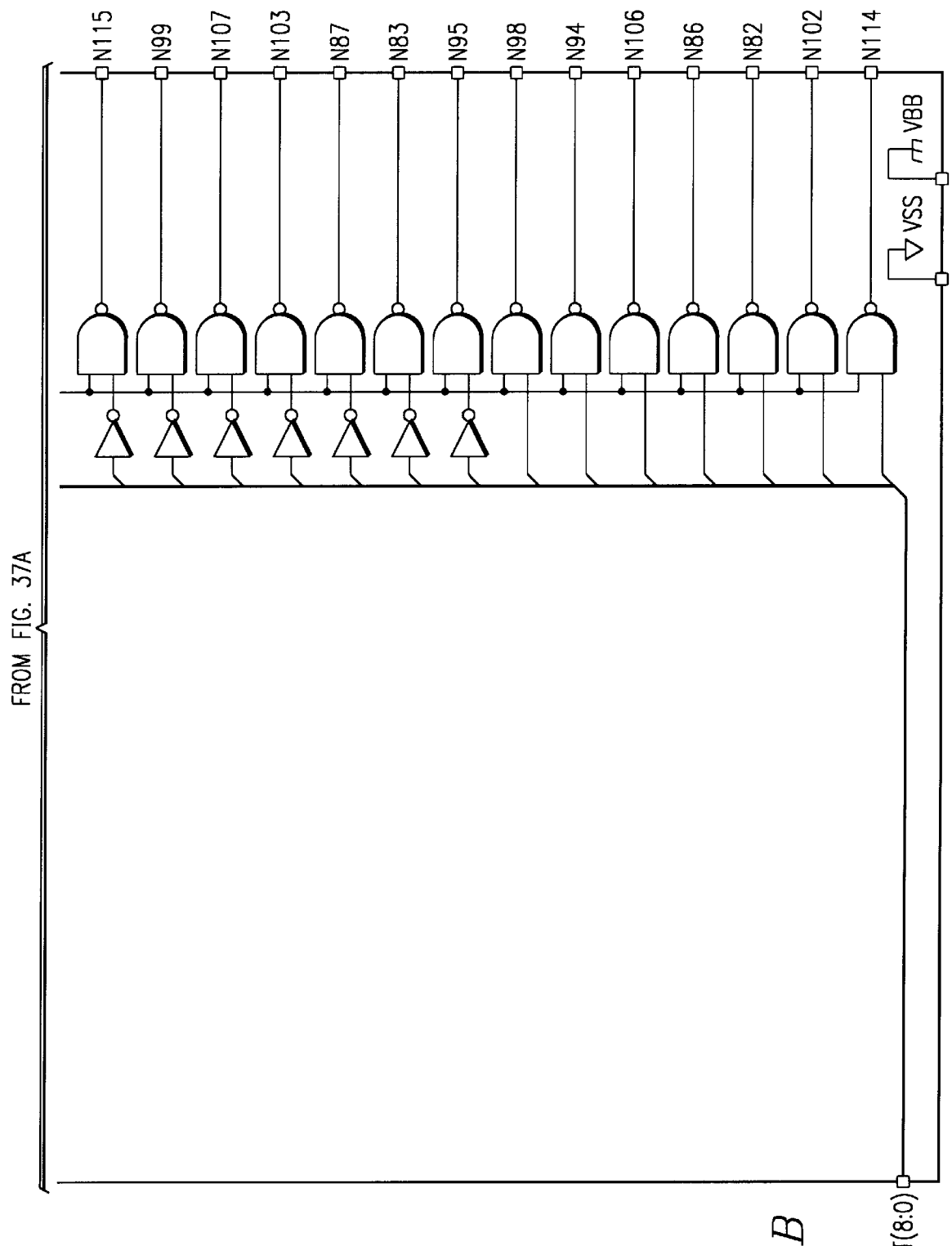
Figure 38A:
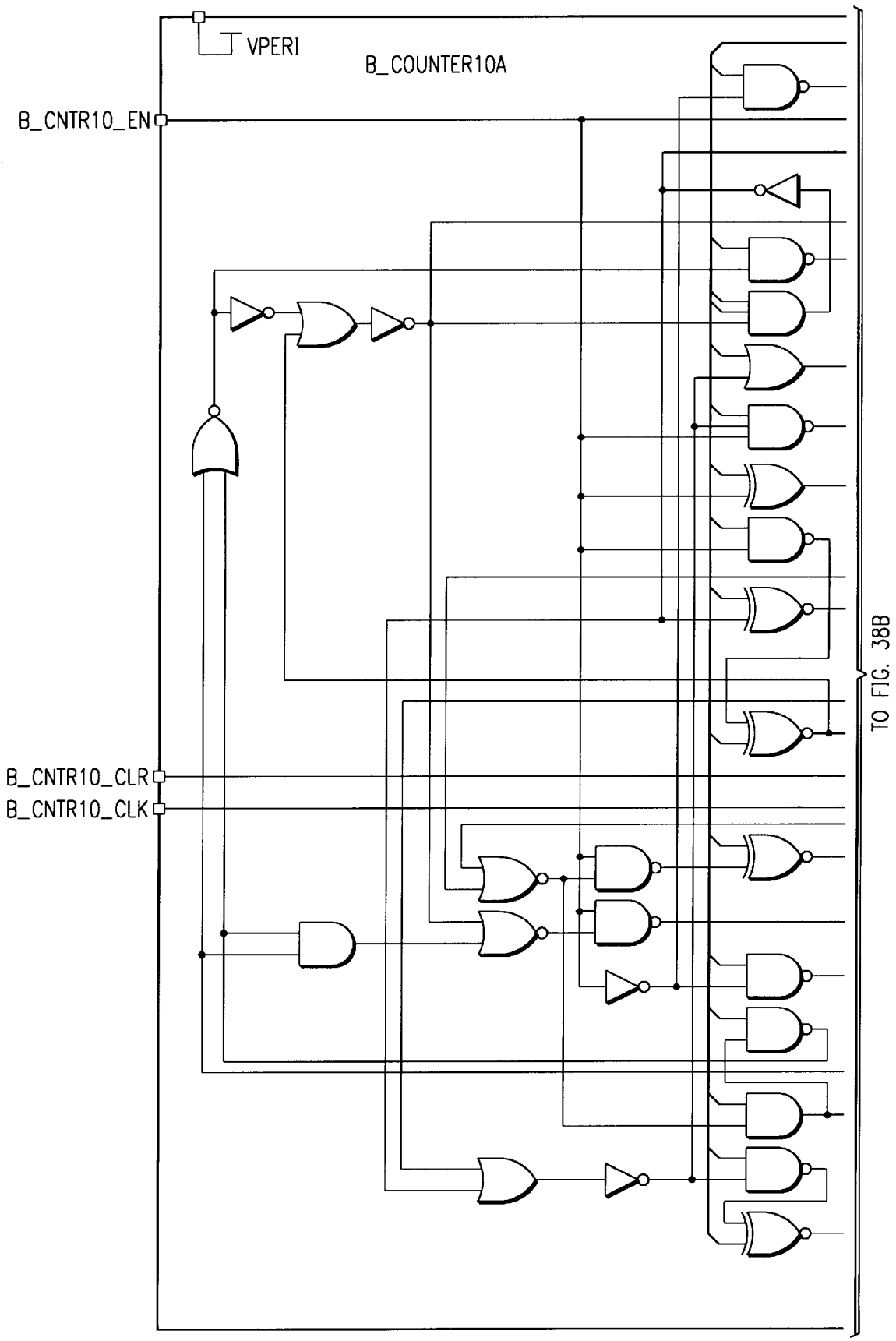
FIG. 38 shows a schematic of the 10 Bit Counter "A"
Figure 38B:
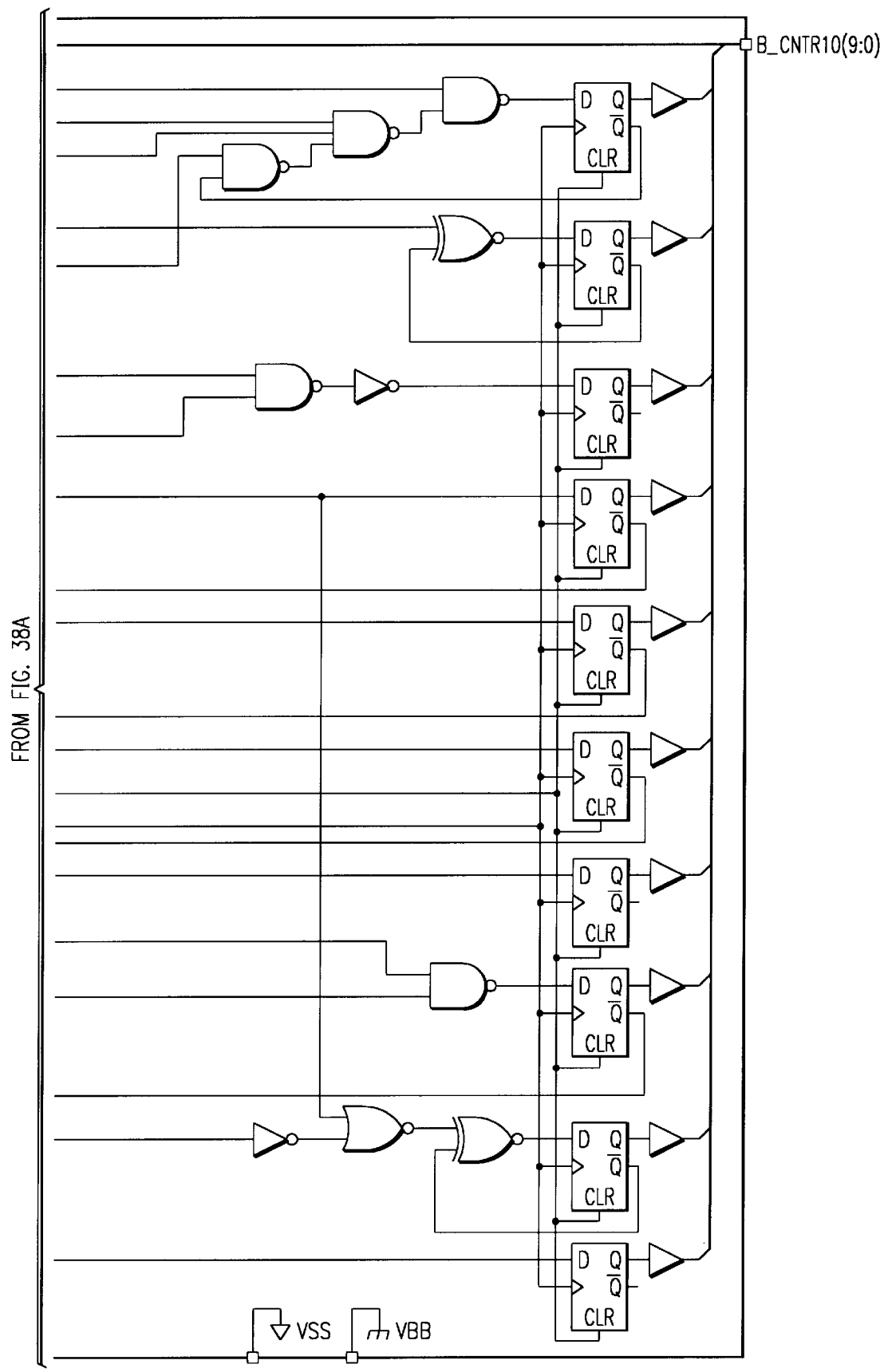
Figure 39:
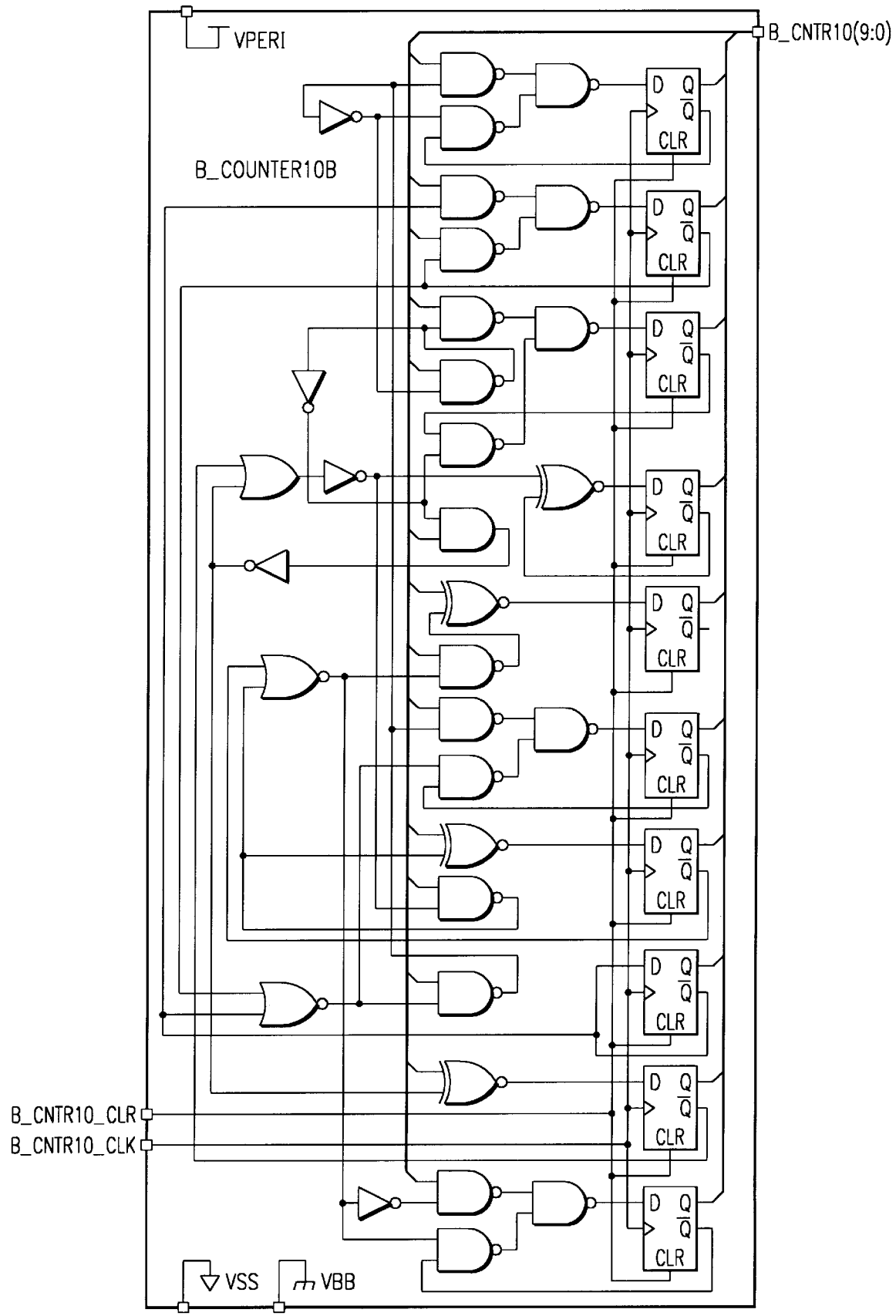
FIG. 39 shows a schematic of the 10 Bit Counter "8"

The timing sets used in BIST tests are generated through the use of the primary clock generated in BIROSC (FIG. 34) block. The clock is a 50 MHz clock and the resolution of the timing sets is 20 ns. A counter counts the number of rising edges of the primary clock. The control timing is set by specifying a specific count of the counter. In the example below, Activate is specified at count 2 and Deactivate is specified at count 12 (FIG. 74).

Altogether 3 types of timing sets, namely short, long and page timing set were used in the 10 algorithms implemented in BIST (FIG. 75).

10.27 B_COUNTER10B (FIG. 39)

|  |  |
|---|---|
| INPUTS: | B_CNTR10_CLK,B_CNTR10_CLR |
| OUTPUTS: | B_CNTR10 |
| # OF CIRCUITS: | 1/chip |
| LOCATION: | right corner of chip |

Rising edge of B_CNTR10_CLK will increment the counter by 1. The counter is always enabled.

10.28 B_COUNTER10A (FIG. 38)

|  |  |
|---|---|
| INPUTS: | B_CNTR10_CLK,B_CNTR10_EN,B_CNTR10_CLR |
| OUTPUTS: | B_CNTR10 |
| # OF CIRCUITS: | 1/chip |
| LOCATION: | right corner of chip |

If B_CNTR10_EN is high, rising edge of B_CNTR10_CLK will increment the counter by 1

10.29 B_ADDRCTL

|  |  |
|---|---|
| INPUTS: | B_PAUSE,B_PERIODB,B_RESET,B_CLK_AD,B_YEN,B_XEN, B_REN,B_INC,B_YSELB,BIST_EN,B_DECR,B_SUBARRAY, B_XADDR_STP,B_YADDR_STP,B_XADDR_STR,B_YADDR_STR |
| OUTPUTS: | B_YCLR,B_XCLR,B_RCARRY,B_YCARRY,B_XCARRY, B_YNOCARRYJ,B_YCARRY_1,B_XNOCARRY,B_LSB_YADDR, B_LSB_XADDR,B_ADDR |
| # OF CIRCUITS: | 1/chip |
| LOCATION: | right corner of chip |

B_ADDRCTL has two blocks, B_ADDR_CTR which contains all the address counters and B_RESET_EN which provide controls to detect overflows of address counters.

10.30 B_ADDR_CTR

|  |  |
|---|---|
| INPUTS: | B_SUBARRAY,B_INC,B_DECR,B_ADDRCLK,B_XCLR,B_YCLR, B_RCLR,B_XEN,B_YEN,B_REN,B_YSELB,BIST_EN, B_XADDR_STP,B_YADDR_STP,B_XADDR_STR,B_YADDR_STR |
| OUTPUTS: | B_RCARRY,B_YCARRY,B_XCARRY, B_YNOCARRYJ,B_YCARRY_1,B_XNOCARRY,B_LSB_YADDR, B_LSB_XADDR,B_ADDR |
| # OF CIRCUITS: | 1/chip |
| LOCATION: | right corner of chip |

B_ADDR_CTR has 3 counters, the row counter, the column counter and the refresh counter. A multiplexer decides which counter value is used as the B_ADDR signal during BIST operation. In normal access, only the X counter and Y counter are used. B_YSELB is the signal used to choose between the column and row address (FIG. 76). During refresh, only the Refresh counter is used.

The addressing mux sequence and controlled by a combination of B_ADDRCLK, B_INC and B_YSELB. B_PERIODB pulse generates B_ADDRCLK which increment the address counter by 1.

Low on B_YSELB indicates selection of column address. High on B_YSELB indicates selection of row address. B_INC will increment the enabled address counter by 1 (FIG. 77).

10.31 B_ROW_CTR (FIGS. 46, 55)

```
        INPUTS: B_INC,B_DECR,B_ADDRCLK,B_XCLR,B_XEN,B_XSTART,B_XSTOP
       OUTPUTS: B_CARY,B_XCARRY,B_XNOCARRYJ,B_XADDR
# OF CIRCUITS: 1/chip
      LOCATION: right corner of chip
```

The X counter is a 14 bit counter and it holds the current row address. It can count forward and backward, depending the state of B_DECR. A low on B_DECR means counting forward, ie increment the counter value by 1 with every rising edge of the B_ADDRCLK. The counter is enabled by B_XEN.

If the subarray option is chosen. The counter will be start with the start address loaded in earlier. An overflow will be issued once the stop address is reached.

10.32 B_COL_CTR (FIG. 37)

```
        INPUTS: B_INC,B_DECR,B_ADDRCLK,B_YCLR,B_YEN,B_YSTART,B_YSTOP
       OUTPUTS: B_CARY,B_YCARRY,B_YNOCARRYJ,B_YADDR
# OF CIRCUITS: 1/chip
      LOCATION: right corner of chip
```

The Y counter is a 9 bit counter and it holds the current column address. It can count forward and backward, depending the state of B_DECR. A low on B_DECR means counting forward, ie increment the counter value by 1 with every rising edge of the B_ADDRCLK. The counter is enabled by B_YEN.

If the subarray option is chosen. The counter will be start with the start address loaded in earlier. An overflow will be issued once the stop address is reached.

10.33 B_REF_CTR (FIG. 45)

```
        INPUTS: B_ADDRCLK,B_RCLR,B_REN,B_XSTART,B_XSTOP,
       OUTPUTS: B_RCARRY,B_RADDR
# OF CIRCUITS: 1/chip
      LOCATION: right corner of chip
```

The refresh counter is a 14 bit counter. It only counts forward. The counter value is incremented by 1 with every rising edge of the B_ADDRCLK if B_REN is high. The refresh counter is used in the three disturb tests only. During the refresh instruction, a pseudo read is done for all the rows that are enabled. This refreshes the array but no pass/fail comparison is done.

10.34 B_ADDR_RESET_EN (FIGS. 35, 36, 54)

```
        INPUTS: B_INC,B_PERIODB,B_XEN,B_YEN,B_REN,B_RCLR,B_REN,
                B_X2YLINK
                B_RESET,B_CLK_C,B_CLK_AD,B_XCARRY,B_YCARRY,
                B_RCARRY,B_PAUSE
       OUTPUTS: B_ADDRCLK,B_YENABLE,B_XRESET,B_YRESET,B_RRESET
# OF CIRCUITS: 1/chip
      LOCATION: right corner of chip
```

This circuit generates the clock (B_ADDRCLK) used to increment or decrement the address counters. B_ADDRCLK is generated in 2 ways namely during an INC instruction or during the end of an array-access cycle. The reset signals (XCLR, YCLR and RCLR) are generated at the rising edge of B_CLK_C. These reset the counters to its original state when overflows occur.

B_X2YLINK is used to join the X and Y register together for whole array tests. The CARRY signal is used to signal the completion of an array access instruction. It is sent to the program counter to tell it to move on to the next instruction.

10.35 B_PG_CONTROL

| | |
|---|---|
| INPUTS: | VUPB,B_RESET,BIST_EN,B_DONE,B_TIMEOUT_CHK,B_INC, B_XEN,B_XCARRY,B_XNOCARRYJ,B_XCLR,B_YEN,B_YCARRY, B_YNOCARRYJ,B_YCLR,B_REN,B_RCARRY,B_CHK_KEY, B_RPT_N_INV,B_JUMP,B_TIMECNT_REF,B_ADDRU,B_ADDRL, B_CLK_C,B_CLK_A,B_SR_LOAD |
| OUTPUTS: | B_INS_COMPLETED,B_PC_LOAD,B_RPTINV_STATE,B_SUBARRAY B_CLKMUX,B_OUTPUTEN |
| # OF CIRCUITS: | 1/chip |
| LOCATION: | right corner of chip |

This block contains the circuit used for controlling the Program counter. It also contain a shift register which holds information on which test to perform.

Upon completion of an instruction, this block will make a decision on whether to increment the program counter or to load the program counter with a new address.

10.36 B_SHIFT (FIG. 7)

| | |
|---|---|
| INPUTS: | VUPB,BIST_EN,B_DONE,B_SR_CLK,B_SR_LOAD,B_ADDRU, B_ADDRL |
| OUTPUTS: | B_LSB_SR,B_SUBARRAY,B_CLKMUX,B_OUTPUTEN |
| # OF CIRCUITS: | 1/chip |
| LOCATION: | right corner of chip |

B_SHIFT register holds the data latched in during power up. Every time the test_en instruction is executed once, the shift register is shifted right by 1 position. This instruction looks at the last bit to see if the test is enabled (FIG. 78).

10.37 B_ECOMPARE10 (FIG. 43)

| | |
|---|---|
| INPUTS: | B_ECMPR10_EN,B_AIN9_0,B_BIN9_0 |
| OUTPUTS: | B_ECMPR10_RSLT,B_ECMPR10_RSLTB |
| # OF CIRCUITS: | 1/chip |
| LOCATION: | right corner of chip |

This is a simple comparator. If the comparison enable signal is high, then B_ECMPR10_RSLT will be high and the bar signal will be low if the 2 10 bit inputs are equal. Alternatively, if the 2 inputs are not equal, B_ECMPR10_RSLT will be low. If the comparison is not enabled, then both outputs will be low regardless of the inputs.

10.38 B_PASSFAIL (FIGS. 33, 44)

comparison. The timing for comparison is controlled by B_OEB timing.

10.39 B_DQMUX (FIGS. 41, 42)

| | |
|---|---|
| INPUTS: | TLBROMR,TLBMON1,TLBMON2,TLBMON3,B_WRITE, B_WDATA_TIMB,B_ROM_WORD,B_WEVNVAL,B_WODDVAL, B_RASB,B_CASB,B_WB,B_CLK,B_DODD,B_DEVEN,B_OEB, B_ADDR |
| OUTPUTS: | B_DQ,B_DQL |
| # OF CIRCUITS: | 1/chip |
| LOCATION: | right corner of chip |

This circuits is a huge multiplexer to multiplex the different signals that goes out to the outside world. In the normal mode, only the pass fail signals goes to the outside. In the other three monitor modes, different control signals are brought to the outside (FIG. 79).

10.40 B_ADDRNG

| | |
|---|---|
| INPUTS: | B_RESET,B_CLK,B_RDATA,B_WDATA,B_OEB,B_ALTERNATE, B_CKBD,B_WRITE,B_LSB_XADDR,B_LSB_YADDR,B_DQ |
| OUTPUTS: | B_WEVNVAL,B_WODDVAL,B_PF_RESULT,B_DODD,B_DEVEN |
| # OF CIRCUITS: | 1/chip |
| LOCATION: | right corner of chip |

This circuit generates internal data pattern to be written to the array. It also generates the expected data for pass fail

| |
|---|
| INPUTS: B_EEPRMOPT,PB_CLKBIST,TLBADDRNG,B_ADDR,B_XSTARTE, B_XSTOPE,B_YSTARTE,B_XSTOPE, |
| OUTPUTS: B_XADDR_STR,B_XADDR_STP,B_YADDR_STR,B_YADDR_STP |
| # OF CIRCUITS: 1/chip |
| LOCATION: right corner of chip |

This circuit is used to load start and stop address for sub array BIST testing. A DFT mode is used to get into this situation. When this DFT mode is entered, the next 4 rising edges of the clock will load in the X and Y start and stop address (FIG. 80).

10.41 BONEXX

| |
|---|
| INPUTS: IN |
| OUTPUTS: OUT |
| # OF CIRCUITS: 1/chip |
| LOCATION: right corner of chip |

Figure 81:
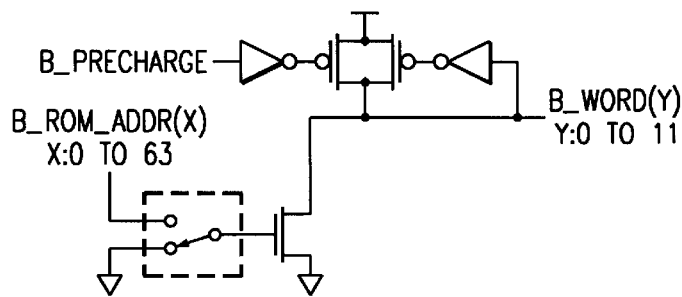
FIG. 81 shows a diagram of the ROM programming schematic, option low.

This is the '1' bit of the ROM and BONExx represents a high. IN is connected to the 'wordlines' (B_ROM_ADDR (x)). OUT is always precharged to high and does not get pulled to low whether IN is high or not (FIG. 81).

10.42 BZEROXX

| |
|---|
| INPUTS: IN |
| OUTPUTS: OUT |
| # OF CIRCUITS: 1/chip |
| LOCATION: right corner of chip |

Figure 82:
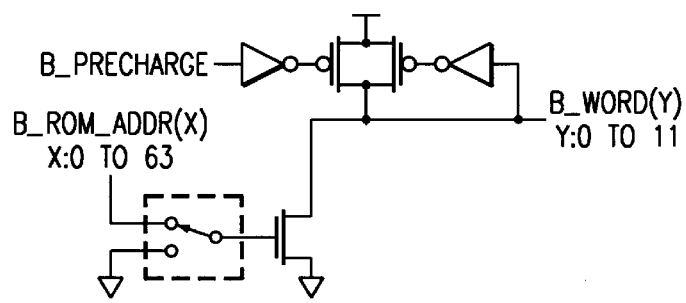
FIG. 82 shows a diagram of the ROM programming schematic, option high.
Figures 83A, 83B, 83C:
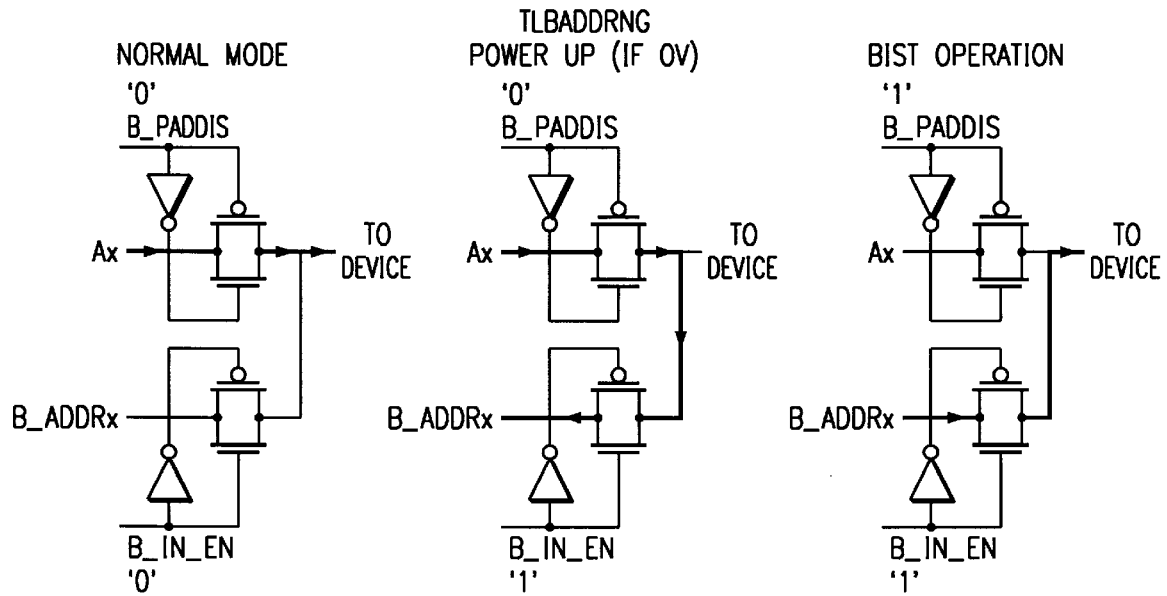
FIGS. 83a–c show a diagram of the Multiplexing Circuits.

This is 0 bit of the ROM and BZEROxx represents a low. IN is connected to the 'wordlines' (B_ROM_ADDR(X)). OUT (B_WORD(Y)) is precharged to high but if this cell is selected and IN goes high, OUT will be pulled to low (FIG. 82)

The foregoing describes the arrangement and operation of an exemplary integrated circuit memory device having built-in self-test circuitry. The described arrangement and method of and other arrangements made obvious in view there of are considered to be within the scope of the appended claims.

What is claimed is:

1. An integrated circuit having a built-in self test (BIST) arrangement, comprising:
   a built-in self-test detector, responsive to an input signal on an address pin, for placing an integrated circuit into a standby mode and further responsive to another input signal for placing the integrated circuit into a self-test mode;
   a read only memory storing test algorithm instructions;
   a logic circuit, interconnected with the read only memory, for receiving an instruction read from the read only memory and producing at an output terminal a group of output signals dependent upon the instruction;
   a BIST register, connected with the output terminal for receiving and storing the group of output signals from the logic circuit.

2. The integrated circuit having a built-in self-test arrangement, in accordance with claim 1, the built-in self-test arrangement further comprising:
   a timing generator, interconnected with the BIST register, for receiving the signals stored in the BIST register and for producing row address strobes, column address strobes and a write enable signal.

3. The integrated circuit hating a built-in self-test arrangement, in accordance with claim 2, the built-in self-test arrangement further comprising:
   a multiplexer having plural groups of input terminals, a group of input control terminals, and a group of output terminals;
   a first bus, interconnecting a first group of input terminals of the multiplexer to the BIST register, for conveying the signals stored in the BIST register to the multiplexer; and
   a second bus, interconnecting the group of input control terminals of the multiplexer, for transmitting the row address strobes, the column address strobes, and the write enable signal to the multiplexer.

4. The integrated circuit having a built-in self-test arrangement, in accordance with claim 2, the built-in self-test arrangement further comprising:
   an oscillator for producing a BIST clock signal;
   a BIST program counter, arranged for counting in response to the BIST clock signal;
   a third bus, interconnecting a group of input terminals of the BIST program counter to the BIST register, for conveying signals stored in the BIST register to the BIST program counter;
   a BIST address decoder, responsive to a count in the BIST program counter, for decoding the count and producing a signal for selecting a row address for the read only memory; and
   a fourth bus, interconnecting row address inputs of the read only memory to the BIST address decoder, for conveying the decoded row address from the BIST address decoder to the row address inputs of the read only memory.

5. The integrated circuit having a built-in self-test arrangement, in accordance with claim 4, wherein:
   the BIST program counter includes:
   a reset input for receiving a reset signal for setting the BIST program counter to a predetermined initial state;
   an increment input for receiving an increment the counter signal for incrementing a count state stored in the BIST program counter; and
   a jump input for receiving a jump signal for causing the state of the BIST program counter to change to a state represented by signals conveyed from the BIST register.

6. An integrated circuit memory array device having a built-in self-test (BIST) arrangement, the memory device comprising:
   an address buffer for receiving and storing a sequence of addresses;
   a built-in self-test detector, responsive to input signals, for controlling operation of the device alternatively in either a normal mode or a self-test mode at least one input signal occurring on an address line;
   address range registers, arranged for receiving and storing start and end addresses, for a self-test operation of the memory array while the device is operating in the self-test mode; and
   a self-test address counter, interconnected with the address range registers and the address buffer, for applying to the address buffer a sequence of addresses commencing with the start address and stopping at the end address.

* * * * *